(12) United States Patent
Takahashi

(10) Patent No.: US 10,453,404 B2
(45) Date of Patent: Oct. 22, 2019

(54) DISPLAY METHOD, DISPLAY DEVICE, DISPLAY MODULE, AND ELECTRONIC DEVICE

(71) Applicant: Semiconductor Energy Laboratory Co., Ltd., Atsugi-shi, Kanagawa-ken (JP)

(72) Inventor: Kei Takahashi, Isehara (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 92 days.

(21) Appl. No.: 15/671,483

(22) Filed: Aug. 8, 2017

(65) Prior Publication Data

US 2018/0053477 A1 Feb. 22, 2018

(30) Foreign Application Priority Data

Aug. 17, 2016 (JP) .................................. 2016-160022
Nov. 21, 2016 (JP) .................................. 2016-225760

(51) Int. Cl.
*G09G 3/00* (2006.01)
*G09G 3/36* (2006.01)
(Continued)

(52) U.S. Cl.
CPC ..... *G09G 3/3611* (2013.01); *G02F 1/133514* (2013.01); *G09G 3/2011* (2013.01);
(Continued)

(58) Field of Classification Search
None
See application file for complete search history.

(56) References Cited

U.S. PATENT DOCUMENTS 8,710,762 B2 4/2014 Takahashi et al.
8,766,608 B2 7/2014 Yamazaki et al.
(Continued)

FOREIGN PATENT DOCUMENTS

JP 2013-178495 A 9/2013

OTHER PUBLICATIONS

Kusunoki.K et al., "Transmissive OLED and Reflective LC Hybrid (TR-Hybrid) Display", SID Digest '16 : SID International Symposium Digest of Technical Papers, May 22, 2016, vol. 47, pp. 57-60.
(Continued)

*Primary Examiner* — Brian M Butcher
(74) *Attorney, Agent, or Firm* — Robinson Intellectual Property Law Office; Eric J. Robinson

(57) ABSTRACT

A display device operating at high speed is provided. The display device includes a buffer amplifier including first and second transconductance amplifiers and a buffer and pixels arranged in a matrix of x rows and y columns (x and y are integers greater than or equal to 2) and configured to express gray levels. In the first step, the offset voltage of the buffer amplifier is corrected using the second transconductance amplifier. Then, in the second step, a first analog signal corresponding to gray levels expressed by the pixels in two rows or more and x rows or less is input to one of a non-inverting input terminal and an inverting input terminal of the first transconductance amplifier, and a second analog signal corresponding to the first analog signal is output from an output terminal of the buffer.

10 Claims, 32 Drawing Sheets

(51) Int. Cl.
*G02F 1/1335* (2006.01)
*G09G 3/20* (2006.01)
*G09G 3/3233* (2016.01)
*H01L 27/32* (2006.01)
*G09G 3/3266* (2016.01)

(52) U.S. Cl.
CPC ......... *G09G 3/3233* (2013.01); *G09G 3/3266* (2013.01); *G09G 3/3648* (2013.01); *G09G 3/3677* (2013.01); *H01L 27/3211* (2013.01); *G09G 2300/046* (2013.01); *G09G 2300/0426* (2013.01); *G09G 2300/0842* (2013.01); *G09G 2320/043* (2013.01)

(56) References Cited

U.S. PATENT DOCUMENTS

| | | | |
|---|---|---|---|
| 8,816,662 | B2 | 8/2014 | Takahashi et al. |
| 8,922,182 | B2 | 12/2014 | Takahashi et al. |
| 8,963,517 | B2 | 2/2015 | Yamazaki et al. |
| 9,231,475 | B2 | 1/2016 | Takahashi |
| 2003/0011554 | A1* | 1/2003 | Albu ............. G09G 3/2011 345/89 |
| 2007/0063684 | A1 | 3/2007 | Adragna et al. |
| 2010/0066337 | A1 | 3/2010 | Gong et al. |
| 2010/0182300 | A1* | 7/2010 | Kato ............. G09G 3/3685 345/211 |
| 2011/0089927 | A1 | 4/2011 | Yamazaki et al. |
| 2011/0254523 | A1 | 10/2011 | Ito et al. |
| 2011/0285426 | A1 | 11/2011 | Takahashi et al. |
| 2012/0019222 | A1 | 1/2012 | Kimura et al. |
| 2012/0140523 | A1 | 6/2012 | Takahashi et al. |
| 2012/0274401 | A1 | 11/2012 | Watanabe |
| 2012/0293893 | A1 | 11/2012 | Sato |
| 2012/0306467 | A1 | 12/2012 | Ohmaru |
| 2013/0193874 | A1 | 8/2013 | Takahashi et al. |
| 2013/0261835 | A1 | 10/2013 | Takahashi et al. |
| 2015/0034948 | A1 | 2/2015 | Takahashi |
| 2015/0035509 | A1 | 2/2015 | Koyama et al. |
| 2015/0035514 | A1 | 2/2015 | Koyama et al. |
| 2015/0035573 | A1 | 2/2015 | Koyama et al. |
| 2015/0249385 | A1 | 9/2015 | Takahashi |

OTHER PUBLICATIONS

Sakuishi.T et al., "Transmissive OLED and Reflective LC Hybrid (TR-Hybrid) Display with High Visibility and Low Power Consumption", SID Digest '16 : SID International Symposium Digest of Technical Papers, May 22, 2016, vol. 47, pp. 735-738.

Ohide.T et al., "Application of Transfer Technology to Manufacturing of Transmissive OLED and Reflective LC Hybrid (TR-Hybrid) Display", SID Digest '16 : SID International Symposium Digest of Technical Papers, May 22, 2016, vol. 47, pp. 1002-1004.

Kim.K et al., "A 10-bit Linear R-string DAC Architecture for Mobile Full-HD AMOLED Driver ICs", SID Digest '13 : SID International Symposium Digest of Technical Papers, May 21, 2013, pp. 469-472.

Ryu.S et al., "A 13-bit universal column driver for various displays of OLED and LCD", J. Soc. Inf. Display (Journal of the Society for Information Display), May 4, 2016, vol. 24, No. 5, pp. 277-285.

* cited by examiner

40

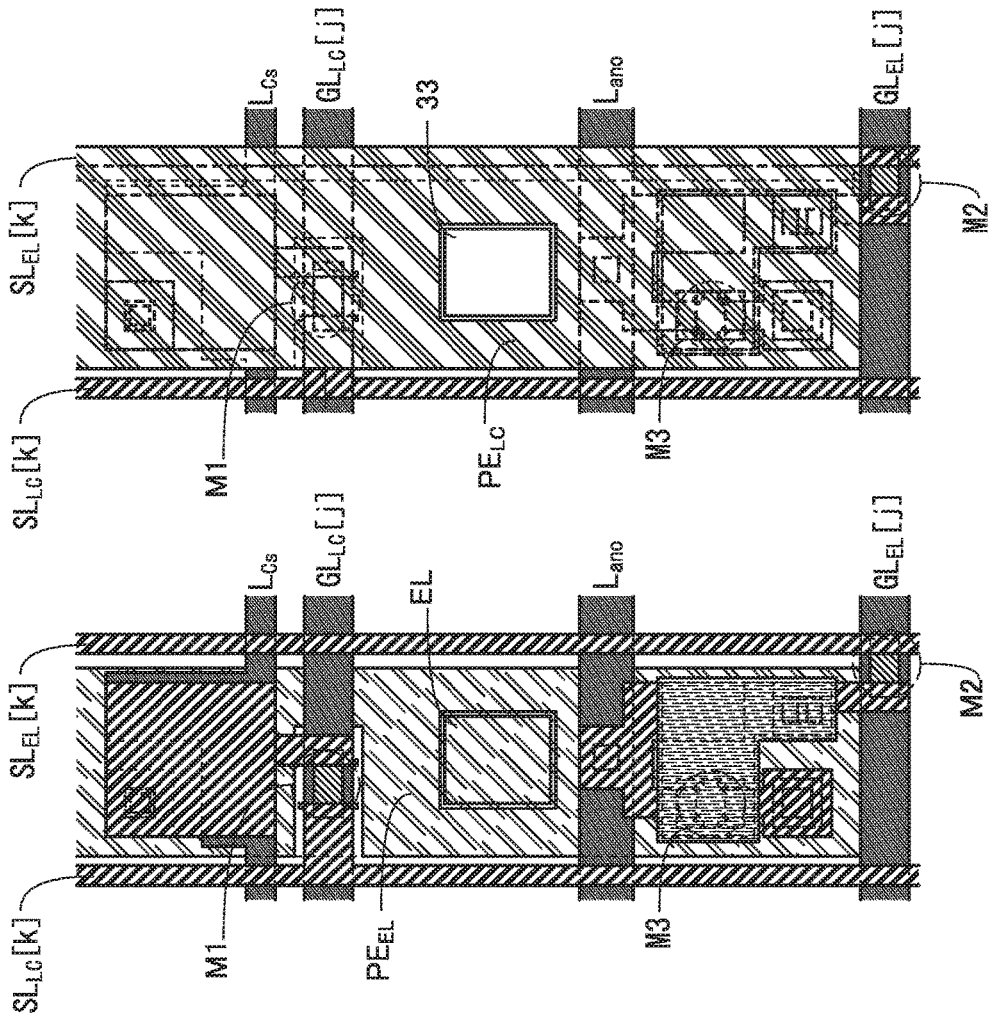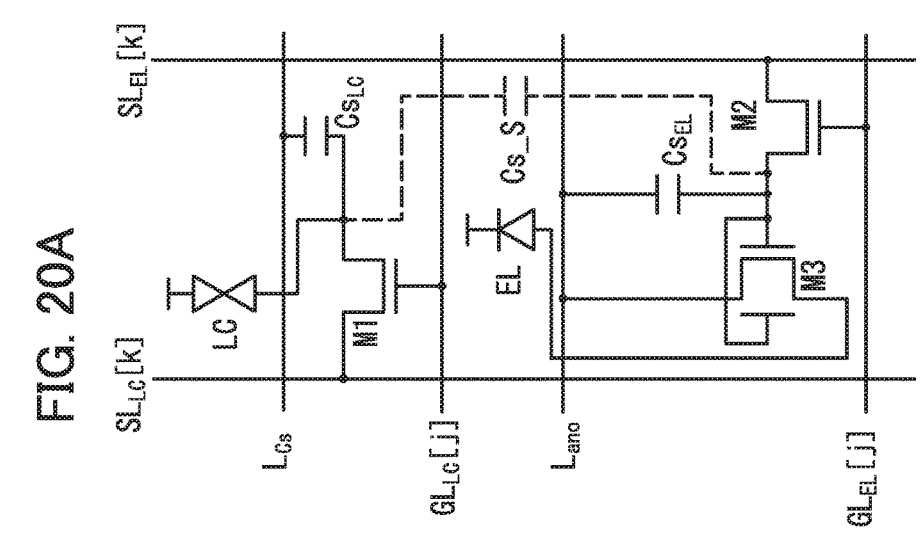

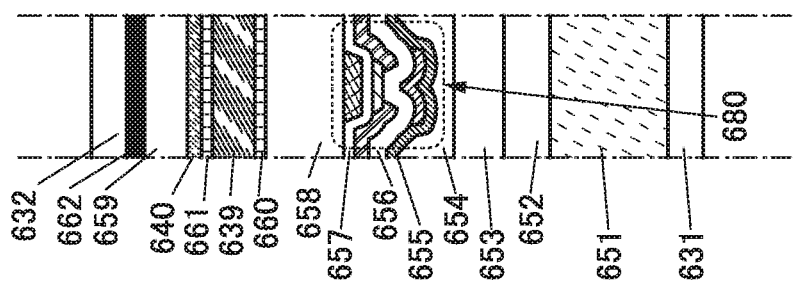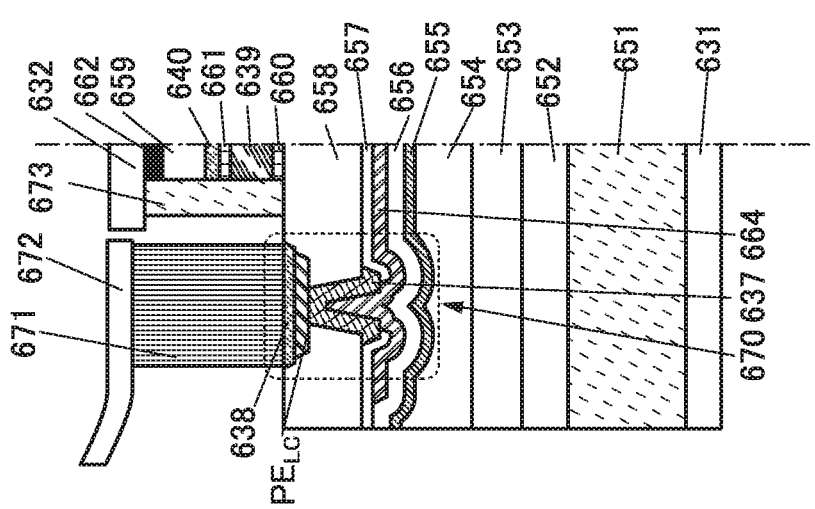

DISPLAY METHOD, DISPLAY DEVICE, DISPLAY MODULE, AND ELECTRONIC DEVICE

BACKGROUND OF THE INVENTION

1. Field of the Invention

One embodiment of the present invention relates to a display method, a display device, a display module, and an electronic device.

2. Description of the Related Art

A high-resolution digital/analog (D/A) converter circuit is proposed (see Non-Patent Documents 1 and 2). Accordingly, a gray scale of a large number of bits, e.g., a gray scale of 10 bits or more per pixel, can be expressed, and a high-quality image can be displayed.

REFERENCES

Non-Patent Documents

[Non-Patent Document 1]
Ki-Duk Kim et al., "A 10-bit Linear R-string DAC Architecture for Mobile Full-HD AMOLED Driver ICs," SID 2013 Digest, pp. 469-472, May 2013.
[Non-Patent Document 2]
Seong-Young Ryu et al., "A 13-bit universal column driver for various displays of OLED and LCD," Journal of the SID, 2016.

SUMMARY OF THE INVENTION

The D/A converter circuit includes a buffer amplifier for performing buffering of an analog signal corresponding to an image to be displayed. In the case where the number of gray levels expressed by one pixel is large, e.g., in the case where a gray scale of 10 bits or more is expressed, it is difficult to express the gray levels accurately if the offset voltage of the buffer amplifier is large. Thus, the offset voltage needs to be corrected; however, in the case where a high-resolution image is displayed, the display device is required to operate at high speed. In addition, also in the case where the frame frequency is high, the display device is required to operate at high speed. In this manner, a time for correcting the offset voltage of the buffer amplifier becomes short.

Then, an object of one embodiment of the present invention is to provide a display device which operates at high speed and a display method thereof. An object of another embodiment of the present invention is to provide a display device capable of displaying an image with a large number of gray levels and a display method thereof. An object of another embodiment of the present invention is to provide a display device capable of displaying an image having high resolution and a display method thereof. An object of another embodiment of the present invention is to provide a display device with a high frame frequency and a display method thereof. An object of another embodiment of the present invention is to provide a small display device and a display method thereof. An object of another embodiment of the present invention is to provide an inexpensive display device and a display method thereof. An object of another embodiment of the present invention is to provide a display device with high visibility and a display method thereof. An object of another embodiment of the present invention is to provide a display device with low power consumption and a display method thereof. An object of another embodiment of the present invention is to provide a novel display device and a display method thereof.

Note that the descriptions of these objects do not disturb the existence of other objects. In one embodiment of the present invention, there is no need to achieve all the objects. Other objects will be apparent from and can be derived from the description of the specification, the drawings, the claims, and the like.

One embodiment of the present invention is a display method of a display device including a buffer amplifier including a first transconductance amplifier, a second transconductance amplifier, and a buffer, and pixels arranged in a matrix of x rows and y columns (x and y are integers greater than or equal to 2) and configured to express gray levels. The method includes a first step of correcting an offset voltage of the buffer amplifier by the second transconductance amplifier and a second step of inputting a first analog signal at voltages corresponding to the gray levels expressed by the pixels to one of a non-inverting input terminal and an inverting input terminal of the first transconductance amplifier and outputting a second analog signal at voltages corresponding to the voltages of the first analog signal from an output terminal of the buffer. After the first step is completed, the first analog signal corresponding to the gray levels expressed by the pixels in two rows or more and x rows or less is input and the second analog signal corresponding to the first analog signal is output from the output terminal of the buffer through the second step. The first step and the second step are alternately repeated.

In the above embodiment, it is possible that the display device further includes a first capacitor and a second capacitor, one terminal of the first capacitor is electrically connected to one of a non-inverting input terminal and an inverting input terminal of the second transconductance amplifier, one terminal of the second capacitor is electrically connected to the other of the non-inverting input terminal and the inverting input terminal of the second transconductance amplifier, a voltage of the one of the non-inverting input terminal and the inverting input terminal of the second transconductance amplifier corresponds to charge held in the first capacitor in the second step, and a voltage of the other of the non-inverting input terminal and the inverting input terminal of the second transconductance amplifier corresponds to charge held in the second capacitor in the second step.

Another embodiment of the present invention is a display method of a display device including a buffer amplifier including a first transconductance amplifier, a second transconductance amplifier, and a buffer, pixels arranged in a matrix of x rows and y columns (x and y are integers greater than or equal to 2) and configured to perform grayscale display, a first capacitor, a second capacitor, and a detector. The method includes a first step of correcting an offset voltage of the buffer amplifier by the second transconductance amplifier and a second step of inputting a first analog signal at voltages corresponding to the gray levels expressed by the pixels to one of a non-inverting input terminal and an inverting input terminal of the first transconductance amplifier and outputting a second analog signal at voltages corresponding to the voltages of the first analog signal from an output terminal of the buffer. One terminal of the first capacitor is electrically connected to one of a non-inverting input terminal and an inverting input terminal of the second transconductance amplifier. One terminal of the second capacitor is electrically connected to the other of the non-inverting input terminal and the inverting input terminal of the second transconductance amplifier. The detector is electrically connected to the one terminal of the first capacitor. The detector is electrically connected to the one terminal of the second capacitor. The second step is executed upon completion of the first step. A voltage of the one of the non-inverting input terminal and the inverting input terminal of the second transconductance amplifier corresponds to charge held in the first capacitor in the second step. A voltage of the other of the non-inverting input terminal and the inverting input terminal of the second transconductance amplifier corresponds to charge held in the second capacitor in the second step. After the second analog signal corresponding to the gray levels expressed by the pixels in r rows (r is an integer greater than or equal to 1 and less than or equal to x) is output from the output terminal of the buffer in the second step, the amount of charge held in the first capacitor and the amount of charge held in the second capacitor are detected by the detector. The first step is executed when at least one of the amount of charge held in the first capacitor and the amount of charge held in the second capacitor falls below a specified value. The second step is continuously executed when both of the amount of charge held in the first capacitor and the amount of charge held in the second capacitor are greater than or equal to the specified value.

In any of the above embodiments, it is possible that the display device further includes a first transistor and a second transistor, one of a source and a drain of the first transistor is electrically connected to the one of the non-inverting input terminal and the inverting input terminal of the second transconductance amplifier, one of a source and a drain of the second transistor is electrically connected to the other of the non-inverting input terminal and the inverting input terminal of the second transconductance amplifier, the first transistor and the second transistor are in a conduction state in the first step, and the first transistor and the second transistor are in a non-conduction state in the second step.

In the above embodiment, it is possible that a channel formation region of the first transistor and a channel formation region of the second transistor each contain at least one of indium, an element M (the element M is aluminum, gallium, yttrium, or tin), and zinc.

In any of the above embodiments, it is possible that in the first step, the same voltage is input to the non-inverting input terminal of the first transconductance amplifier, the inverting input terminal of the first transconductance amplifier, and the one of the non-inverting input terminal and the inverting input terminal of the second transconductance amplifier.

In any of the above embodiments, it is possible that the display device further includes a first circuit, a second circuit, and a third circuit, the first circuit is configured to generate a first clock signal and a second clock signal, output a digital signal corresponding to the gray levels expressed by the pixels to the second circuit in accordance with the first clock signal, and output the second clock signal to the third circuit, the second circuit is configured to hold the digital signal, a voltage of the second clock signal is constant in the first step, the second analog signal is output in synchronization with the second clock signal in the second step, and the third circuit is configured to read the digital signal from the second circuit in the second step.

In the above embodiment, it is possible that the third circuit includes the buffer amplifier and is configured to convert the digital signal into the second analog signal.

In any of the above embodiments, it is possible that the pixel includes a light-emitting element and a non-light-emitting element.

Another embodiment of the present invention is a display device which is configured to perform display by the display method of one embodiment of the present invention.

Another embodiment of the present invention is a display module including the display device of one embodiment of the present invention and a touch panel.

Another embodiment of the present invention is an electronic device including the display device of one embodiment of the present invention or the display module of one embodiment of the present invention, and an operation key or a battery.

According to one embodiment of the present invention, a display device which operates at high speed and a display method thereof can be provided. According to another embodiment of the present invention, a display device capable of displaying an image with a large number of gray levels and a display method thereof can be provided. According to another embodiment of the present invention, a display device capable of displaying an image having high resolution and a display method thereof can be provided. According to another embodiment of the present invention, a display device with a high frame frequency and a display method thereof can be provided. According to another embodiment of the present invention, a small display device and a display method thereof can be provided. According to another embodiment of the present invention, an inexpensive display device and a display method thereof can be provided. According to another embodiment of the present invention, a display device with high visibility and a display method thereof can be provided. According to another embodiment of the present invention, a display device with low power consumption and a display method thereof can be provided. According to another embodiment of the present invention, a novel display device and a display method thereof can be provided.

Note that the description of these effects does not preclude the existence of other effects. One embodiment of the present invention does not necessarily achieve all the effects listed above. Other effects will be apparent from and can be derived from the description of the specification, the drawings, the claims, and the like.

BRIEF DESCRIPTION OF THE DRAWINGS

In the accompanying drawings:

FIGS. 20A to 20C are a circuit diagram and layout diagrams illustrating a structure example of a display device;

FIGS. 23A to 23C are a schematic cross-sectional view illustrating a structure example of a display device;

DETAILED DESCRIPTION OF THE INVENTION

Figure 1:
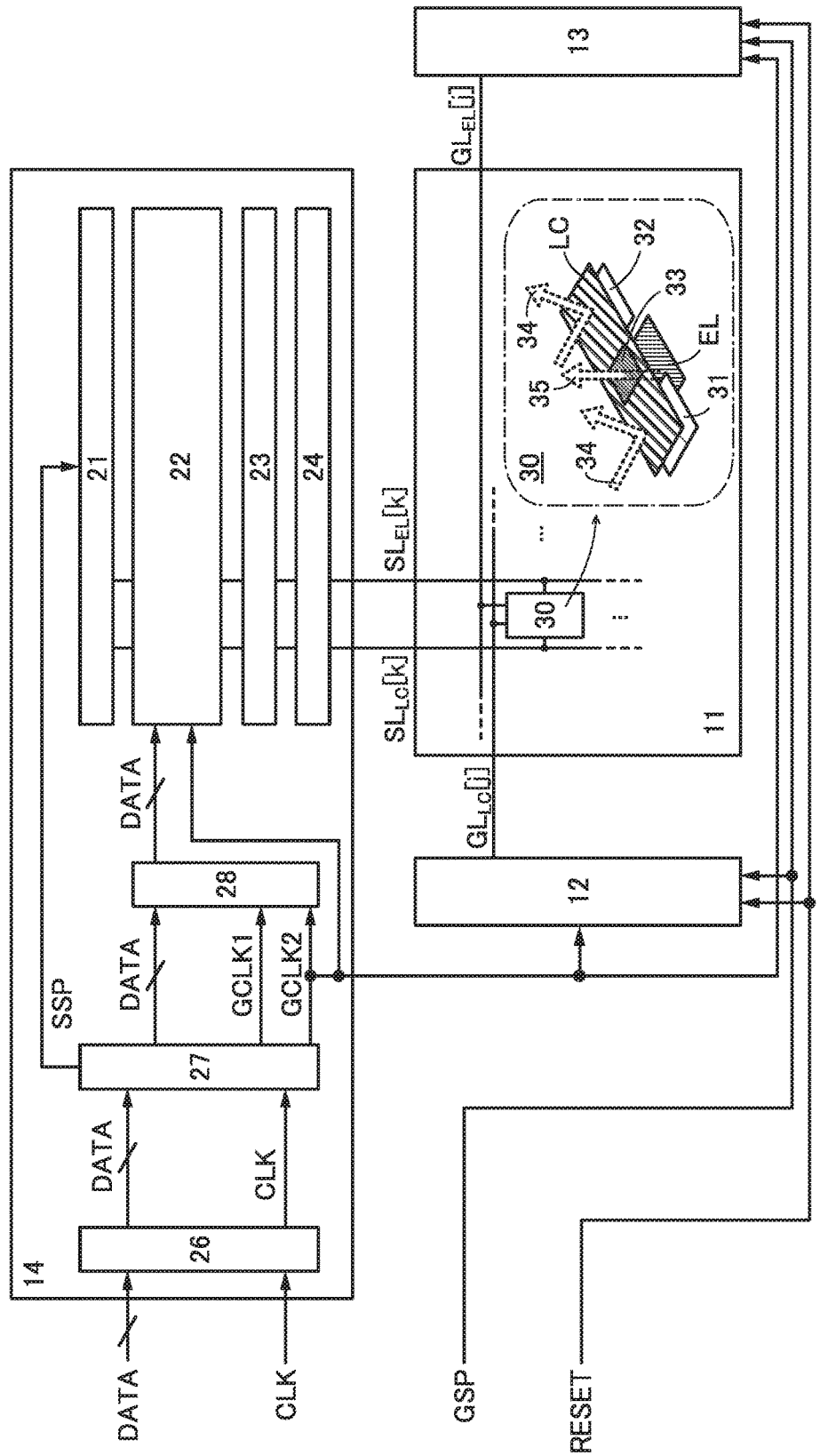
FIG. 1 is a block diagram illustrating a structure example of a display device.

Hereinafter, embodiments will be described with reference to the drawings. Note that embodiments can be carried out in many different modes, and it is easily understood by those skilled in the art that modes and details of the present invention can be modified in various ways without departing from the spirit and the scope of the present invention. Thus, the present invention should not be interpreted as being limited to the following description of the embodiments.

In this specification and the like, ordinal numbers such as "first", "second", and "third" are used in order to avoid confusion among components. Thus, the terms do not limit the number or order of components.

In a block diagram in this specification and the like, components are functionally classified and shown by blocks that are independent from each other. However, in an actual circuit and the like, such components are sometimes hard to classify functionally, and there is a case in which one circuit is concerned with a plurality of functions or a case in which a plurality of circuits are concerned with one function. Therefore, blocks in a block diagram do not necessarily show components described in the specification, which can be explained with another term as appropriate depending on the situation.

The same elements or elements having similar functions, elements formed using the same material, elements formed at the same time, or the like in the drawings are denoted by the same reference numerals, and the description thereof is not repeated in some cases.

In this specification and the like, the expressions "one of a source and a drain" (or a first electrode or a first terminal) and "the other of the source and the drain" (or a second electrode or a second terminal) are used to describe the connection relation of a transistor. This is because a source and a drain of a transistor are interchangeable depending on the structure, operation conditions, or the like of the transistor. Note that the source or the drain of the transistor can also be referred to as a source (or drain) terminal, a source (or drain) electrode, or the like as appropriate depending on the situation.

In this specification and the like, "voltage" and "potential" can be replaced with each other. The term "voltage" refers to a potential difference from a reference potential. When the reference potential is a ground potential, for example, "voltage" can be replaced with "potential". The ground potential does not necessarily mean 0 V. Potentials are relative values, and the potential supplied to a wiring or the like is changed depending on the reference potential, in some cases.

In this specification and the like, a switch is conducting (on state) or not conducting (off state) to determine whether current flows therethrough or not. Alternatively, a switch has a function of selecting and changing a current path.

For example, an electrical switch, a mechanical switch, or the like can be used as a switch. That is, any element can be used as a switch as long as it can control current, without limitation to a certain element.

In the case of using a transistor as a switch, an "on state" of the transistor refers to a state in which a source and a drain of the transistor are electrically short-circuited. Furthermore, an "off state" of the transistor refers to a state in which the source and the drain of the transistor are electrically disconnected. In the case where a transistor operates just as a switch, the polarity (conductivity type) of the transistor is not particularly limited to a certain type.

In this specification and the like, when it is described that "A and B are connected to each other", the case where A and B are electrically connected to each other is included in addition to the case where A and B are directly connected to each other. Here, the expression "A and B are electrically connected" means the case where electric signals can be transmitted and received between A and B when an object having any electric action exists between A and B.

Embodiment 1

In this embodiment, structure examples and display method examples of a display device of one embodiment of the present invention will be described with reference to FIG. 1, FIG. 2, FIG. 3, FIG. 4, FIG. 5, FIG. 6, FIGS. 7A and 7B, FIG. 8, FIG. 9, FIG. 10, FIG. 11, FIG. 12, FIG. 13, FIG. 14, FIG. 15, and FIG. 16.

One embodiment of the present invention relates to correction of the offset voltage of a buffer amplifier included in a display device. In particular, one embodiment of the present invention relates to correction of the offset voltage of a buffer amplifier provided in a D/A converter circuit included in a source driver circuit. When the offset voltage of a buffer amplifier is corrected, even if the number of gray levels expressed by one pixel is large, the gray levels can be expressed accurately. In the display device of one embodiment of the present invention, after the offset voltage of the buffer amplifier is corrected, a grayscale voltage is written to pixels in two rows or more, and then the offset voltage of the buffer amplifier is corrected again. In this manner, as compared with the case where the offset voltage of the buffer amplifier is corrected every time the grayscale voltage is written to pixels in one row, the display device of one embodiment of the present invention can be operated at high speed even if one period for correcting the offset voltage is lengthened. Thus, a high-resolution image can be displayed. In addition, the frame frequency of the display device of one embodiment of the present invention can be increased.

FIG. 1 is a block diagram showing a structure example of a display device 10 that is the display device of one embodiment of the present invention. The display device 10 includes a display portion 11, a gate driver circuit 12, a gate driver circuit 13, and a source driver circuit 14.

In the display portion 11, a plurality of pixels 30 are arranged in a matrix. For example, the pixels 30 are arranged in a matrix of x rows and y columns (x and y are both integers greater than or equal to 2). In FIG. 1, a pixel in a j-th row and a k-th column (j is an integer greater than or equal to 1 and less than or equal to x, and k is an integer greater than or equal to 1 and less than or equal to y) is shown as the pixel 30 in an arbitrary row and an arbitrary column.

The display portion 11 has a function of displaying an image using the pixels 30. Note that in this specification and the like, displaying an image by a display portion using pixels arranged in the display portion is referred to as displaying an image by pixels in some cases.

The structure of the pixel 30 will be described. FIG. 1 shows a schematic diagram of the pixel 30. The pixel 30 includes a pixel circuit 31, a pixel circuit 32, a liquid crystal element LC, and a light-emitting element EL. The pixel circuit 31 is a circuit for controlling grayscale display of the liquid crystal element LC. The pixel circuit 32 is a circuit for controlling grayscale display of the light-emitting element EL. That is, the pixel 30 can perform grayscale display by the liquid crystal element LC and the light-emitting element EL.

The liquid crystal element LC includes a reflective electrode. In the liquid crystal element LC, which is a so-called reflective display element, the intensity of light reflected by the reflective electrode is adjusted by a liquid crystal layer to perform grayscale display. In the light-emitting element EL, which is a so-called self-luminous display element, light emission is adjusted by changing the amount of current flowing between electrodes to perform grayscale display. Note that details of the cross-sectional structure and the like of the pixel will be described later.

Note that as the liquid crystal element LC, in addition to the reflective liquid crystal element, a transmissive liquid crystal element, a transflective liquid crystal element, or the like may be used. Alternatively, a non-light-emitting element other than the liquid crystal element may be used as the liquid crystal element LC.

Alternatively, a reflective display element other than the liquid crystal element may be used as the liquid crystal element LC.

As the light-emitting element EL, in addition to an EL element such as an organic electroluminescence element or an inorganic electroluminescence element, a light-emitting diode or the like can be used. Alternatively, a quantum dot can be used. Alternatively, a combination of a transmissive display element, e.g., a transmissive liquid crystal element, and a backlight may be used.

The schematic diagram of the pixel 30 in FIG. 1 illustrates the arrangement of the pixel circuit 31, the pixel circuit 32, the liquid crystal element LC, and the light-emitting element EL. The liquid crystal element LC illustrated in FIG. 1 includes an opening 33. This opening 33 is provided in the reflective electrode. The light-emitting element EL illustrated in FIG. 1 is provided to overlap with the opening 33 of the liquid crystal element LC.

The pixel circuit 31 and the pixel circuit 32 illustrated in FIG. 1 are provided between a layer including the liquid crystal element LC and a layer including the light-emitting element EL. An element layer including transistors in the pixel circuit 31 for driving the liquid crystal element LC and an element layer including transistors in the pixel circuit 32 for driving the light-emitting element EL are formed in the same process, so that the pixel circuit 31 and the pixel circuit 32 are arranged in the same layer. This structure offers a driver circuit in which a driver circuit for supplying a grayscale voltage to the liquid crystal element LC is integrated with a driver circuit for supplying a grayscale voltage to the light-emitting element EL. Note that in FIG. 1, the pixel circuit 31 and the pixel circuit 32 are provided between the layer including the liquid crystal element LC and the layer including the light-emitting element EL; alternatively, the pixel circuits may be provided over or under the liquid crystal element LC and the light-emitting element EL.

In the pixel 30 with the structure illustrated in FIG. 1, grayscale display can be performed by the control of the intensity of reflected light 34 of the liquid crystal element LC and the control of the intensity of light 35 emitted from the light-emitting element EL through the opening 33. Note that the reflected light 34 and the light 35 emitted from the light-emitting element EL are emitted toward a display surface of the display device 10.

In the pixel 30 with the structure illustrated in FIG. 1, the circuits for driving the pixels, such as the pixel circuit 31 and the pixel circuit 32, can be arranged under the reflective electrode of the liquid crystal element LC. This can suppress a decrease in aperture ratio due to the addition of the pixel circuit 32 for driving the light-emitting element EL.

In the pixel 30 with the structure illustrated in FIG. 1, the intensity of light using external light reflected by the reflective electrode of the liquid crystal element LC is adjusted by the liquid crystal layer to perform grayscale display. This results in improved outdoor visibility of the display device including the pixel 30 in FIG. 1.

In the pixel 30 with the structure illustrated in FIG. 1, the intensity of the light 35 emitted from the light-emitting element EL is adjusted to perform grayscale display. This results in improved visibility in indoor environments with a low external light intensity of the display device 10 including the pixel 30 in FIG. 1.

Furthermore, in the structure illustrated in FIG. 1, each pixel includes the pixel circuit 31 for controlling the liquid crystal element LC and the pixel circuit 32 for controlling the light-emitting element EL. In other words, grayscale display with the liquid crystal element LC and grayscale display with the light-emitting element EL can be independently controlled in each pixel 30. In such a structure, the control with a backlight for concurrently emitting light in a plurality of pixels is not performed, but light emission of the light-emitting element EL can be controlled in each pixel (minimum unit) in accordance with an image to be displayed, whereby unnecessary light emission can be inhibited. Hence, lower power consumption can be achieved in the display device 10 including the pixel 30 in FIG. 1.

The pixel 30 can be not only used to drive a pixel in a display device for monochrome display but also used as a pixel in a display device for color display when a color filter is provided. In color display, the pixel 30 corresponds to a subpixel with any of three color elements of RGB (R, G, and B represent red, green, and blue, respectively). The number of subpixels in one pixel is not limited to three. For example, one pixel may include four subpixels: an R subpixel, a G subpixel, a B subpixel, and a W (white) subpixel. Alternatively, a color element may be composed of two colors among R, G, and B as in PenTile layout. The two colors may differ among color elements.

Note that the pixel 30 may have a structure where one of the liquid crystal element LC and the light-emitting element EL is not included. In this case, for example, the manufacturing process of the display device 10 can be simplified. The above is the description of the structure of the pixel 30.

The gate driver circuit 12 is configured to output a selection signal to a gate line $GL_{LC}[j]$. The selection signal output from the gate driver circuit 12 is transmitted to the pixel 30 through the gate line $GL_{LC}[i]$. The selection signal output to the gate line $GL_{LC}[j]$ is a signal for writing a grayscale voltage output from the source driver circuit 14, which will be described later, to a signal line $SL_{LC}[k]$ to the pixel 30. Note that the gate driver circuit 12 is composed of a shift register and the like, and a variety of signals needed for driving (e.g., a clock signal GCLK2, a gate start pulse signal GSP, and a reset signal RESET) are input to the gate driver circuit 12.

The gate driver circuit 13 is configured to output a selection signal to a gate line $GL_{EL}[j]$. The selection signal output from the gate driver circuit 13 is transmitted to the pixel 30 through the gate line $GL_{EL}[k]$. The selection signal output to the gate line $GL_{EL}[j]$ is a signal for writing a grayscale voltage output from the source driver circuit 14, which will be described later, to a signal line $SL_{EL}[k]$ to the pixel 30. Note that the gate driver circuit 13 is composed of a shift register and the like, and a variety of signals needed for driving (e.g., a clock signal GCLK2, a gate start pulse signal GSP, and a reset signal RESET) are input to the gate driver circuit 13.

The source driver circuit 14 is configured to output a grayscale voltage for driving the liquid crystal element LC included in the pixel 30 to the signal line $SL_{LC}[k]$. Furthermore, the source driver circuit 14 is configured to output a grayscale voltage for driving the light-emitting element EL included in the pixel 30 to the signal line $SL_{EL}[k]$. The grayscale voltage output to the signal line $SL_{LC}[k]$ is a voltage for driving the liquid crystal element LC included in the pixel 30. The grayscale voltage output to the signal line $SL_{EL}[k]$ is a voltage for driving the light-emitting element EL included in the pixel 30. Note that to the source driver circuit 14, a variety of signals needed for driving such as a clock signal CLK are input.

The source driver circuit 14 illustrated in FIG. 1 includes a D/A converter circuit 24, a control circuit 27, and a memory circuit 28. In addition, the source driver circuit 14 can include a shift register 21, a latch circuit 22, a level shifter circuit 23, an interface circuit 26, and the like.

The D/A converter circuit 24 is configured to convert digital data DATA, which is a digital signal, into a grayscale voltage, which is analog data. The digital data DATA can be display data which corresponds to the gray levels expressed by one pixel 30. For example, the digital data DATA can be n-bit display data (n is an integer greater than or equal to 2).

Alternatively, the digital data DATA can be 10-bit display data. Alternatively, the digital data DATA can be 12-bit display data. Alternatively, the digital data DATA can be 13-bit or more display data. In the case where the digital data DATA is n-bit display data, the D/A converter circuit 24 is configured to convert the digital data DATA into $2^n$ grayscale voltages.

In this specification and the like, "data" and "signal" can be replaced with each other in appropriate cases. For example, "digital data" and "digital signal" can be replaced with each other in appropriate cases.

The control circuit 27 includes a counter and the like and is configured to generate a clock signal GCLK1 and the clock signal GCLK2 based on the clock signal CLK, which is generated by a circuit other than the source driver circuit 14, such as a central processing unit (CPU). For example, in the case where the frequency of the clock signal CLK is 500 MHz, the period of the clock signal CLK is 0.02 μs; thus, for example, the clock period of the clock signal GCLK1 can be 3.84 μs and the clock period of the clock signal GCLK2 can be 3.80 μs. That is, for example, the half period of the clock signal GCLK1 can be 1.92 μs and the half period of the clock signal GCLK2 can be 1.90 μs.

The generated clock signal GCLK1 can be output to the memory circuit 28, for example. The generated clock signal GCLK2 can be output to the gate driver circuit 12, the gate driver circuit 13, the latch circuit 22, and the memory circuit 28, for example. Note that the clock signal GCLK2 may be output to the level shifter circuit 23, the D/A converter circuit 24, and the like.

In this specification and the like, inputting the digital data DATA, the clock signal GCLK2, or the like to the latch circuit 22, the level shifter circuit 23, or the like is referred to as inputting the digital data DATA, the clock signal GCLK2, or the like to the D/A converter circuit 24 in some cases.

Since the crock signal GCLK1 and the clock signal GCLK2 are both generated by the control circuit 27 included in the source driver circuit 14, a circuit other than the source driver circuit 14, such as a CPU, generates one kind of clock signal. Thus, the cost of the display device 10 can be reduced.

In addition, the control circuit 27 is configured to generate a source start pulse signal SSP or the like and output it to the shift register 21.

Furthermore, the control circuit 27 is configured to convert the format of the digital data DATA generated by a circuit other than the source driver circuit 14. For example, in the case where serial digital data DATA is input to the control circuit 27, the control circuit 27 is configured to convert the digital data DATA into parallel digital data DATA and output it to the memory circuit 28.

The memory circuit 28 is configured to hold the digital data DATA. In addition, the memory circuit 28 is configured to output the held digital data DATA to the latch circuit 22, for example.

The digital data DATA can be written to the memory circuit 28 in synchronization with the clock signal GCLK1. Furthermore, the digital data DATA can be read out from the memory circuit 28 in synchronization with the clock signal GCLK2.

The shift register 21 is configured to generate a pulse signal in response to the input of the source start pulse signal SSP or the like. The latch circuit 22 is configured to read out the digital data DATA from the memory circuit 28 in accordance with the input of the pulse signal output from the shift register 21, and to output the digital data DATA.

The level shifter circuit 23 is configured to amplify a voltage of the digital data DATA. For example, after the voltage of the digital data DATA output from the latch circuit 22 is amplified, the digital data DATA can be output to the D/A converter circuit 24.

The interface circuit 26 is configured to receive the digital data DATA and the clock signal CLK generated by a circuit other than the source driver circuit 14 and to output the digital data DATA and the clock signal CLK to the control circuit 27. The specifications of the interface circuit 26 are preferably high-speed transmission interface specifications such as mini low-voltage differential signaling (mini-LVDS).

Figure 2:
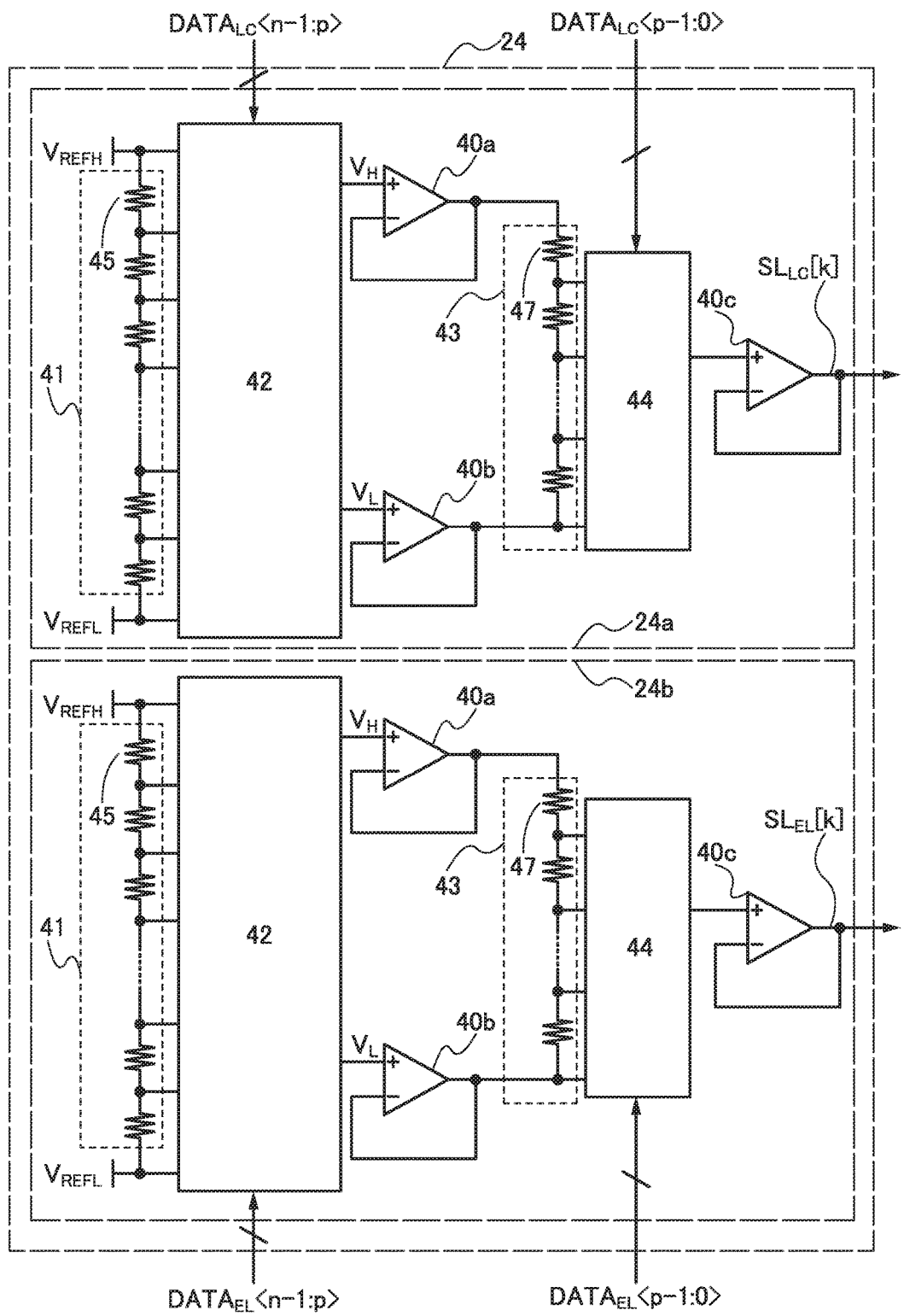
FIG. 2 is a circuit diagram illustrating a structure example of a display device.

FIG. 2 illustrates a specific circuit configuration of the D/A converter circuit 24. The D/A converter circuit 24 includes a D/A converter circuit 24a and a D/A converter circuit 24b. The D/A converter circuit 24a is configured to convert digital data $DATA_{LC}$ corresponding to grayscale display of the liquid crystal element LC into analog data and output the analog data through the wiring $SL_{LC}[k]$. The D/A converter circuit 24b is configured to convert digital data $DATA_{EL}$ corresponding to grayscale display of the light-emitting element EL into analog data and output the analog data from the wiring $SL_{EL}[k]$.

In this specification and the like, the digital data $DATA_{LC}$ and the digital data $DATA_{EL}$ are collectively referred to as digital data DATA in some cases. Alternatively, either the digital data $DATA_{LC}$ or the digital data $DATA_{EL}$ is referred to as digital data DATA in some cases.

The D/A converter circuit 24a and the D/A converter circuit 24b can be provided, for example, to correspond to the number of columns of the pixels 30 arranged in the display portion 11. For example, in the case where the pixels 30 in y columns are provided in the display portion 11, the number of D/A converter circuits 24a and the number of D/A converter circuits 24b can each be y.

The D/A converter circuit 24a includes a buffer amplifier 40a, a buffer amplifier 40b, a buffer amplifier 40c, a resistor string 41, a pass transistor logic circuit 42, a resistor string 43, and a pass transistor logic circuit 44. In the case where the digital data $DATA_{LC}$ is n-bit digital data, the digital data $DATA_{LC}<p-1:0>$ of the first bit to the p-th bit (p is an integer greater than or equal to 2 and less than n) counted from the lower bit are input to the pass transistor logic circuit 44. Furthermore, the digital data $DATA_{LC}<n-1:p>$ of the p+1-th bit to the n-th bit counted from the lower bit are input to the pass transistor logic circuit 42.

The resistor string 41 includes a plurality of resistors 45. The number of resistors 45 corresponds top and n. For example, $2^{n-p}$ resistors 45 are provided. That is, in the case where n is 10 and p is 2, for example, 256 resistors 45 are provided.

The resistor string 43 includes a plurality of resistors 47. The number of resistors 47 corresponds to p. For example, $2^P$ resistors 47 are provided. That is, in the case where p is 2, for example, four resistors 47 are provided.

The resistors 45 provided in the resistor string 41 are connected in series. To a terminal of one of the two resistors 45 which is not connected to a terminal of another resistor 45, a voltage $V_{REFH}$ is input, and to a terminal of the other resistor 45 which is not connected to a terminal of another resistor 45, a voltage $V_{REFL}$ is input. Here, the voltage $V_{REFH}$ is higher than the voltage $V_{REFL}$. Note that all the resistors 45 preferably have an equal electric resistance.

The resistor string 41, one of a non-inverting input terminal and an inverting input terminal of the buffer amplifier 40a, and one of a non-inverting input terminal and an inverting input terminal of the buffer amplifier 40b are electrically connected to the pass transistor logic circuit 42. An output terminal of the buffer amplifier 40a is electrically connected to the resistor string 43 and the other of the non-inverting input terminal and the inverting input terminal of the buffer amplifier 40a. An output terminal of the buffer amplifier 40b is electrically connected to the resistor string 43 and the other of the non-inverting input terminal and the inverting input terminal of the buffer amplifier 40b. In FIG. 2, the non-inverting input terminal of the buffer amplifier 40a and the non-inverting input terminal of the buffer amplifier 40b are electrically connected to the pass transistor logic circuit 42. In addition, in FIG. 2, the output terminal of the buffer amplifier 40a is electrically connected to the inverting input terminal of the buffer amplifier 40a and the output terminal of the buffer amplifier 40b is electrically connected to the inverting input terminal of the buffer amplifier 40b.

From the pass transistor logic circuit 42, a voltage $V_H$ and a voltage $V_L$ based on the digital data $DATA_{LC}<n-1:p>$ are output. The voltage $V_H$ is input to the one of the non-inverting input terminal and the inverting input terminal of the buffer amplifier 40a and the voltage $V_L$ is input to the one of the non-inverting input terminal and the inverting input terminal of the buffer amplifier 40b. Note that the voltage $V_H$ is higher than the voltage $V_L$.

The voltage $V_H$ which is input to the one of the non-inverting input terminal and the inverting input terminal of the buffer amplifier 40a is stabilized and output from the output terminal of the buffer amplifier 40a. Furthermore, the voltage $V_L$ which is input to the one of the non-inverting input terminal and the inverting input terminal of the buffer amplifier 40b is stabilized and output from the output terminal of the buffer amplifier 40b.

The resistors 47 provided in the resistor string 43 are connected in series. To a terminal of one of the two resistors 47 which is not connected to a terminal of another resistor 47, the output terminal of the buffer amplifier 40a is electrically connected, and to a terminal of the other resistor 47 which is not connected to a terminal of another resistor 47, the output terminal of the buffer amplifier 40b is electrically connected. Note that all the resistors 47 preferably have an equal electric resistance.

The resistor string 43 and one of a non-inverting input terminal and an inverting input terminal of the buffer amplifier 40c are electrically connected to the pass transistor logic circuit 44. An output terminal of the buffer amplifier 40c is electrically connected to the wiring $SL_{LC}[k]$, and is electrically connected to the other of the non-inverting input terminal and the inverting input terminal of the buffer amplifier 40c through the wiring $SL_{LC}[k]$. In FIG. 2, the non-inverting input terminal of the buffer amplifier 40c is electrically connected to the pass transistor logic circuit 44. In addition, in FIG. 2, the output terminal of the buffer amplifier 40c is electrically connected to the inverting input terminal of the buffer amplifier 40c.

From the pass transistor logic circuit 44, a voltage higher than or equal to the voltage $V_L$ and lower than or equal to the voltage $V_H$, which corresponds to the digital data $DATA_{LC}<p-1:0>$, is output, and the voltage is input to the one of the non-inverting input terminal and the inverting input terminal of the buffer amplifier 40c.

The voltage which is input to the one of the non-inverting input terminal and the inverting input terminal of the buffer amplifier 40c is stabilized and output as analog data from the output terminal of the buffer amplifier 40c to the wiring $SL_{LC}[k]$. In this manner, the digital data $DATA_{LC}$<n−1:0> can be converted into analog data.

The D/A converter circuit 24b can have a structure similar to that of the D/A converter circuit 24a. For example, in the case where the digital data $DATA_{EL}$ is n-bit digital data, the digital data $DATA_{EL}$<p−1:0> of the first bit to the p-th bit (p is an integer greater than or equal to 2 and less than n) counted from the lower bit are input to the pass transistor logic circuit 44. Furthermore, the digital data $DATA_{EL}$<n−1:p> of the p+1-th bit to the n-th bit counted from the lower bit are input to the pass transistor logic circuit 42. Thus, the digital data $DATA_{EL}$<n−1:0> can be converted into analog data, and the analog data can be output through the wiring $SL_{EL}[k]$ which is electrically connected to the output terminal of the buffer amplifier 40c.

Next, structure examples of the pass transistor logic circuit 42 and the pass transistor logic circuit 44 are described with reference to FIG. 3 and FIG. 4.

Figure 3:
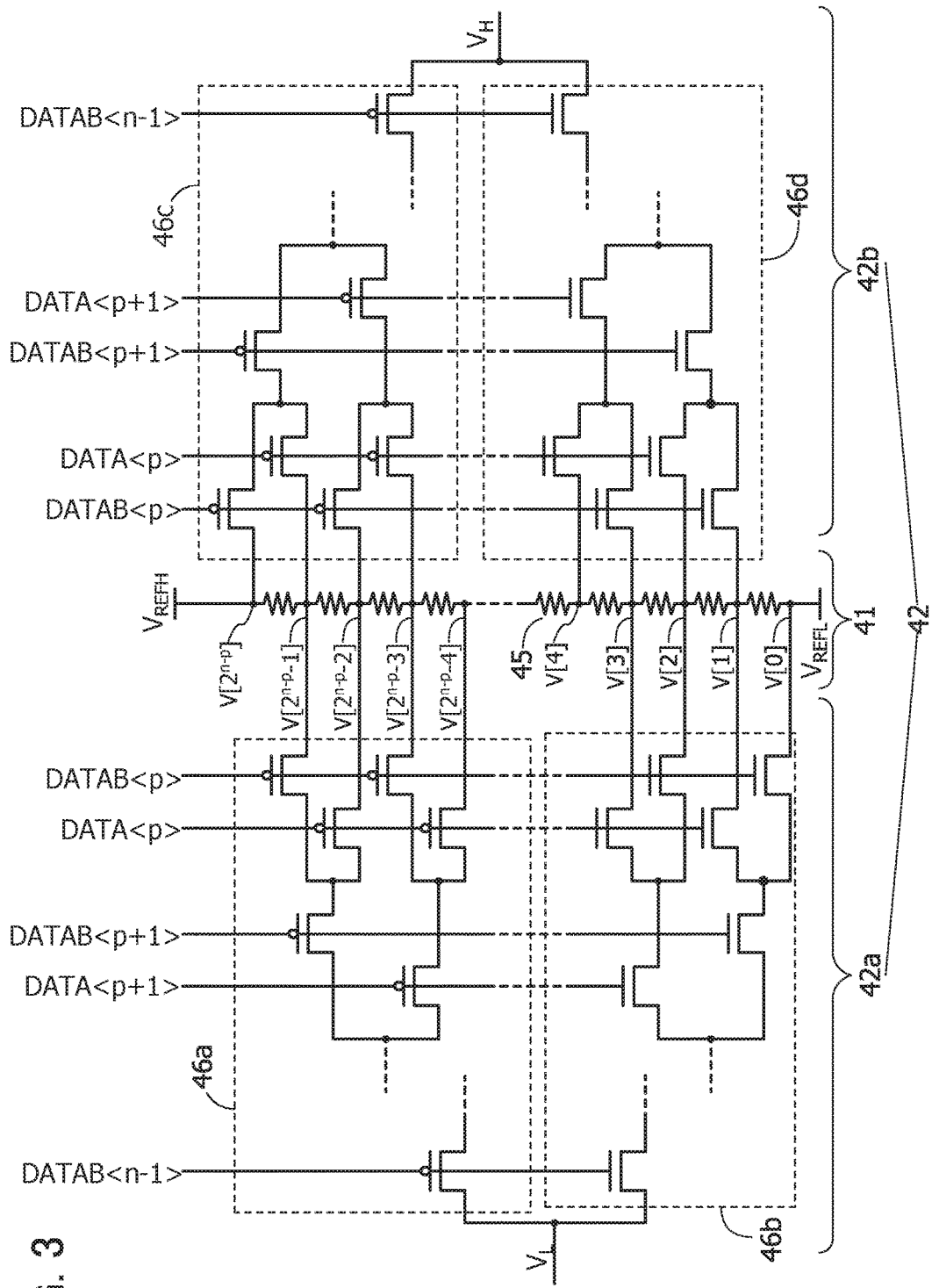
FIG. 3 is a circuit diagram illustrating a structure example of a display device.

FIG. 3 is a circuit diagram illustrating a detailed structure example of the resistor string 41 and the pass transistor logic circuit 42. The pass transistor logic circuit 42 includes a pass transistor logic circuit 42a and a pass transistor logic circuit 42b.

The pass transistor logic circuit 42a includes a plurality of p-channel transistors 46a and a plurality of n-channel transistors 46b. The pass transistor logic circuit 42b includes a plurality of p-channel transistors 46c and a plurality of n-channel transistors 46d.

The resistor string 41 is configured to generate a voltage V[0] to a voltage $V[2^{n-p}]$. Of the voltage V[0] to the voltage $V[2^{n-p}]$, the voltage $V[2^{n-p}/2]$ to the voltage $V[2^{n-p}-1]$ are input to the transistors 46a, the voltage V[0] to the voltage $V[2^{n-p}/2-1]$ are input to the transistors 46b, the voltage $V[2^{n-p}/2+1]$ to the voltage $V[2^{n-p}]$ are input to the transistors 46c, and the voltage V[1] to the voltage $V[2^{n-p}/2]$ are input to the transistors 46d. Note that the voltage V[0] can be the voltage $V_{REFL}$ and the voltage $V[2^{n-p}]$ can be the voltage $V_{REFH}$.

The transistors 46a to 46d are pass transistors and function as switches. These transistors are turned on or turned off in accordance with the digital data DATA<n−1:p> and digital data DATAB<n−1:p>, which are complementary data (data in which the logic of each bit is inverted) of the digital data DATA<n−1:p>. The pass transistor logic circuit 42a is configured to select a desired voltage from the voltage V[0] to the voltage $V[2^{n-p}-1]$ in accordance with the on state or the off state of the transistors 46a and 46b and output the voltage as the voltage $V_L$. The pass transistor logic circuit 42b is configured to select a desired voltage from the voltage V[1] to the voltage $V[2^{n-p}]$ in accordance with the on state or the off state of the transistors 46c and 46d and output the voltage as the voltage $V_H$.

Figure 4:
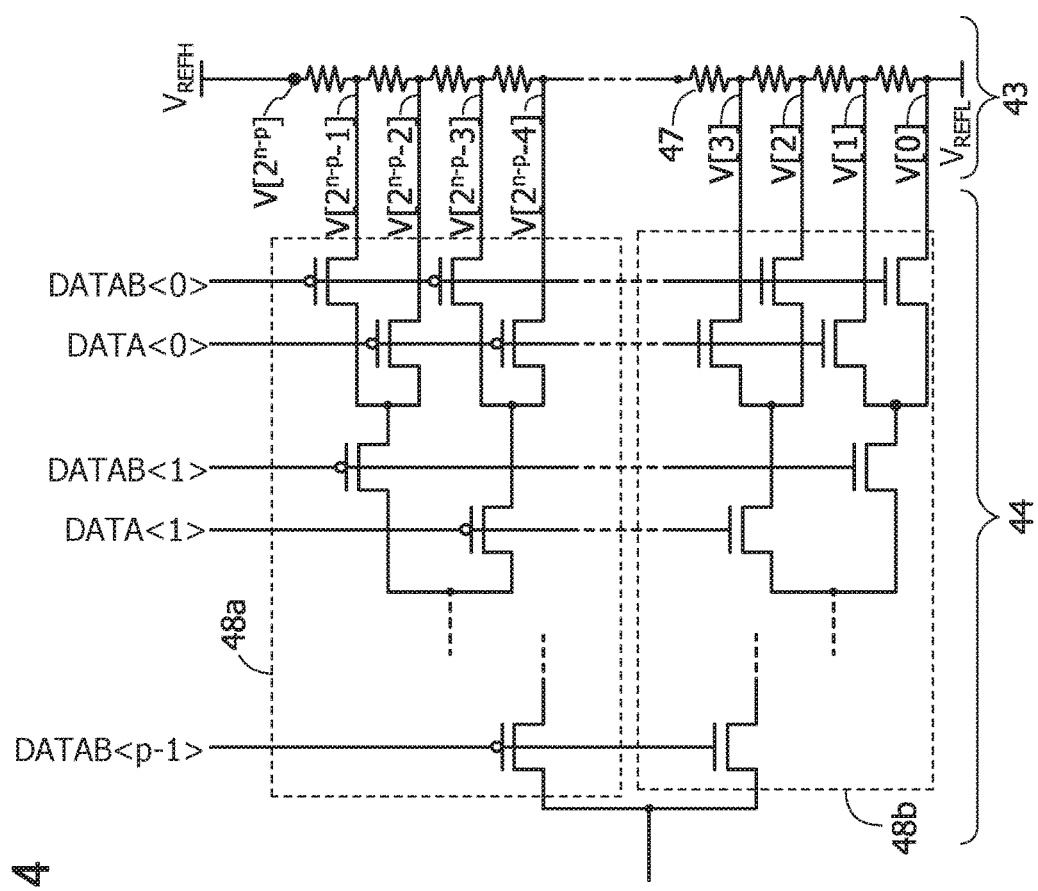
FIG. 4 is a circuit diagram illustrating a structure example of a display device.

FIG. 4 is a circuit diagram illustrating a detailed structure example of the resistor string 43 and the pass transistor logic circuit 44.

The pass transistor logic circuit 44 includes a plurality of p-channel transistors 48a and a plurality of n-channel transistors 48b.

The resistor string 43 is configured to generate a voltage V[0] to a voltage $V[2^{n-p}-1]$. Of the voltage V[0] to the voltage $V[2^{n-p}-1]$, the voltage $V[2^{n-p}/2]$ to the voltage $V[2^{n-p}-1]$ are input to the transistors 48a, and the voltage V[0] to the voltage $V[2^{n-p}/2-1]$ are input to the transistors 48b. Note that the voltage V[0] can be the voltage $V_{REFL}$.

The transistors 48a and 48b are pass transistors and function as switches. These transistors are turned on or turned off in accordance with the digital data DATA<p−1:0> and digital data DATAB<p−1:0>, which are complementary data of the digital data DATA<p−1:0>. The pass transistor logic circuit 44 is configured to select a desired voltage from the voltage V[0] to the voltage $V[2^{n-p}-1]$ in accordance with the on state or the off state of the transistors 48a and 48b and output the voltage.

The resistor string 43 may be configured to generate the voltage V[1] to the voltage $V[2^{n-p}]$. In this case, of the voltage V[1] to the voltage $V[2^{n-p}]$, the voltage $V[2^{n-p}/2+1]$ to the voltage $V[2^{n-p}]$ are input to the transistors 48a, and the voltage V[1] to the voltage $V[2^{n-p}/2]$ are input to the transistors 48b. Note that the voltage $V[2^{n-p}]$ can be the voltage $V_{REFH}$. The pass transistor logic circuit 44 is configured to select a desired voltage from the voltage V[1] to the voltage $V[2^{n-p}]$ in accordance with the on state or the off state of the transistors 48a and 48b and output the voltage.

In FIG. 3 and FIG. 4, the digital data input to the pass transistor logic circuit 42 and the pass transistor logic circuit 44 are denoted by the digital data DATA<n−1:0>. The digital data DATA<n−1:0> can be the digital data $DATA_{LC}$<n−1:0> in the pass transistor logic circuit 42 and the pass transistor logic circuit 44 provided in the D/A converter circuit 24a. Furthermore, in the pass transistor logic circuit 42 and the pass transistor logic circuit 44 provided in the D/A converter circuit 24b, the digital data DATA<n−1:0> can be the digital data $DATA_{EL}$<n−1:0>.

Through the above-described procedure, the digital data DATA can be converted into analog data.

As illustrated in FIG. 2, in the case where the D/A converter circuit 24 is a D/A converter circuit with two resistor strings, as compared with the case where the D/A converter circuit 24 is a D/A converter circuit with one resistor string, the number of resistors included in the D/A converter circuit 24 can be reduced. Thus, the number of pass transistors included in the D/A converter circuit 24 can be reduced. For example, in the case where the D/A converter circuit 24 is a D/A converter circuit with two resistor strings and n is 10 and p is 2, the resistor string 41 includes 256 resistors 45 and the resistor string 43 includes four resistors 47. That is, the D/A converter circuit 24 includes 260 resistors. In contrast, in the case where the D/A converter circuit 24 is a D/A converter circuit with one resistor string and n is 10, the D/A converter circuit 24 includes 1024 resistors. In the above manner, in the case where the D/A converter circuit 24 is a D/A converter circuit with two resistor strings, especially in the case where the D/A converter circuit is configured to convert digital data with a large number of bits into analog data, the area occupied by the D/A converter circuit can be reduced.

Figure 5:
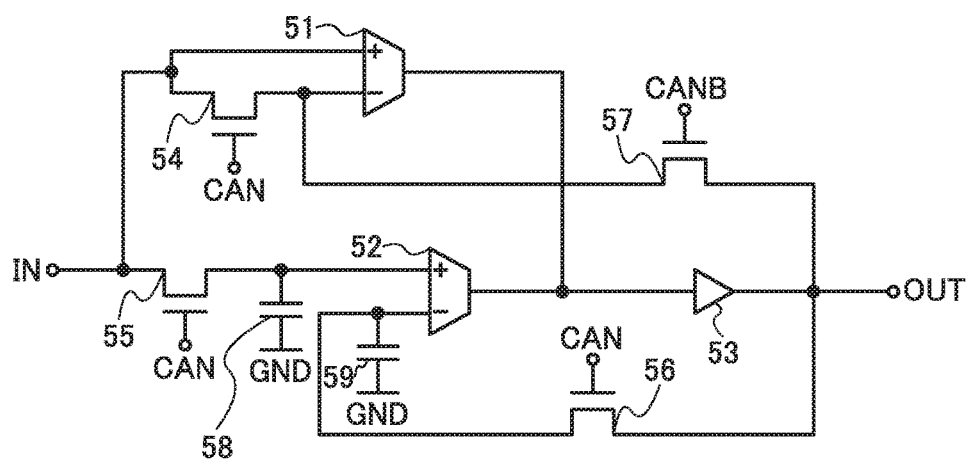
FIG. 5 is a circuit diagram illustrating a structure example of a display device.

FIG. 5 is a circuit diagram illustrating a structure example of the buffer amplifier 40 included in the display device 10, such as the buffer amplifier 40a, the buffer amplifier 40b, and the buffer amplifier 40c. Note that the buffer amplifier 40 having the structure illustrated in FIG. 5 can also be used in the D/A converter circuit with one resistor string.

The buffer amplifier 40 includes a transconductance amplifier 51, a transconductance amplifier 52, a buffer 53, a transistor 54, a transistor 55, a transistor 56, a transistor 57, a capacitor 58, and a capacitor 59. Note that a transconductance amplifier refers to an amplifier which converts voltage into current.

One of a non-inverting input terminal and an inverting input terminal of the transconductance amplifier 51 is electrically connected to one of a source and a drain of the transistor 54 and one of a source and a drain of the transistor 55. The other of the non-inverting input terminal and the inverting input terminal of the transconductance amplifier 51 is electrically connected to the other of the source and the drain of the transistor 54 and one of a source and a drain of the transistor 57. An output terminal of the transconductance amplifier 51 is electrically connected to an output terminal of the transconductance amplifier 52 and an input terminal of the buffer 53. One of a non-inverting input terminal and an inverting input terminal of the transconductance amplifier 52 is electrically connected to the other of the source and the drain of the transistor 55 and one terminal of the capacitor 58. The other of the non-inverting input terminal and the inverting input terminal of the transconductance amplifier 52 is electrically connected to one of a source and a drain of the transistor 56 and one terminal of the capacitor 59. An output terminal of the buffer 53 is electrically connected to the other of the source and the drain of the transistor 56 and the other of the source and the drain of the transistor 57. In FIG. 5, the non-inverting input terminal of the transconductance amplifier 51 is electrically connected to the one of the source and the drain of the transistor 54 and the one of the source and the drain of the transistor 55. In addition, the inverting input terminal of the transconductance amplifier 51 is electrically connected to the other of the source and the drain of the transistor 54 and the one of the source and the drain of the transistor 57. In addition, the non-inverting input terminal of the transconductance amplifier 52 is electrically connected to the other of the source and the drain of the transistor 55 and the one terminal of the capacitor 58. In addition, the inverting input terminal of the transconductance amplifier 52 is electrically connected to the one of the source and the drain of the transistor 56 and the one terminal of the capacitor 59.

A wiring GND is electrically connected to the other terminal of the capacitor 58 and the other terminal of the capacitor 59. To the wiring GND, for example, low voltage such as a ground voltage can be input. Note that in this specification and the like, a ground voltage is referred to as low voltage in some cases.

An analog signal IN can be input to the one of the non-inverting input terminal and the inverting input terminal of the transconductance amplifier 51. The analog signal IN can be input to the other of the non-inverting input terminal and the inverting input terminal of the transconductance amplifier 51 through the transistor 54. The analog signal IN can be input to the one of the non-inverting input terminal and the inverting input terminal of the transconductance amplifier 52 through the transistor 55. In FIG. 5, the analog signal IN is input to the non-inverting input terminal of the transconductance amplifier 51. In addition, the analog signal IN is input to the inverting input terminal of the transconductance amplifier 51 through the transistor 54. In addition, the analog signal IN is input to the non-inverting input terminal of the transconductance amplifier 52 through the transistor 55.

An analog signal OUT can be output from the output terminal of the buffer 53. The analog signal OUT can be input to the other of the non-inverting input terminal and the inverting input terminal of the transconductance amplifier 51 through the transistor 57. The analog signal OUT can be input to the other of the non-inverting input terminal and the inverting input terminal of the transconductance amplifier 52 through the transistor 56. In FIG. 5, the analog signal OUT is input to the inverting input terminal of the transconductance amplifier 51 through the transistor 57. In addition, the analog signal OUT is input to the inverting input terminal of the transconductance amplifier 52 through the transistor 56.

As the analog signal IN, for example, a signal at voltages corresponding to the gray levels expressed by the pixels 30 can be used. As the analog signal OUT, for example, a signal at a voltage corresponding to the voltage of the analog signal IN can be used. For example, the voltage of the analog signal OUT can be equal to the voltage of the analog signal IN. Note that with the function of the buffer amplifier 40, the analog signal OUT is stabilized as compared with the analog signal IN.

A signal CAN can be input to gates of the transistors 54 to 56. A signal CANB can be input to a gate of the transistor 57. The signal CAN can be at high voltage or low voltage, and the signal CANB can have logic opposite to the logic of the signal CAN. In other words, the signal CANB is at low voltage when the signal CAN is at high voltage, and the signal CANB is at high voltage when the signal CAN is at low voltage. That is, in the case where all of the transistors 54 to 57 are n-channel transistors or p-channel transistors, the transistor 57 can be turned off when the transistors 54 to 56 are on, and the transistor 57 can be turned on when the transistors 54 to 56 are off.

The transconductance amplifier 51 is configured to output current corresponding to the voltage of the analog signal IN. The transconductance amplifier 52 is configured to correct an offset voltage of the buffer amplifier 40. The buffer 53 is configured to output the analog signal OUT at a voltage corresponding to a current output from the transconductance amplifier 51 or the analog signal OUT at a voltage corresponding to a current output from the transconductance amplifier 52.

The transistors 54 and 57 are configured to select a signal input to the other of the non-inverting input terminal and the inverting input terminal of the transconductance amplifier 51. For example, when the transistor 54 is on and the transistor 57 is off, the analog signal IN is input to the other of the non-inverting input terminal and the inverting input terminal of the transconductance amplifier 51. Alternatively, when the transistor 54 is off and the transistor 57 is on, the analog signal OUT is input to the other of the non-inverting input terminal and the inverting input terminal of the transconductance amplifier 51.

The transistor 55 is configured to control a voltage input to one of the non-inverting input terminal and the inverting input terminal of the transconductance amplifier 52. For example, when the transistor 55 is on, the analog signal IN is input to one of the non-inverting input terminal and the inverting input terminal of the transconductance amplifier 52. Alternatively, when the transistor 55 is off, a voltage corresponding to charge accumulated in the capacitor 58 is input to the one of the non-inverting input terminal and the inverting input terminal of the transconductance amplifier 52.

The transistor 56 is configured to control a voltage input to the other of the non-inverting input terminal and the inverting input terminal of the transconductance amplifier 52. For example, when the transistor 56 is on, the analog signal OUT is input to the other of the non-inverting input terminal and the inverting input terminal of the transconductance amplifier 52. Alternatively, when the transistor 56 is off, a voltage corresponding to charge accumulated in the capacitor 59 is input to the other of the non-inverting input terminal and the inverting input terminal of the transconductance amplifier 52.

A transistor including a metal oxide in a semiconductor layer (hereinafter referred to as an OS transistor) is preferably used as each of the transistors 55 and 56.

The OS transistor has an extremely low leakage current in a non-conduction state (off-state current), so that leakage of charge accumulated in the capacitor 58 and charge accumulated in the capacitor 59 can be prevented when the OS transistor is turned off.

In this specification and the like, a metal oxide means an oxide of metal in a broad sense. Metal oxides are classified into an oxide insulator, an oxide conductor (including a transparent oxide conductor), an oxide semiconductor (also simply referred to as an OS), and the like. For example, a metal oxide used in an active layer of a transistor is called an oxide semiconductor in some cases. That is, in the case where a metal oxide has at least one of amplifying, rectifying, and switching effects, the metal oxide can be referred to as a metal oxide semiconductor (OS, for short). In addition, an OS FET is a transistor including a metal oxide or an oxide semiconductor.

In this specification and the like, a metal oxide including nitrogen is also called a metal oxide in some cases. Moreover, a metal oxide including nitrogen may be called a metal oxynitride.

In this specification and the like, "c-axis aligned crystal (CAAC)" or "cloud-aligned composite (CAC)" may be stated. CAAC refers to an example of a crystal structure, and CAC refers to an example of a function or a material composition.

In this specification and the like, a CAC-OS or a CAC metal oxide has a conducting function in a part of the material and has an insulating function in another part of the material; as a whole, the CAC-OS or the CAC metal oxide has a function of a semiconductor. In the case where the CAC-OS or the CAC metal oxide is used in an active layer of a transistor, the conducting function is to allow electrons (or holes) serving as carriers to flow, and the insulating function is to not allow electrons serving as carriers to flow. By the complementary action of the conducting function and the insulating function, the CAC-OS or the CAC metal oxide can have a switching function (on/off function). In the CAC-OS or CAC metal oxide, separation of the functions can maximize each function.

In this specification and the like, the CAC-OS or the CAC metal oxide includes conductive regions and insulating regions. The conductive regions have the above-described conducting function, and the insulating regions have the above-described insulating function. In some cases, the conductive regions and the insulating regions in the material are separated at the nanoparticle level. In some cases, the conductive regions and the insulating regions are unevenly distributed in the material. The conductive regions are observed to be coupled in a cloud-like manner with their boundaries blurred, in some cases.

Furthermore, in the CAC-OS or the CAC metal oxide, the conductive regions and the insulating regions each have a size of more than or equal to 0.5 nm and less than or equal to 10 nm, preferably more than or equal to 0.5 nm and less than or equal to 3 nm and are dispersed in the material, in some cases.

The CAC-OS or the CAC metal oxide includes components having different bandgaps. For example, the CAC-OS or the CAC metal oxide includes a component having a wide gap due to the insulating region and a component having a narrow gap due to the conductive region. In the case of such a composition, carriers mainly flow in the component having a narrow gap. The component having a narrow gap complements the component having a wide gap, and carriers also flow in the component having a wide gap in conjunction with the component having a narrow gap. Therefore, in the case where the above-described CAC-OS or the CAC metal oxide is used in a channel region of a transistor, high current drive capability in the on state of the transistor, that is, high on-state current and high field-effect mobility, can be obtained.

In other words, a CAC-OS or CAC metal oxide can be called a matrix composite or a metal matrix composite.

When the buffer amplifier 40 is used as the buffer amplifier included in the display device 10, in particular, the buffer amplifier included in the D/A converter circuit 24, the offset voltage of the buffer amplifier 40 can be corrected. Here, the offset voltage means a voltage generated due to variation in characteristics of transistors included in the buffer amplifier 40, and when the offset voltage is generated, it becomes difficult for the buffer amplifier 40 to output an analog signal at an accurate voltage. Thus, particularly in the case where the number of gray levels expressed by one pixel 30 is large, e.g., in the case where a gray scale of 10 bits or more is expressed, it becomes difficult to accurately express the gray levels by the pixel 30. The offset voltage of the buffer amplifier 40 is corrected, whereby change of the voltage of the analog signal output from the buffer amplifier 40 due to the offset voltage can be suppressed. Thus, even in the case where the number of gray levels expressed by one pixel is large, the gray levels can be accurately expressed.

Next, an example of a display method of the display device 10 will be described with reference to FIG. 6, FIGS. 7A and 7B, and FIG. 8. Note that FIG. 6, FIGS. 7A and 7B, and FIG. 8 show an example of operations of the display device 10 in which the transistors 54 to 57 are n-channel transistors; however, the transistors 54 to 57 may each be a p-channel transistor or a CMOS transistor. FIG. 6, FIGS. 7A and 7B, and FIG. 8 can also be referred to for the operations of the display device 10 with such transistors when, for example, the magnitude relationships between the voltages are reversed as appropriate. For example, FIG. 6, FIGS. 7A and 7B, and FIG. 8 can be referred to for the operations of the display device 10 when signals (the signal CAN and the signal CANB) input to the gates of the transistors 54 to 57 are interchanged.

Figure 6:
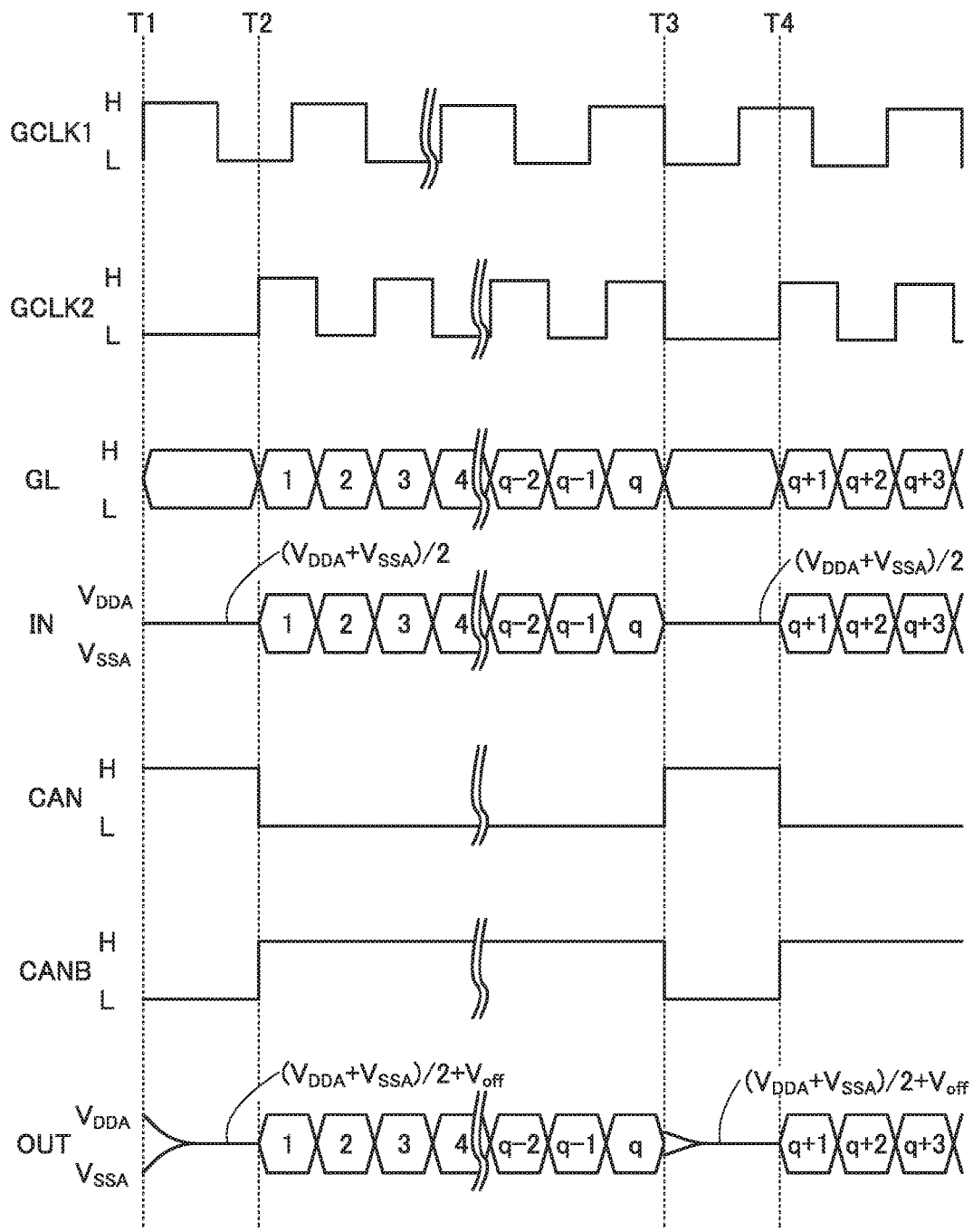
FIG. 6 is a timing chart showing an example of a display method.

FIG. 6 shows voltages of the signal GCLK1, the signal GCLK2, the gate line GL, the analog signal IN, the signal CAN, the signal CANB, and the analog signal OUT. In FIG. 6, H represents high voltage and L represents low voltage. Furthermore, the voltage of the analog signal IN is, for example, a voltage of a signal input to one of the non-inverting input terminal and the inverting input terminal of the buffer amplifier 40c. The voltage of the analog signal OUT is, for example, a voltage of a signal output from the output terminal of the buffer amplifier 40c.

In this specification and the like, the gate line $GL_{LC}$ and the gate line $GL_{EL}$ are collectively referred to as the gate line GL in some cases. For example, the expression "the voltage of the gate line GL is set to high voltage" means that the voltages of the gate line $GL_{LC}$ and the gate line $GL_{EL}$ are set to high voltage.

Here, numbers shown in a timing chart showing the voltage of the gate line GL each represent the row of the gate line GL subjected to voltage control. For example, in a period represented by "1", the voltage of a gate line GL[1] is controlled while the voltages of other gate lines GL are set to low voltages, for example. Thus, to the pixels 30 in the first row, grayscale voltages, that is, voltages which correspond to the gray levels expressed by the pixels 30 can be written.

Furthermore, numbers shown in a timing chart showing the voltage of the analog signal IN each indicate that the voltage of the analog signal IN in a period represented by any of the numbers is a voltage which corresponds to the gray level expressed by the pixel 30 in the row of the shown number. For example, in a period represented by "1", the voltage of the analog signal IN is a voltage which corresponds to the gray level expressed by the pixel 30 in the first row.

Furthermore, numbers shown in a timing chart showing the voltage of the analog signal OUT each indicate that the voltage of the analog signal OUT in a period represented by any of the numbers is a voltage which corresponds to the gray level expressed by the pixel 30 in the row of the shown number. For example, in a period represented by "1", the voltage of the analog signal OUT is a voltage which corresponds to the gray level expressed by the pixel 30 in the first row.

Figure 7A:
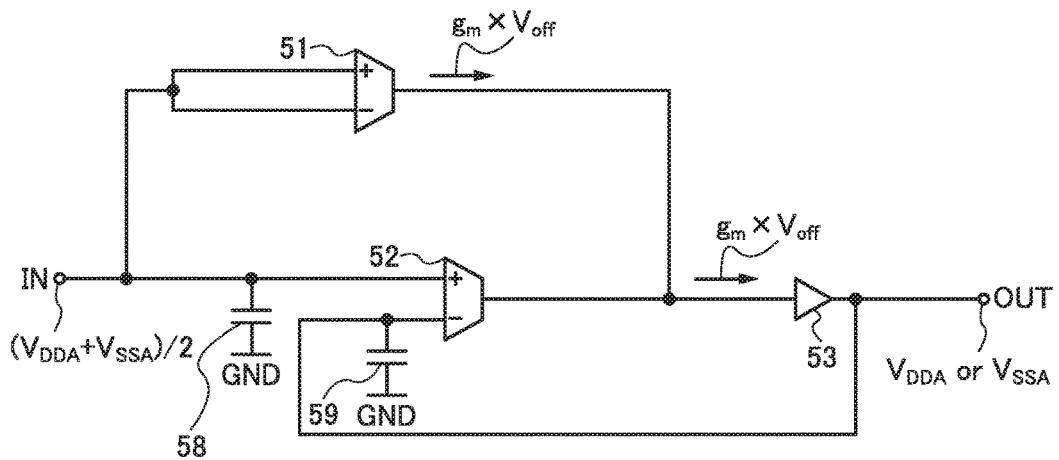
FIGS. 7A and 7B are each a circuit diagram showing an example of a display method.
Figure 7B:
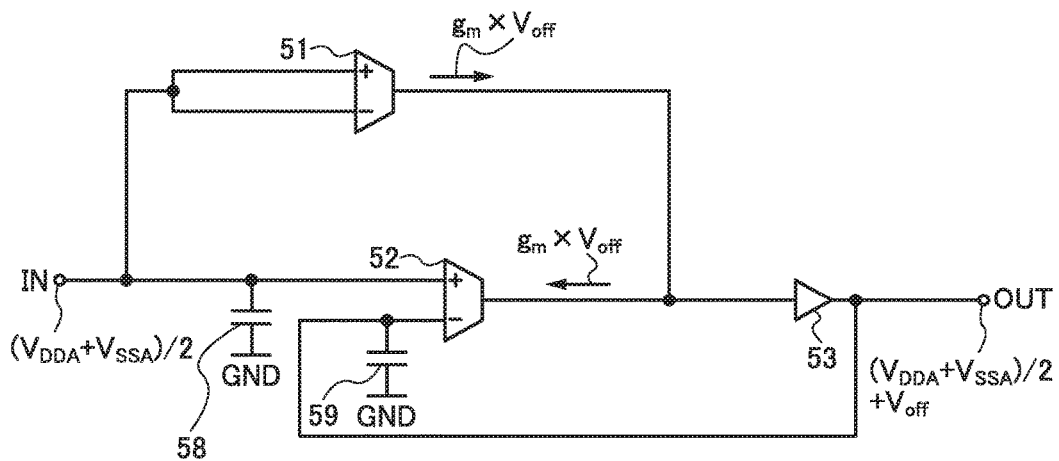

From Time T1 to Time T2, the offset voltage of the buffer amplifier 40 is corrected. In this specification and the like, a period during which the offset voltage of the buffer amplifier 40 is corrected is referred to as a correction period. Furthermore, in this specification and the like, the correction of the offset voltage of the buffer amplifier 40 is referred to as a first step in some cases. FIG. 7A is a circuit diagram showing the connection relationship between elements included in the buffer amplifier 40, voltages of the analog signal IN and the analog signal OUT, and current flowing through the buffer amplifier 40 at the time immediately after the start of the correction period such as at Time T1. FIG. 7B is a circuit diagram showing the connection relationship between the elements included in the buffer amplifier 40, voltages of the analog signal IN and the analog signal OUT, and current flowing through the buffer amplifier 40 at the end of the correction period such as at Time T2. Note that in the correction period, the clock signal GCLK2 can be at a constant voltage, for example, at low voltage.

At Time T1, the voltage of the signal CAN is set to high voltage and the voltage of the signal CANB is set to low voltage. As a result, the analog signal IN is input to, in addition to one of the non-inverting input terminal and the inverting input terminal of the transconductance amplifier 51, the other of the non-inverting input terminal and the inverting input terminal of the transconductance amplifier 51 and one of the non-inverting input terminal and the inverting input terminal of the transconductance amplifier 52. In addition, the analog signal OUT is input to the other of the non-inverting input terminal and the inverting input terminal of the transconductance amplifier 52.

Here, the voltage of the analog signal IN is set to $(V_{DDA}+V_{SSA})/2$, for example. The voltage $V_{DDA}$ and the voltage $V_{SSA}$ are power supply voltages of the transconductance amplifier 51. Note that the voltage $V_{DDA}$ is higher than the voltage $V_{SSA}$. For example, the voltage $V_{DDA}$ can be high voltage and the voltage $V_{SSA}$ can be low voltage. As the voltage $V_{SSA}$, a ground voltage can be used, for example.

When the same voltage is input to the non-inverting input terminal and the inverting input terminal of the transconductance amplifier 51, ideally, no current flows to the output terminal of the transconductance amplifier 51. However, current "$g_m \times V_{off}$" is actually generated owing to the variation in characteristics of the transistors included in the transconductance amplifier 51. Here, $g_m$ denotes transconductance of the transconductance amplifier 51 and $V_{off}$ denotes the offset voltage of the buffer amplifier 40.

The current "$g_m \times V_{off}$" output from the output terminal of the transconductance amplifier 51 is converted into voltage by the buffer 53. Here, the offset voltage $V_{off}$ is amplified inside the buffer amplifier 40; thus, immediately after the start of the correction period, the voltage of the analog signal OUT is, for example, a voltage $V_{DDA}$, which is a maximum value of a voltage which can be output, or a voltage $V_{SSA}$, which is a minimum value of a voltage which can be output.

In contrast, the analog signal IN is input to one of the non-inverting input terminal and the inverting input terminal of the transconductance amplifier 52 and the analog signal OUT is input to the other of the non-inverting input terminal and the inverting input terminal of the transconductance amplifier 52. Thus, feedback control is performed and the voltage of the analog signal OUT approaches the voltage "$(V_{DDA}+V_{SSA})/2+V_{off}$" as shown in FIG. 6. When the voltage of the analog signal OUT becomes the voltage "$(V_{DDA}+V_{SSA})/2+V_{off}$", a current flowing to the input terminal of the buffer 53 becomes 0.

At Time T2, the voltage of the signal CAN is set to low voltage and the voltage of the signal CANB is set to high voltage. Thus, data for correcting the offset voltage of the buffer amplifier 40 is held in the capacitor 58 and the capacitor 59. The above is an example of the operation of the display device 10 in the correction period.

Figure 8:
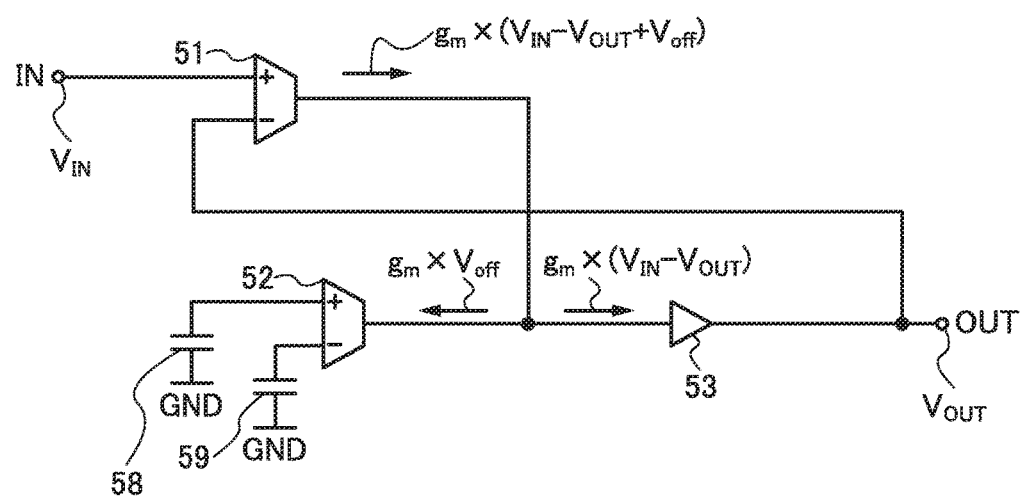
FIG. 8 is a circuit diagram showing an example of a display method.

From Time T2 to Time T3, the analog signal OUT, specifically grayscale voltages, are written to the pixels 30 from the first row to the q-th row (q is an integer greater than or equal to 2 and less than or equal to x) in synchronization with the clock signal GCLK2. In this specification and the like, a period during which grayscale voltages are written to the pixels 30 is referred to as a grayscale voltage writing period. Furthermore, in this specification and the like, the writing operation of the grayscale voltages to the pixels 30 is referred to as a second step in some cases. FIG. 8 is a circuit diagram showing the connection relationship between the elements included in the buffer amplifier 40, voltage of the analog signal IN, and current flowing through the buffer amplifier 40 in the grayscale voltage writing period such as a period from Time T2 to Time T3.

As described above, at Time T2, the voltage of the signal CAN is low voltage and the voltage of the signal CANB is high voltage. Thus, the analog signal IN is not input to the other of the non-inverting input terminal and the inverting input terminal of the transconductance amplifier 51, the non-inverting input terminal of the transconductance amplifier 52, or the inverting input terminal of the transconductance amplifier 52. Thus, a voltage which corresponds to data held in the capacitor 58, which is data for correcting the offset voltage of the buffer amplifier 40, is input to one of the non-inverting input terminal and the inverting input terminal of the transconductance amplifier 52. In addition, a voltage which corresponds to data held in the capacitor 59, which is data for correcting the offset voltage of the buffer amplifier 40, is input to the other of the non-inverting input terminal and the inverting input terminal of the transconductance amplifier 52. In contrast, the analog signal OUT is input to the other of the non-inverting input terminal and the inverting input terminal of the transconductance amplifier 51.

Here, when the voltage of the analog signal IN is referred to as $V_{IN}$ and the voltage of the analog signal OUT is referred to as $V_{OUT}$, current "$g_m \times (V_{IN}-V_{OUT}+V_{off})$" is generated from the output terminal of the transconductance amplifier 51. However, the offset voltage of the buffer amplifier 40 is corrected by the transconductance amplifier 52, whereby a current flowing to the input terminal of the buffer 53 becomes "$g_m \times (V_{IN}-V_{OUT})$". Thus, the voltage of the analog signal OUT can be a voltage not containing the offset voltage $V_{off}$. Note that the voltage $V_{OUT}$ can be equal to the voltage $V_{IN}$, for example. Alternatively, the voltage $V_{OUT}$ can be substantially equal to the voltage $V_{IN}$, for example.

In this manner, the analog signal OUT, specifically grayscale voltages, can be written to the pixels 30 from the first row to the q-th row. The above is an example of the operation of the display device 10 in the grayscale voltage writing period.

A period from Time T3 to Time T4 is a correction period, and the operation of the display device 10 can be similar to that in the period from Time T1 to Time T2. Furthermore, a period after Time T4 is a grayscale voltage writing period, and in the period, the analog signal OUT, specifically grayscale voltages, can be written to the pixels 30 from the q+1-th row to 2q-th row. That is, the display device 10 can be operated by repeating the correction period and the grayscale voltage writing period.

As described above, the grayscale voltages are written to the pixels 30 in two rows or more after the offset voltage of the buffer amplifier 40 is corrected, whereby even if one period for correcting the offset voltage is lengthened, the display device 10 can be operated at high speed as compared with the case where the offset voltage of the buffer amplifier 40 is corrected every time the grayscale voltage is written to the pixels 30 in one row. Thus, the pixels 30 are arranged with high density to display a high-resolution image. Furthermore, the frame frequency of the display device 10 can be increased.

In addition, as described above, the digital data DATA is written to the memory circuit 28 in synchronization with the clock signal GCLK1. Then, in the grayscale voltage writing period, the digital data DATA is read out from the memory circuit 28 in synchronization with the clock signal GCLK2 and converted into analog data by the D/A converter circuit 24, whereby the grayscale voltage is written to the pixel 30. As shown in FIG. 6, the frequency of the clock signal GCLK1 is constant in both of the correction period and the grayscale voltage writing period. In contrast, the frequency of the clock signal GCLK2 is 0 in the correction period and higher than the frequency of the clock signal GCLK1 in the grayscale voltage writing period. Therefore, the digital data DATA input to the source driver circuit 14 at regular intervals can be converted into analog data and the grayscale voltage can be written to the pixel 30 only in the grayscale voltage writing period. Note that "the half period of the clock signal GCLK1×q" is preferably equal to "the half period of the clock signal GCLK2×q+the correction period". For example, when q is set to 120 and the correction period is set to 2.4 µs, the half period of the clock signal GCLK1 can be 1.92 µs and the half period of the clock signal GCLK2 can be 1.90 µs.

In the case where the offset voltage of the buffer amplifier 40 is corrected every time the grayscale voltages are written to the pixels 30 in one row (in the case where q is 1), correction of the offset voltage of the buffer amplifier 40 and writing of the grayscale voltages to the pixels 30 in one row should be performed in the half period of the clock signal GCLK1. For example, in the case where the half period of the clock signal GCLK1 is 1.92 µs, both the correction of the offset voltage of the buffer amplifier 40 and writing of the grayscale voltages to the pixels 30 in one row should be performed in 1.92 µs. Thus, in some cases, it cannot take an enough time to correct the offset voltage of the buffer amplifier 40. For example, in the case where the time for writing the grayscale voltages to the pixels 30 in one row is 1.90 µs, the offset voltage of the buffer amplifier 40 should be corrected in 0.02 µs. In contrast, in the case where the offset voltage of the buffer amplifier 40 is corrected every time the grayscale voltages are written to the pixels 30 in two rows or more, e.g., 120 rows (in the case where q is 120), as described above, the correction period can be as long as 2.4 µs even after 1.90 µs of the grayscale voltage writing period. Thus, the display device 10 can be operated at high speed with the sufficiently long correction period. Accordingly, the pixels 30 can be arranged with high density to display a high-resolution image. Furthermore, the frame frequency of the display device 10 can be increased.

Note that the value of q can be determined by the capacitance of the capacitor 58 and the capacitance of the capacitor 59. For example, in the case where the value of q is small, the capacitance of the capacitor 58 and the capacitance of the capacitor 59 can be small; thus, the area occupied by one pixel 30 can be reduced. Accordingly, the size of the display device 10 can be small and the cost can be reduced. Alternatively, in the case where the capacitance of the capacitor 58 and the capacitance of the capacitor 59 are large, the value of q can be large. In this case, the frequency of correction of the offset voltage of the buffer amplifier 40 can be reduced, and the display device 10 can be operated at high speed even if one period for correcting the offset voltage is lengthened. Thus, the pixels 30 can be arranged with high density to display a high-resolution image. In addition, the frame frequency (e.g., the frequency of the clock signal GCLK1) of the display device 10 can be increased.

Note that transistors each having an extremely low off-state current, such as OS transistors, are used as the transistor 55 and the transistor 56, whereby even if the capacitance of the capacitor 58 and the capacitance of the capacitor 59 are small, the value of q can be large. Thus, the small-sized display device 10 can operate at high speed.

When the transistor 55 is brought into a non-conduction state from a conduction state, the amount of electric charge accumulated in the capacitor 58 is changed by charge injection. Furthermore, when the transistor 56 is brought into a non-conduction state from a conduction state, the amount of electric charge accumulated in the capacitor 59 is changed by charge injection. From the above reason, even if the offset voltage of the buffer amplifier 40 is corrected every time the grayscale voltages are written to the pixels 30 in one row, the capacitance of the capacitor 58 and the capacitor 59 is required to be higher than or equal to a certain value. Thus, for example, the capacitance of the capacitor 58 and the capacitance of the capacitor 59 when the offset voltage of the buffer amplifier 40 is corrected every time the grayscale voltages are written to the pixels 30 in q rows are smaller than q times the capacitance of the capacitor 58 and the capacitance of the capacitor 59 when the offset voltage of the buffer amplifier 40 is corrected every time the grayscale voltages are written to the pixels 30 in one row, respectively.

Figure 9:
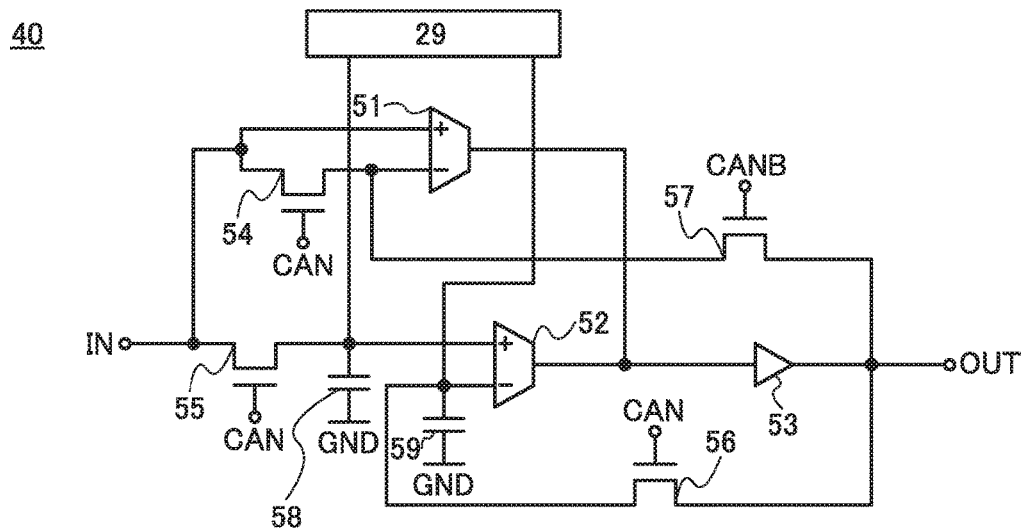
FIG. 9 is a circuit diagram illustrating a structure example of a display device.

In the operation of the display device 10, the value of q may be fixed or changed. For example, the grayscale voltages are written to the pixels 30 in r rows (r is an integer greater than or equal to 1 and less than or equal to x), and then the amount of charge held in the capacitor 58 and the amount of charge held in the capacitor 59 are detected. FIG. 9 is a circuit diagram illustrating a structure example of the buffer amplifier 40 provided with a detector 29 which has a function of detecting the amount of charge held in the capacitor 58 and the amount of charge held in the capacitor 59. The detector 29 may be electrically connected to one terminal of the capacitor 58 and one terminal of the capacitor 59, for example.

When the detector 29 detects that at least one of the amount of charge held in the capacitor 58 and the amount of charge held in the capacitor 59 is less than a specified value, the offset voltage of the buffer amplifier 40 is corrected. This means that the offset voltage of the buffer amplifier 40 is corrected when at least one of a difference between the amount of charge held in the capacitor 58 immediately after the correction period and that after the grayscale voltages are written to the pixels 30 and a difference between the amount of charge held in the capacitor 59 immediately after the correction period and that after the grayscale voltages are written to the pixels 30 is greater than the specified value, for example. This also means that the offset voltage of the buffer amplifier 40 is corrected when at least one of the ratio of the amount of charge held in the capacitor 58 after the grayscale voltages are written to the pixels 30 to the amount of charge held in the capacitor 58 immediately after the correction period and the ratio of the amount of charge held in the capacitor 59 after the grayscale voltages are written to the pixels 30 to the amount of charge held in the capacitor 59 immediately after the correction period is less than the specified value, for example.

When the amounts of charge held in the capacitors 58 and 59 are kept higher than the specific value, the grayscale voltages will continue to be written to the pixels 30. As described above, the detector 29 is provided for the buffer amplifier 40 and the value of q is changed, whereby the frequency of correction of the offset voltage of the buffer amplifier 40 can be reduced as much as possible while the accuracy of the grayscale voltages written to the pixels 30 is kept.

Note that the detector 29 can detect the amount of charge held in the capacitor 58 by measuring the potential of one terminal of the capacitor 58, for example. In addition, the detector 29 can detect the amount of charge held in the capacitor 59 by measuring the potential of one terminal of the capacitor 59, for example.

In the structure in which the buffer amplifier 40 is provided with the detector 29, when the grayscale voltage writing period is changed to the correction period, the clock signal GCLK1 and the clock signal GCLK2 are preferably synchronized by resetting the clock signal GCLK1, for example.

Figure 10:
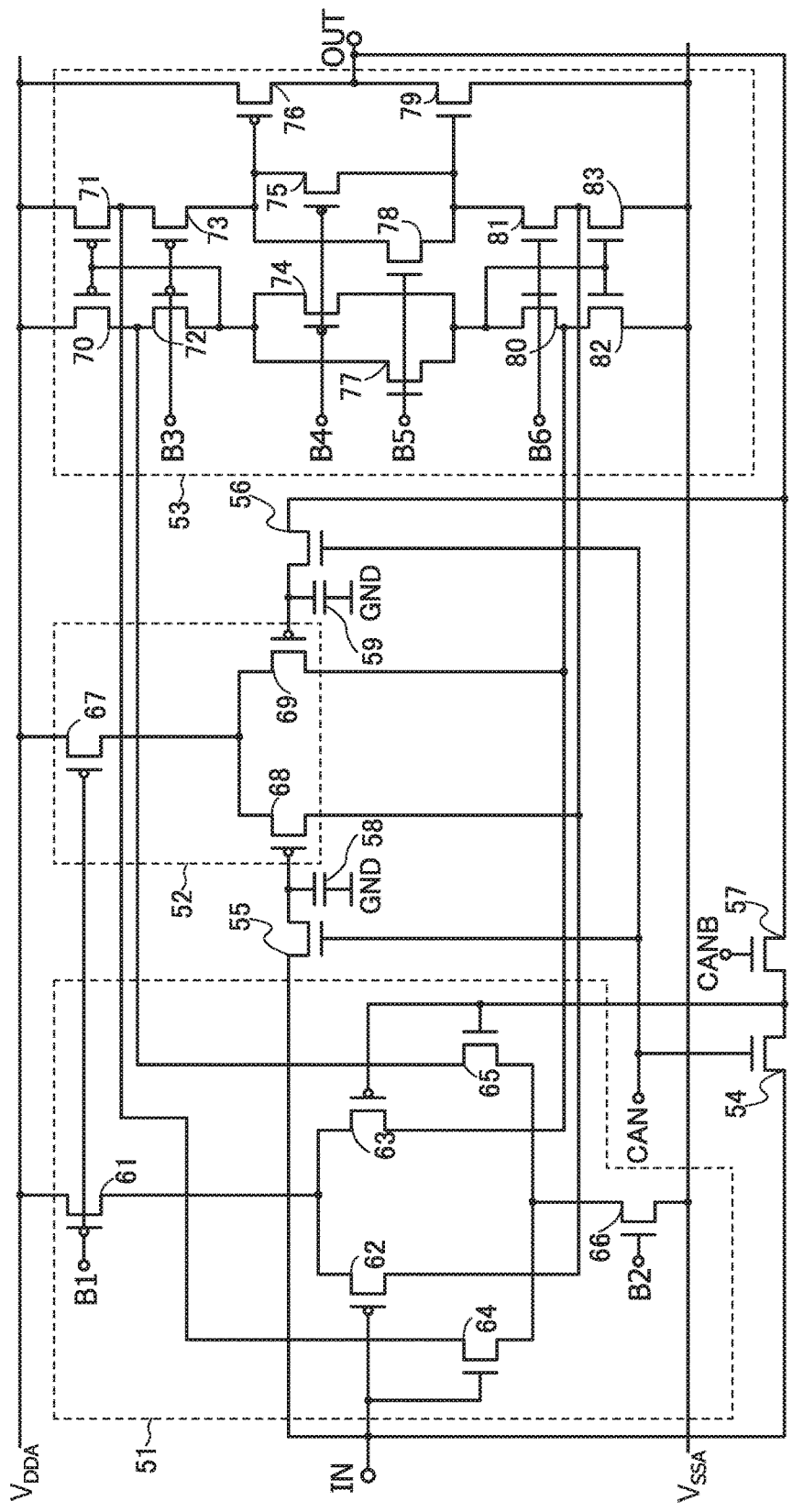
FIG. 10 is a circuit diagram illustrating a structure example of a display device.

Next, an example of a detailed circuit configuration of the buffer amplifier 40 is described with reference to a circuit diagram illustrated in FIG. 10.

As described above, the buffer amplifier 40 includes the transconductance amplifier 51, the transconductance amplifier 52, the buffer 53, the transistors 54 to 57, the capacitor 58, and the capacitor 59.

The transconductance amplifier 51 includes transistors 61 to 66. The transconductance amplifier 52 includes transistors 67 to 69. The buffer 53 includes transistors 70 to 83.

As the transistor 54, the transistor 57, and the transistors 61 to 83, transistors each having high field-effect mobility, for example, transistors each including single crystal silicon in a semiconductor layer, are preferably used. In contrast, as described above, as the transistors 55 and 56, transistors each having an extremely low off-state current, such as OS transistors, are preferably used.

The analog signal IN can be input to a gate of the transistor 62 and a gate of the transistor 64. A bias signal B1 can be input to a gate of the transistor 61 and a gate of the transistor 67. A bias signal B2 can be input to a gate of the transistor 66. A bias signal B3 can be input to a gate of the transistor 72 and a gate of the transistor 73. A bias signal B4 can be input to a gate of the transistor 74 and a gate of the transistor 75. A bias signal B5 can be input to a gate of the transistor 77 and a gate of the transistor 78. A bias signal B6 can be input to a gate of the transistor 80 and a gate of the transistor 81. The analog signal OUT can be output from one of a source and a drain of the transistor 76 and one of a source and a drain of the transistor 79. In addition, as described above, the signal CAN can be input to the gates of the transistors 54 to 56, and the signal CANB can be input to the gate of the transistor 57.

Figure 11:
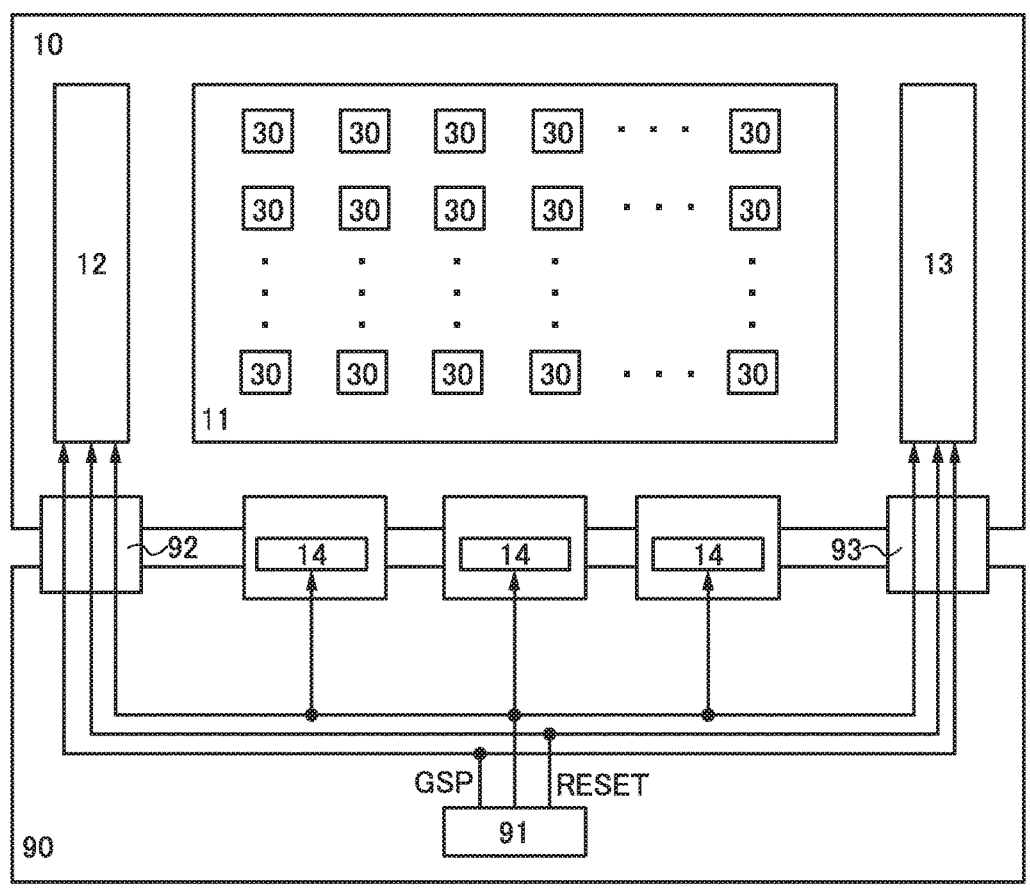
FIG. 11 is a block diagram illustrating a structure example of a display device.

The display device 10 with the structure in FIG. 1 can be used in a television set, for example. FIG. 11 is a block diagram showing a structure example of a television set in which the display device 10 is used.

In the television set with the structure in FIG. 11, a timing controller 91 is formed over a printed board 90. The timing controller 91 is electrically connected to the gate driver circuit 12 through a flexible printed circuit (FPC) 92 and the timing controller 91 is electrically connected to the gate driver circuit 13 through an FPC 93. In addition, the source driver circuit 14 can be mounted by a chip on film (COF) method or the like. Note that a plurality of source driver circuits 14 can be provided.

The timing controller 91 has a function of generating a gate start pulse signal GSP, a reset signal RESET, and the like, and outputting them to the gate driver circuit 12 and the gate driver circuit 13. Furthermore, the timing controller 91 has a function of controlling the operations of the gate driver circuit 12, the gate driver circuit 13, and the source driver circuit 14.

Figure 12:
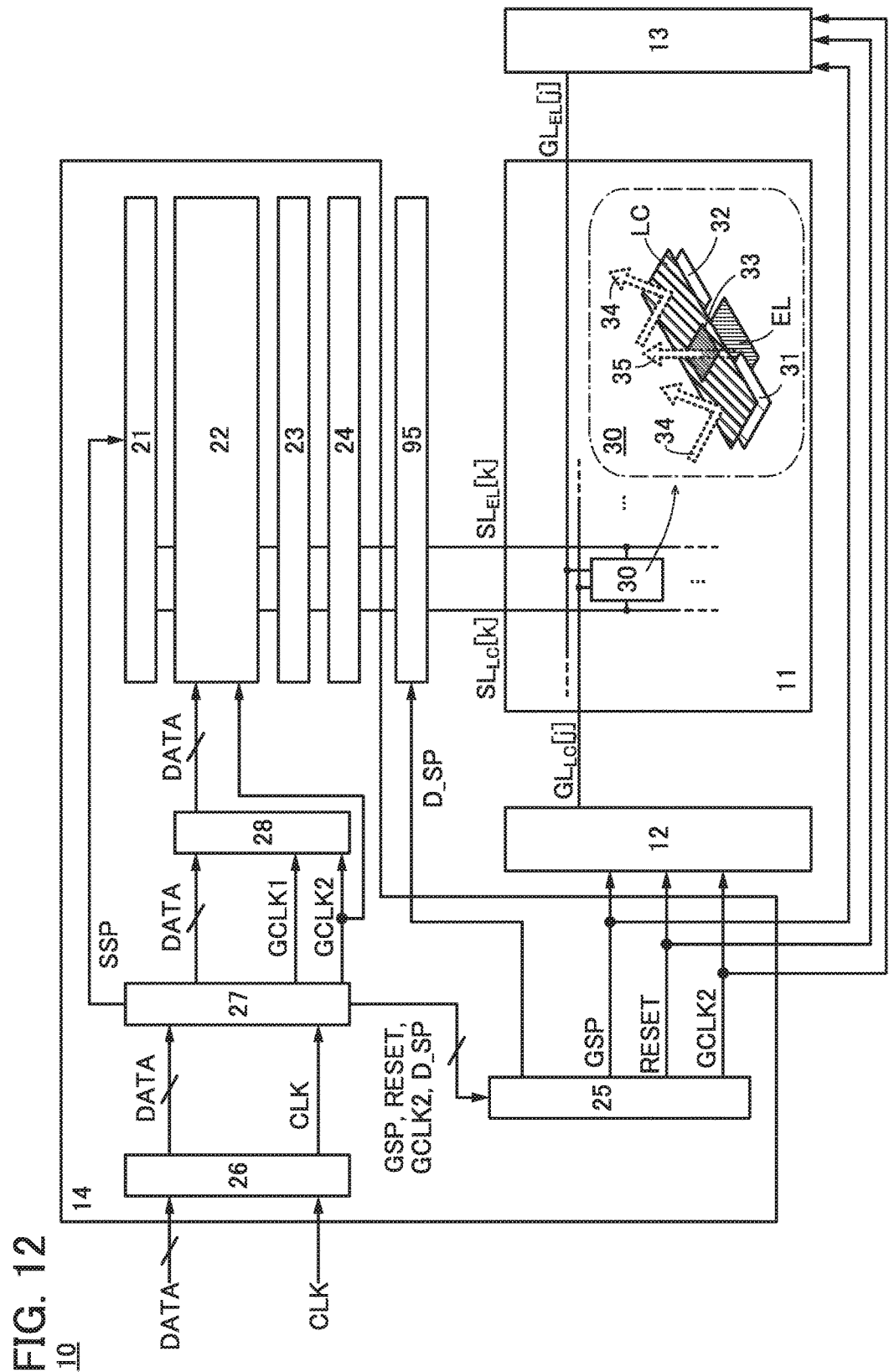
FIG. 12 is a block diagram illustrating a structure example of a display device.

FIG. 12 is a block diagram showing a modification example of the display device 10 with the structure in FIG. 1. The display device 10 with a structure in FIG. 12 is the same as the display device 10 with the structure in FIG. 1 except that a demultiplexer 95 is included and a level shifter circuit 25 is provided in the source driver circuit 14. In the display device 10 with the structure in FIG. 12, the source driver circuit 14 is electrically connected to the pixels 30 through the demultiplexer 95 using the signal lines SL.

In this specification and the like, the signal line $SL_{LC}$ and the signal line $SL_{EL}$ are collectively referred to as the signal line SL in some cases. For example, the expression "connection using the signal line SL" means connection using the signal line $SL_{LC}$ and the signal line $SL_{EL}$.

The control circuit 27 in the display device 10 with the structure in FIG. 12 has a function of generating, in addition to the clock signal GCLK1 and the clock signal GCLK2, the gate start pulse signal GSP, the reset signal RESET, a demultiplexer control signal D_SP, and the like. The gate start pulse signal GSP, the reset signal RESET, the clock signal GCLK2, the demultiplexer control signal D_SP, and the like, which are generated by the control circuit 27, are output to the level shifter circuit 25 to be amplified in voltage. After that, the gate start pulse signal GSP, the reset signal RESET, the clock signal GCLK2, and the like are output to the gate driver circuit 12 and the gate driver circuit 13, and the demultiplexer control signal D_SP and the like are output to the demultiplexer 95.

Figure 13:
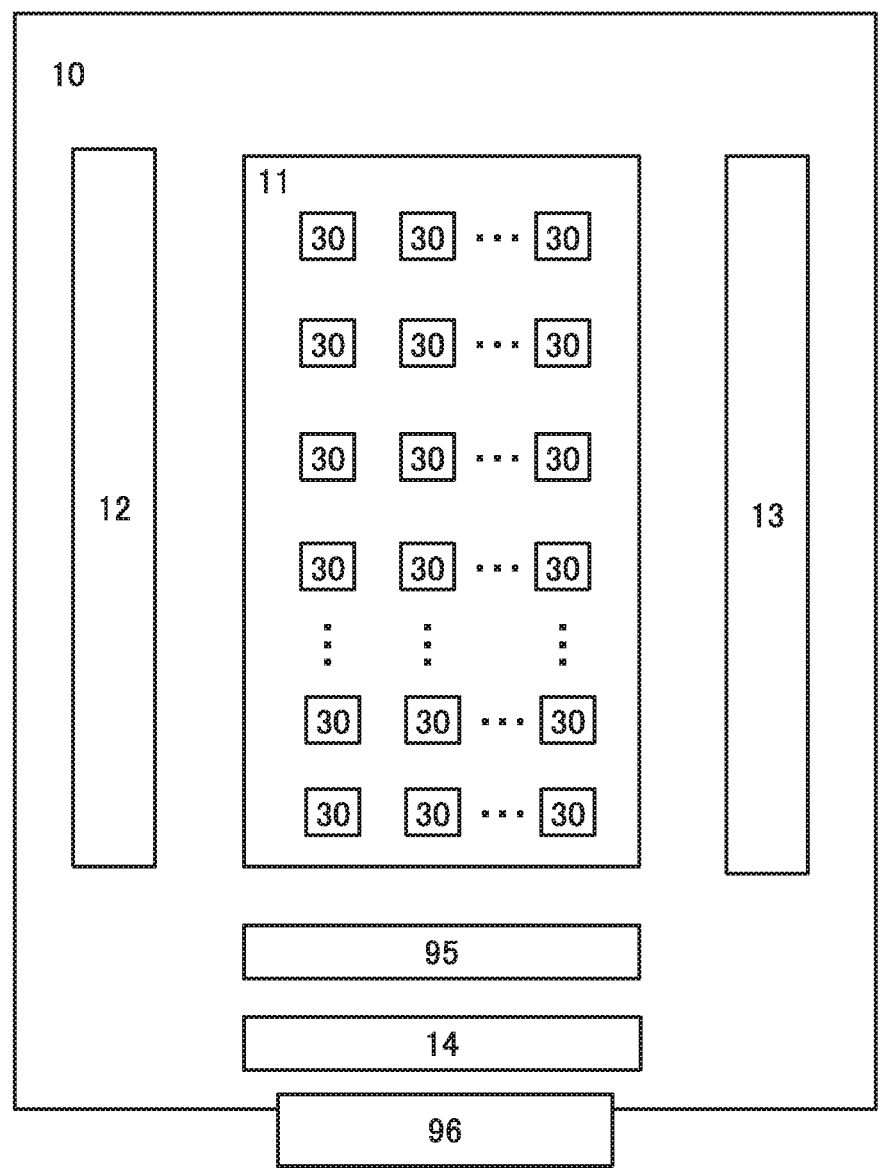
FIG. 13 is a block diagram illustrating a structure example of a display device.

The display device 10 with the structure in FIG. 12 can be used in a portable information terminal, for example. As a portable information terminal, a smartphone can be given, for example. FIG. 13 is a block diagram showing a structure example of a portable information terminal in which the display device 10 is used. In the portable information terminal with the structure in FIG. 13, an FPC 96 is provided for the display device 10.

In the portable information terminal with the structure in FIG. 13, since the control circuit 27 included in the source driver circuit 14 generates the gate start pulse signal GSP, the reset signal RESET, the demultiplexer control signal D_SP, and the like, the timing controller 91 is not necessarily provided. Furthermore, as described above, the source driver circuit 14 is connected to the pixels 30 through the demultiplexer 95 using the signal lines SL (not illustrated). When the demultiplexer 95 is provided, the number of signal lines SL can be reduced; thus, the distance between the source driver circuit 14 and the display portion 11 can be made small. In this manner, the size of the display device 10 can be decreased and the bezel of the portable information terminal can be narrowed.

Figure 14:
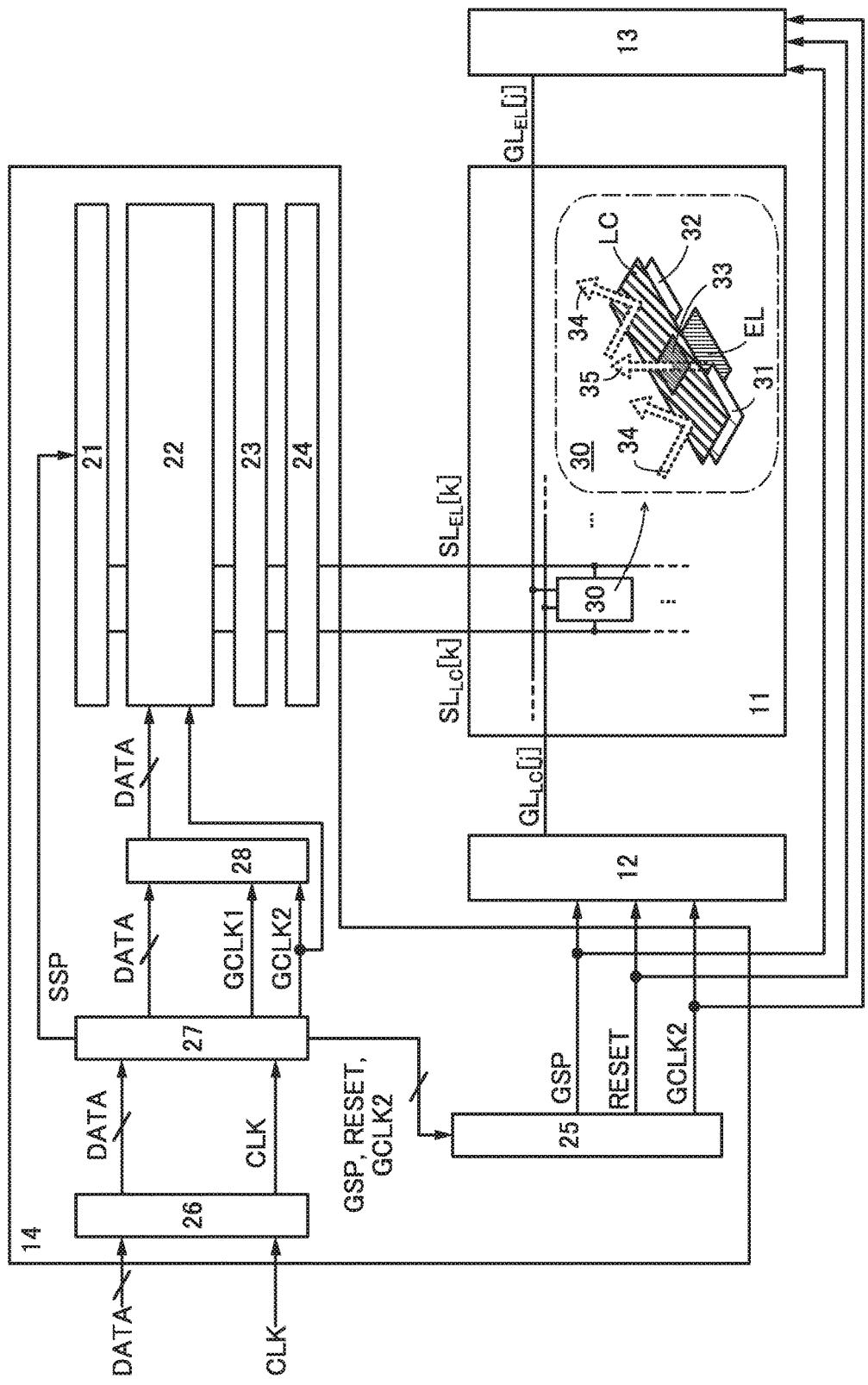
FIG. 14 is a block diagram illustrating a structure example of a display device.

FIG. 14 is a block diagram showing a modification example of the display device 10 with the structure in FIG. 12. The display device 10 with a structure in FIG. 14 is the same as the display device 10 with the structure in FIG. 12 except that the demultiplexer 95 is not included.

Figure 15:
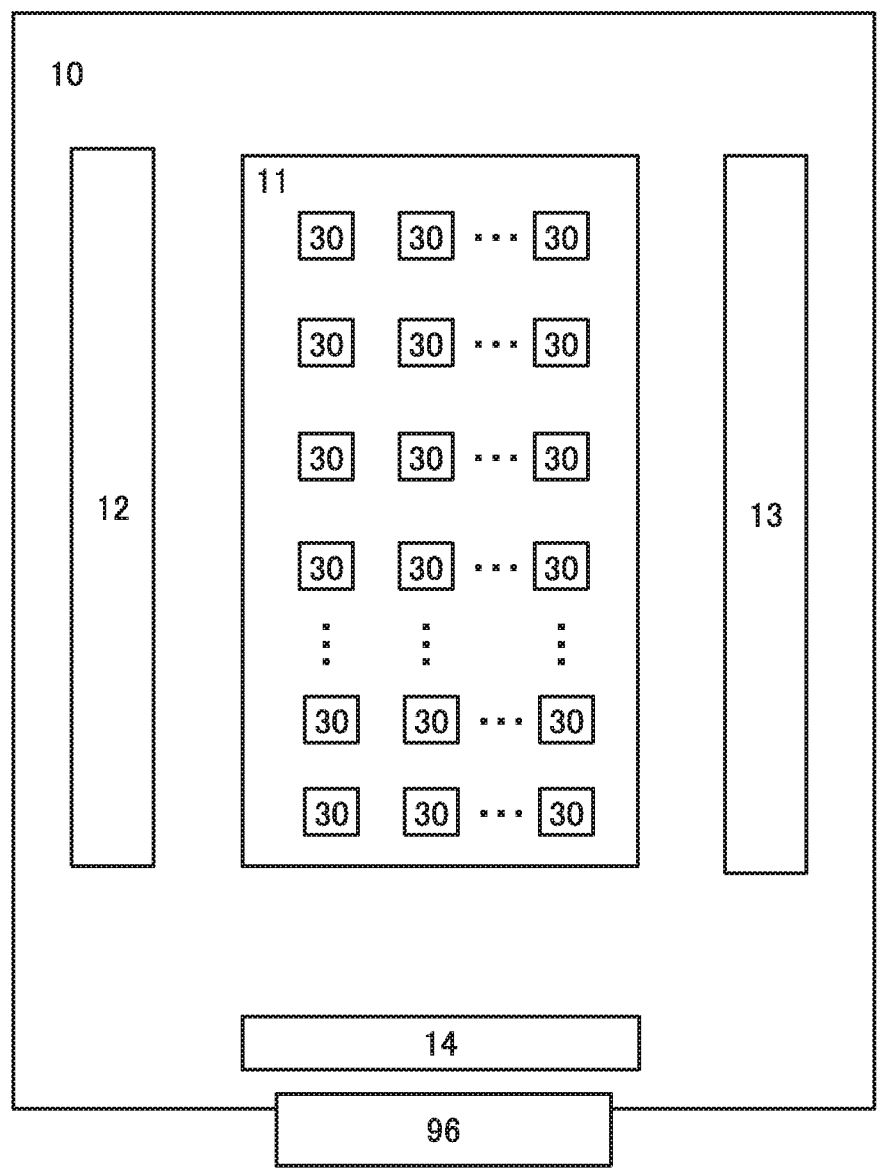
FIG. 15 is a block diagram illustrating a structure example of a display device.

FIG. 15 is a block diagram showing a modification example of the portable information terminal in FIG. 13. The source driver circuit 14 can be directly connected to the pixels 30 using the signal lines SL (not illustrated). Thus, the portable information terminal can be operated at high speed.

Figure 16:
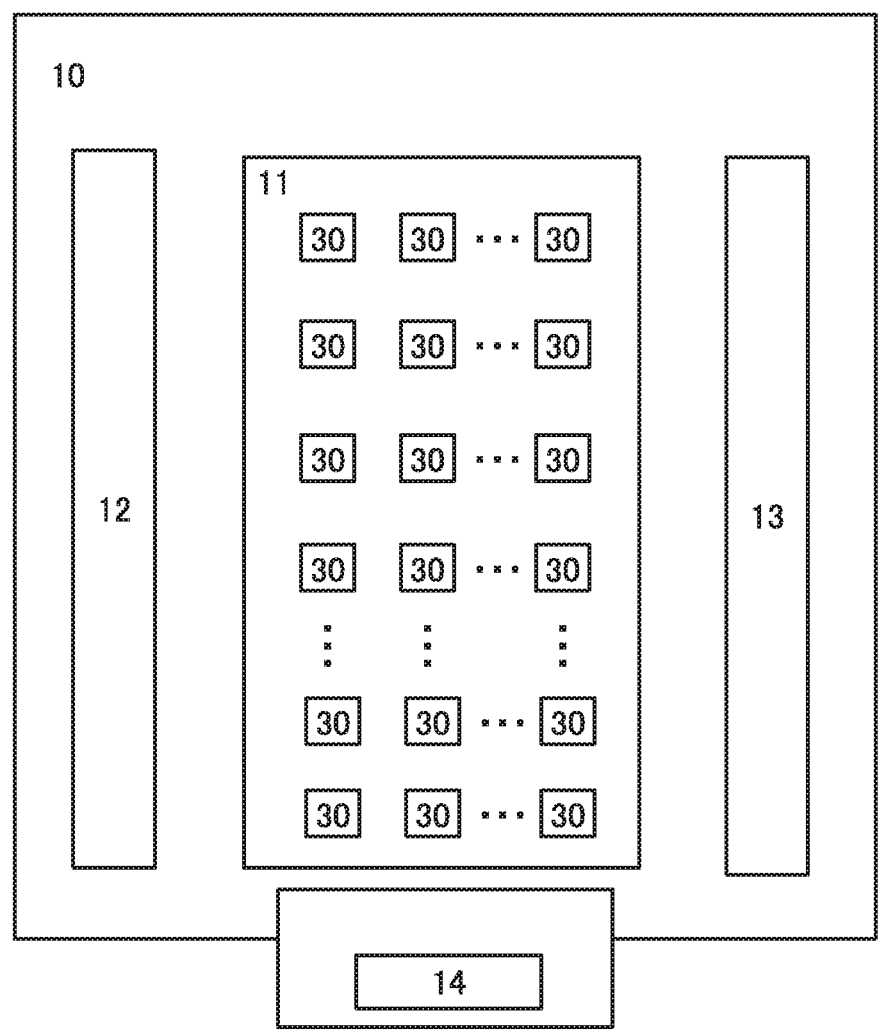
FIG. 16 is a block diagram illustrating a structure example of a display device.

FIG. 16 is a block diagram showing a modification example of the portable information terminal with the structure in FIG. 15. The display device 10 with the structure in FIG. 16 is the same as the portable information terminal with the structure in FIG. 15 except that the FPC 96 is not included and the source driver circuit 14 is mounted by the COF method or the like.

When the portable information terminal has the structure in FIG. 16, the bezel of the portable information terminal can be narrowed. Alternatively, the portable information terminal with the structure in FIG. 13 may have the structure in FIG. 16. The bezel of the portable information terminal can be narrowed also in this case.

At least part of this embodiment can be implemented in combination with any of the other embodiments and the other examples described in this specification as appropriate.

Embodiment 2

In this embodiment, a detailed structure of a pixel included in the display device of one embodiment of the present invention is described with reference to FIG. 17, FIG. 18, FIG. 19, FIGS. 20A to 20C, FIGS. 21A and 21B, FIG. 22, and FIGS. 23A to 23C.

Figure 17:
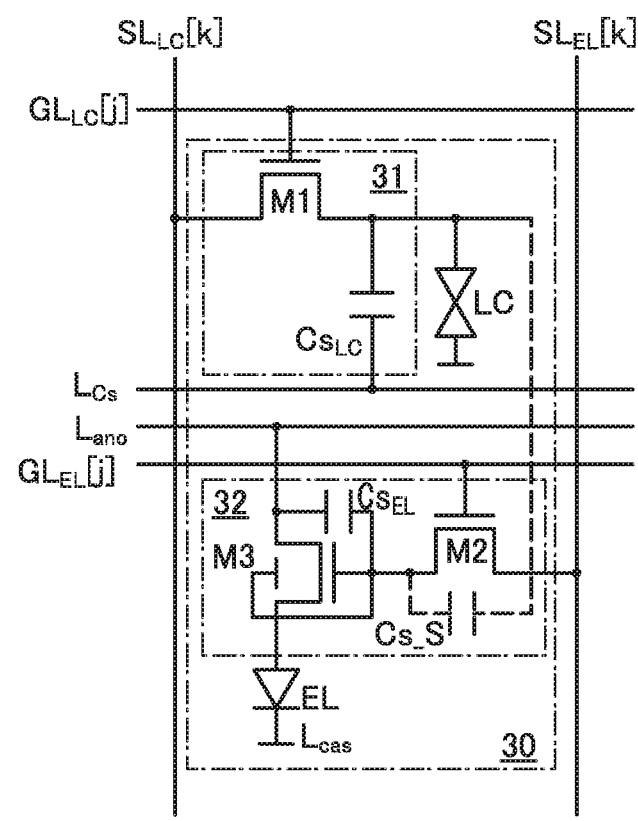
FIG. 17 is a circuit diagram illustrating a structure example of a display device.

FIG. 17 illustrates an example of a circuit diagram of the pixel 30. The pixel 30 includes, as described in FIG. 1, the pixel circuit 31, the pixel circuit 32, the liquid crystal element LC, and the light-emitting element EL.

In FIG. 17, the pixel circuit 31 includes the transistor M1 and the capacitor $Cs_{LC}$. The pixel circuit 32 includes transistors M2 and M3 and a capacitor $Cs_{EL}$. The components in the pixel 30 are connected to a gate line $GL_{LC}[l]$, a gate line $GL_{EL}[j]$, a signal line $SL_{LC}[k]$, a signal line $SL_{EL}[k]$, a capacitor line $L_{CS}$, a current supply line $L_{ano}$, and a common voltage line $L_{cas}$ as illustrated in FIG. 17.

The capacitor $Cs_{EL}$ is provided in order to retain a grayscale voltage for driving the light-emitting element EL in a gate of the transistor M3. This structure enables more accurate retention of the grayscale voltage for driving the light-emitting element EL.

Note that parasitic capacitance Cs_S is generated between the one terminal of the capacitor $Cs_{LC}$ and the one terminal of the capacitor $Cs_{EL}$.

Note that the transistor M3 includes a back gate, which increases the amount of current flowing through the transistor. A voltage applied to the back gate may be supplied from another wiring, in which case the threshold voltage of the transistor can be controlled.

By controlling the conduction state of the transistor M1, a grayscale voltage for driving the liquid crystal element LC is applied to the capacitor $Cs_{LC}$. By controlling the conduction state of the transistor M2, a grayscale voltage for driving the light-emitting element EL is applied to the gate of the transistor M3. The light-emitting element EL is driven when current flows between the current supply line $L_{ano}$ and the common voltage line $L_{cas}$ in accordance with the voltage of the gate of the transistor M3.

N-channel transistors can be used as the transistors M1 to M3. The n-channel transistors can be replaced with p-channel transistors by changing the magnitude relationship among voltages of the wirings. Silicon can be used as semiconductor materials of the transistors M1 to M3. As silicon, single crystal silicon, polysilicon, microcrystalline silicon, amorphous silicon, or the like can be used as appropriate.

Alternatively, a metal oxide can be used as the semiconductor materials of the transistors M1 to M3. In particular, when a metal oxide is used as the semiconductor material of the transistor M1, the transistor M1 can have an extremely low off-state current. Thus, the leakage of charge accumulated in the capacitor $Cs_{LC}$ can be reduced. Thus, in the case where there is no need to rewrite a displayed image, i.e., in the case of displaying a still image, a driver circuit can be temporarily stopped. This enables the power consumption of the display device 10 to be reduced.

For the transistors M1 to M3 included in the pixel 30, various types of transistors such as a bottom-gate transistor and a top-gate transistor can be used.

The transistors M1 to M3 included in the pixel 30 may include back gates. Voltages applied to the back gates may be supplied from a wiring different from the gate line $GL_{LC}[j]$ and the gate line $GL_{EL}[j]$. Only one transistor, for example, the transistor M3 may have a back gate. With such a structure, the threshold voltage of the transistor can be controlled or the amount of current flowing through the transistor can be increased.

The liquid crystal element can be driven by any of the following driving methods: an in-plane-switching (IPS) mode, a twisted nematic (TN) mode, a fringe field switching (FFS) mode, an axially symmetric aligned micro-cell (ASM) mode, an optically compensated birefringence (OCB) mode, a ferroelectric liquid crystal (FLC) mode, an antiferroelectric liquid crystal (AFLC) mode, and the like. In addition, the liquid crystal element can be driven by, for example, a vertical alignment (VA) mode such as a multi-domain vertical alignment (MVA) mode, a patterned vertical alignment (PVA) mode, an electrically controlled birefringence (ECB) mode, a continuous pinwheel alignment (CPA) mode, or an advanced super view (ASV) mode.

For the liquid crystal element, a liquid crystal material such as thermotropic liquid crystal, low-molecular liquid crystal, high-molecular liquid crystal, polymer dispersed liquid crystal, ferroelectric liquid crystal, or anti-ferroelectric liquid crystal can be used. Alternatively, a liquid crystal material that exhibits a cholesteric phase, a smectic phase, a cubic phase, a chiral nematic phase, an isotropic phase, or the like can be used. Alternatively, a liquid crystal material that exhibits a blue phase can be used.

Note that the light-emitting element can be an EL element such as an organic electroluminescence element or an inorganic electroluminescence element, a light-emitting diode, or the like. Alternatively, a quantum dot can be used.

A stack formed to emit white light can be used as the EL element. Specifically, it is possible to use a stack of a layer containing a light-emitting organic compound containing a fluorescent material that emits blue light, and a layer containing materials that are other than a fluorescent material and that emit green light and red light, or a layer containing a material that is other than a fluorescent material and that emits yellow light.

A quantum dot is a semiconductor nanocrystal with a size of several nanometers and contains approximately $1 \times 10^3$ to $1 \times 10^6$ atoms. Since energy shift of quantum dots depends on their size, quantum dots made of the same substance emit light with different wavelengths depending on their size; thus, emission wavelengths can be easily adjusted by changing the size of quantum dots.

Since a quantum dot has an emission spectrum with a narrow peak, emission with high color purity can be obtained. In addition, a quantum dot is said to have a theoretical external quantum efficiency of approximately 100%, which far exceeds that of a fluorescent organic compound, i.e., 25%, and is comparable to that of a phosphorescent organic compound. Therefore, a quantum dot can be used as a light-emitting material to obtain a light-emitting element having high light-emitting efficiency. Furthermore, since a quantum dot which is an inorganic compound has high inherent stability, a light-emitting element which is favorable also in terms of lifetime can be obtained.

Examples of a material of a quantum dot include a Group 14 element in the periodic table, a Group 15 element in the periodic table, a Group 16 element in the periodic table, a compound of a plurality of Group 14 elements in the periodic table, a compound of an element belonging to any of Groups 4 to 14 in the periodic table and a Group 16 element in the periodic table, a compound of a Group 2 element in the periodic table and a Group 16 element in the periodic table, a compound of a Group 13 element in the periodic table and a Group 15 element in the periodic table, a compound of a Group 13 element in the periodic table and a Group 17 element in the periodic table, a compound of a Group 14 element in the periodic table and a Group 15 element in the periodic table, a compound of a Group 11 element in the periodic table and a Group 17 element in the periodic table, iron oxides, titanium oxides, spinel chalcogenides, and semiconductor clusters.

Specific examples include, but are not limited to, cadmium selenide; cadmium sulfide; cadmium telluride; zinc selenide; zinc oxide; zinc sulfide; zinc telluride; mercury sulfide; mercury selenide; mercury telluride; indium arsenide; indium phosphide; gallium arsenide; gallium phosphide; indium nitride; gallium nitride; indium antimonide; gallium antimonide; aluminum phosphide; aluminum arsenide; aluminum antimonide; lead selenide; lead telluride; lead sulfide; indium selenide; indium telluride; indium sulfide; gallium selenide; arsenic sulfide; arsenic selenide; arsenic telluride; antimony sulfide; antimony selenide; antimony telluride; bismuth sulfide; bismuth selenide; bismuth telluride; silicon; silicon carbide; germanium; tin; selenium; tellurium; boron; carbon; phosphorus; boron nitride; boron phosphide; boron arsenide; aluminum nitride; aluminum sulfide; barium sulfide; barium selenide; barium telluride; calcium sulfide; calcium selenide; calcium telluride; beryllium sulfide; beryllium selenide; beryllium telluride; magnesium sulfide; magnesium selenide; germanium sulfide; germanium selenide; germanium telluride; tin sulfide; tin selenide; tin telluride; lead oxide; copper fluoride; copper chloride; copper bromide; copper iodide; copper oxide; copper selenide; nickel oxide; cobalt oxide; cobalt sulfide; triiron tetraoxide; iron sulfide; manganese oxide; molybdenum sulfide; vanadium oxide; tungsten oxide; tantalum oxide; titanium oxide; zirconium oxide; silicon nitride; germanium nitride; aluminum oxide; barium titanate; a compound of selenium, zinc, and cadmium; a compound of indium, arsenic, and phosphorus; a compound of cadmium, selenium, and sulfur; a compound of cadmium, selenium, and tellurium; a compound of indium, gallium, and arsenic; a compound of indium, gallium, and selenium; a compound of indium, selenium, and sulfur; a compound of copper, indium, and sulfur; and combinations thereof. What is called an alloyed quantum dot, whose composition is represented by a given ratio, may be used. For example, an alloyed quantum dot of cadmium, selenium, and sulfur is a means effective in obtaining blue light because the emission wavelength can be changed by changing the content ratio of elements.

As the quantum dot, any of a core-type quantum dot, a core-shell quantum dot, a core-multishell quantum dot, and the like can be used. Note that when a core is covered with a shell formed of another inorganic material having a wider band gap, the influence of defects and dangling bonds existing at the surface of a nanocrystal can be reduced. Since such a structure can significantly improve the quantum efficiency of light emission, it is preferable to use a core-shell or core-multishell quantum dot. Examples of the material of a shell include zinc sulfide and zinc oxide.

Quantum dots have a high proportion of surface atoms and thus have high reactivity and easily cohere together. For this reason, it is preferable that a protective agent be attached to, or a protective group be provided at the surfaces of quantum dots. The attachment of the protective agent or the provision of the protective group can prevent cohesion and increase solubility in a solvent. It can also reduce reactivity and improve electrical stability. Examples of the protective agent (or the protective group) include polyoxyethylene alkyl ethers such as polyoxyethylene lauryl ether, polyoxyethylene stearyl ether, and polyoxyethylene oleyl ether; trialkylphosphines such as tripropylphosphine, tributylphosphine, trihexylphosphine, and trioctylphoshine; polyoxyethylene alkylphenyl ethers such as polyoxyethylene n-octylphenyl ether and polyoxyethylene n-nonylphenyl ether; tertiary amines such as tri(n-hexyl)amine, tri(n-octyl)amine, and tri(n-decyl)amine; organophosphorus compounds such as tripropylphosphine oxide, tributylphosphine oxide, trihexylphosphine oxide, trioctylphosphine oxide, and tridecylphosphine oxide; polyethylene glycol diesters such as polyethylene glycol dilaurate and polyethylene glycol distearate; organic nitrogen compounds such as nitrogen-containing aromatic compounds, e.g., pyridines, lutidines, collidines, and quinolines; aminoalkanes such as hexylamine, octylamine, decylamine, dodecylamine, tetradecylamine, hexadecylamine, and octadecylamine; dialkylsulfides such as dibutylsulfide; dialkylsulfoxides such as dimethylsulfoxide and dibutylsulfoxide; organic sulfur compounds such as sulfur-containing aromatic compounds, e.g., thiophenes; higher fatty acids such as a palmitin acid, a stearic acid, and an oleic acid; alcohols; sorbitan fatty acid esters; fatty acid modified polyesters; tertiary amine modified polyurethanes; and polyethyleneimines.

Since band gaps of quantum dots are increased as their size is decreased, the size is adjusted as appropriate so that light with a desired wavelength can be obtained. Light emission from the quantum dots is shifted to a blue color side, i.e., a high energy side, as the crystal size is decreased; thus, emission wavelengths of the quantum dots can be adjusted over wavelength regions of spectra of an ultraviolet region, a visible light region, and an infrared region by changing the size of quantum dots. The range of size (diameter) of quantum dots which is usually used is 0.5 nm to 20 nm, preferably 1 nm to 10 nm. The emission spectra are narrowed as the size distribution of the quantum dots gets smaller, and thus light can be obtained with high color purity. The shape of the quantum dots is not particularly limited and may be a spherical shape, a rod shape, a circular shape, or the like. Quantum rods which are rod-like shape quantum dots emit directional light polarized in the c-axis direction; thus, quantum rods can be used as a light-emitting material to obtain a light-emitting element with higher external quantum efficiency.

In most EL elements, to improve luminous efficiency, light-emitting materials are dispersed in host materials and the host materials need to be substances each having a singlet excitation energy or a triplet excitation energy higher than or equal to that of the light-emitting material. In the case of using a blue phosphorescent material, it is particularly difficult to develop a host material which has a triplet excitation energy higher than or equal to that of the blue phosphorescent material and which is excellent in terms of a lifetime. On the other hand, even when a light-emitting layer is composed of quantum dots and made without a host material, the quantum dots enable luminous efficiency to be ensured; thus, a light-emitting element which is favorable in terms of a lifetime can be obtained. In the case where the light-emitting layer is composed of quantum dots, the quantum dots preferably have core-shell structures (including core-multishell structures).

Next, examples of a driving method of the pixel 30 are described with reference to timing charts in FIG. 18 and FIG. 19.

Figure 18:
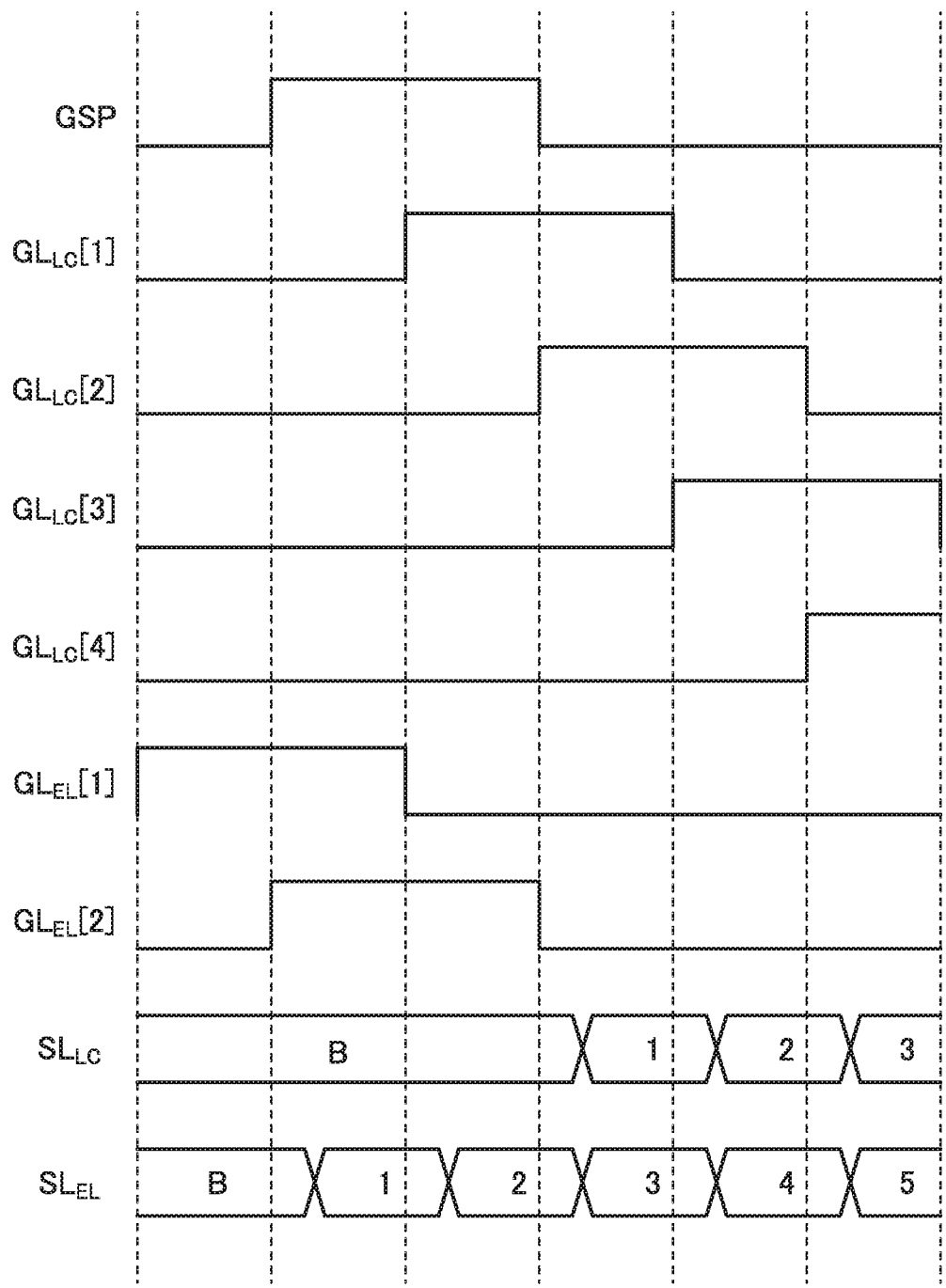
FIG. 18 is a timing chart showing an example of a display method.
Figure 19:
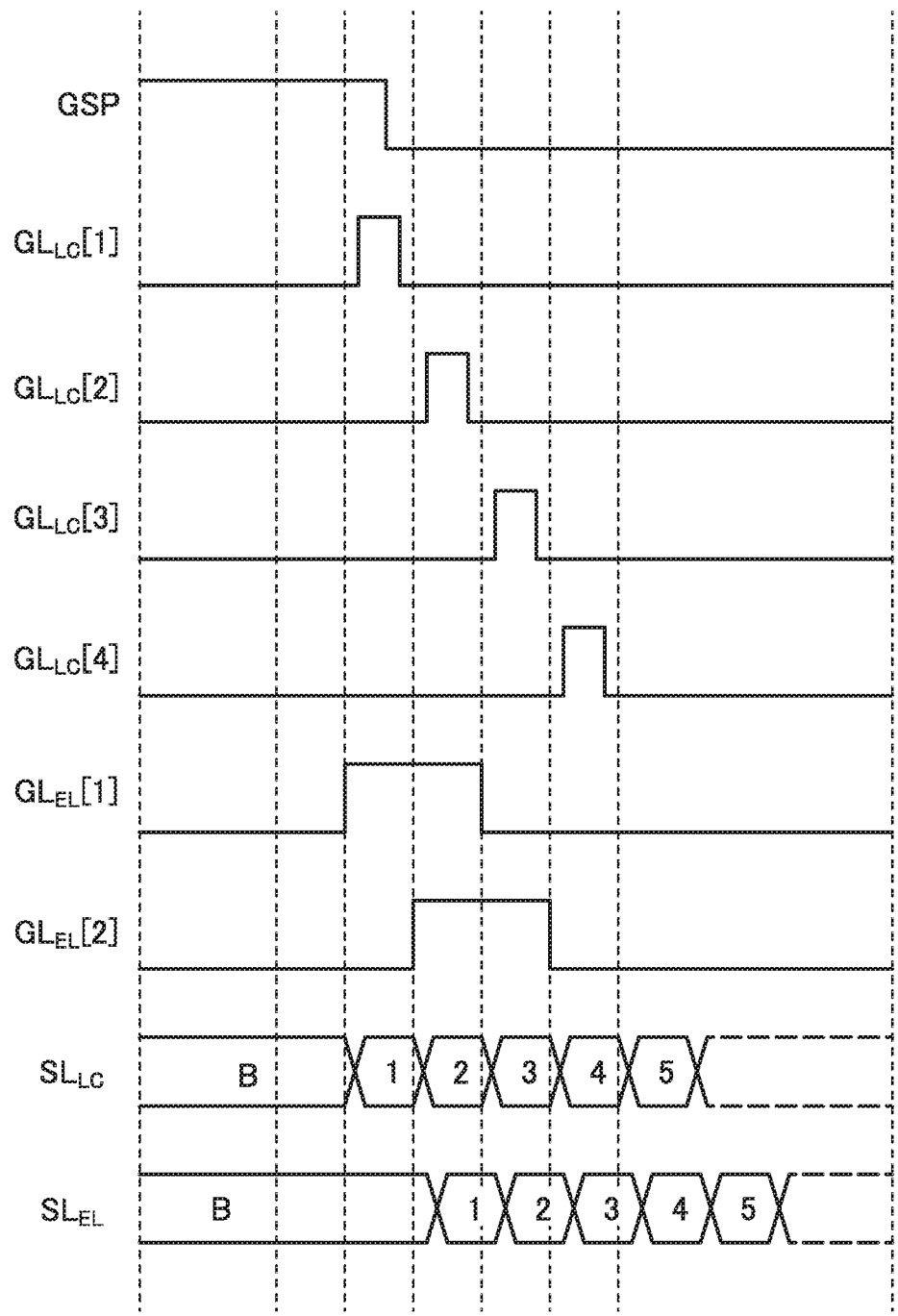
FIG. 19 is a timing chart showing an example of a display method.

FIG. 18 is a timing chart showing a method for driving the pixels 30. FIG. 18 shows voltages of the gate start pulse signal GSP, the wiring $GL_{LC}[1]$, the wiring $GL_{LC}[2]$, the wiring $GL_{LC}[3]$, the wiring $GL_{LC}[4]$, the wiring $GL_{EL}[1]$, the wiring $GL_{EL}[2]$, the wiring $SL_{LC}$, and the wiring $SL_{EL}$. For example, in the case where the display device of one embodiment of the present invention includes the pixels 30 in y columns (y is an integer greater than or equal to 2), the wiring $SL_{LC}$ corresponds to the wirings $SL_{LC}[1]$ to $SL_{LC}[y]$ and the wiring $SL_{EL}$ corresponds to the wirings $SL_{EL}[1]$ to $SL_{EL}[y]$.

As for the wirings $SL_{LC}$ and $SL_{EL}$, B represents a retrace period and the number represents a voltage corresponding to data that is written to the pixels 30 in which row. For example, in a period represented by 1 of the wiring $SL_{LC}$, the voltage of the wiring $SL_{LC}$ is a voltage corresponding to data that is written to the pixels 30 in the first row. For example, in a period represented by 1 of the wiring $SL_{EL}$, the voltage of the wiring $SL_{EL}$ is a voltage corresponding to data that is written to the pixels 30 in the first row.

In the timing chart in FIG. 18 and the like, a driving method of the transistors M1 and M2 which are n-channel transistors will be described. That is, the transistor M1 is turned on by inputting a high voltage to the wiring $GL_{LC}$ and turned off by inputting a low voltage to the wiring $GL_{LC}$. Moreover, the transistor M2 is turned on by inputting a high voltage to the wiring $GL_{EL}$ and turned off by inputting a low voltage to the wiring $GL_{EL}$. Note that a low voltage can be a ground voltage, for example.

The transistors M1 and M2 may be p-channel transistors. In that case, the transistor M1 is turned on by inputting a low voltage to the wiring $GL_{LC}$ and turned off by inputting a high voltage to the wiring $GL_{LC}$. Moreover, the transistor M2 is turned on by inputting a low voltage to the wiring $GL_{EL}$ and turned off by inputting a high voltage to the wiring $GL_{EL}$. The transistor M3 may also be either an n-channel transistor or a p-channel transistor.

As shown in FIG. 18, the pixels 30 in each row are sequentially selected by inputting a high voltage sequentially to the wiring $GL_{LC}$ electrically connected to the pixels 30 in the row, so that the transistors M1 provided for the pixels 30 in the row are sequentially turned on. Thus, data is sequentially written to the pixels 30 in the row through the wiring $SL_{LC}$. When the transistors M1 are turned off, the pixels 30 in which the data has been written are brought into a holding state. Accordingly, an image can be displayed by the liquid crystal element LC.

Furthermore, as shown in FIG. 18, the pixels 30 in each row are sequentially selected by inputting a high voltage sequentially to the wiring $GL_{EL}$ electrically connected to the pixels 30 in the row, so that the transistors M2 provided for the pixels 30 in the row are sequentially turned on. Thus, data is sequentially written to the pixels 30 in the row through the wiring $SL_{EL}$. When the transistors M2 are turned off, the pixels 30 in which the data has been written are brought into a holding state. In addition, the amount of current flowing between the source and the drain of the transistor M3 is controlled in accordance with the data which has been written (the voltage of a data signal supplied from the wiring $SL_{EL}$), and the light-emitting element EL emits light with a luminance corresponding to the amount of flowing current. Accordingly, an image can be displayed by the light-emitting element EL.

Although the period during which the wiring $GL_{LC}$ has a high voltage and the period during which the wiring $GL_{EL}$ has a high voltage are set to have an equal length in FIG. 18, they do not necessarily have an equal length. For example, as shown in FIG. 19, the period during which the wiring $GL_{LC}$ has a high voltage may be shorter than the period during which the wiring $GL_{EL}$ has a high voltage. In FIG. 19, after data is written to the pixels 30 in the j-th row through the wiring $SL_{LC}$, data is written to the pixels 30 in the j-th row through the wiring $SL_{EL}$. Thus, a change in data held in the capacitor $Cs_{EL}$ due to parasitic capacitance Cs_S can be suppressed. Therefore, black floating can be prevented from occurring in an image displayed by the light-emitting element EL, and the contrast ratio of the image can be enhanced.

Next, a layout diagram of a pixel which can be used as the pixel 30 is described. A circuit diagram of FIG. 20A is equivalent to the circuit diagram of FIG. 17.

The layout diagram in FIG. 20B corresponds to the arrangement of the components in the circuit diagram in FIG. 20A. FIG. 20B illustrates an electrode $PE_{EL}$ of the light-emitting element EL, the light-emitting element EL, arrangement of the transistors M1 to M3, the gate line $GL_{LC}[j]$, the gate line $GL_{EL}[j]$, the signal line $SL_{LC}[k]$, the signal line $SL_{EL}[k]$, the capacitor line $L_{CS}$, and the current supply line $L_{ano}$.

The layout diagram in FIG. 20C corresponds to the arrangement of the components in the circuit diagram in FIG. 20A. FIG. 20C illustrates a reflective electrode $PE_{LC}$ of the liquid crystal element LC, an opening 33 arranged so as to overlap with the light-emitting element EL, arrangement of the transistors M1 to M3, the gate line $GL_{LC}[I]$, the gate line $GL_{EL}[j]$, the signal line $SL_{LC}[k]$, the signal line $SL_{EL}[k]$, the capacitor line $L_{CS}$, and the current supply line $L_{ano}$.

Although the liquid crystal element LC and the light-emitting element EL are provided separately in the layout diagrams in FIGS. 20B and 20C, they are provided to overlap with each other.

Figure 21A:
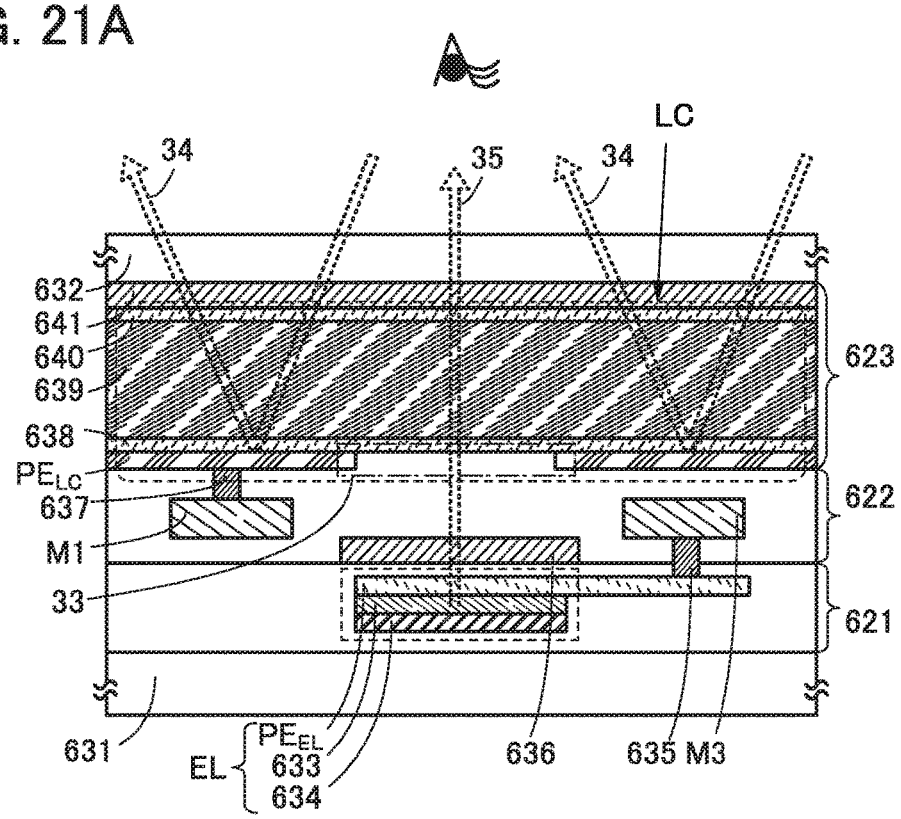
FIGS. 21A and 21B are a cross-sectional view and a perspective view illustrating a structure example of a display device.

FIG. 21A is a schematic cross-sectional view illustrating a stacked structure of the liquid crystal element LC and the light-emitting element EL. FIG. 21A illustrates a layer 621 including the light-emitting element EL, a layer 622 including the transistor, and a layer 623 including the liquid crystal element LC. The layers 621 to 623 are provided between substrates 631 and 632. Although not illustrated, an optical member such as a polarizing plate, a circularly polarizing plate, or an anti-reflective film may be included.

The layer 621 includes the light-emitting element EL. The light-emitting element EL includes the electrode $PE_{EL}$ illustrated in FIG. 20B, a light-emitting layer 633, and an electrode 634. When current flows to the light-emitting layer 633 between the electrode $PE_{EL}$ and the electrode 634, the light 35 (denoted by a dotted arrow) is emitted. The intensity of the light 35 is controlled by the transistor M3 in the layer 622.

The layer 622 includes the transistors M1 and M3, and a color filter 636. The layer 622 further includes a conductive layer 637 for connecting the transistor M1 and the reflective electrode $PE_{LC}$, and a conductive layer 635 for connecting the transistor M3 and the electrode $PE_{EL}$. The color filter 636 is provided when the light-emitting element EL emits white light, and the light 35 with a specific wavelength can be emitted to the viewer side. The color filter 636 is provided so as to overlap with the opening 33. The transistors M1 to M3 (the transistor M2 is not illustrated) are provided so as to overlap with the reflective electrode $PE_{LC}$.

The layer 623 includes the opening 33, the reflective electrode $PE_{LC}$, a conductive layer 638, a liquid crystal 639, a conductive layer 640, and a color filter 641. Orientation of the liquid crystal 639 between a pair of the conductive layer 638 and the conductive layer 640 is controlled by the conductive layer 638. The reflective electrode $PE_{LC}$ reflects the external light and emits the reflected light 34 (denoted by a dotted arrow). The intensity of the reflected light 34 is controlled by adjustment of orientation of the liquid crystal 639 by the transistor M1. The opening 33 is provided in a position that transmits the light 35 emitted from the light-emitting element EL in the layer 621.

A material that reflects visible light can be used for the reflective electrode $PE_{LC}$, for example. Specifically, a material containing silver can be used for the reflective film. For example, a material containing silver, palladium, and the like or a material containing silver, copper, and the like can be used for the reflective film. Alternatively, for example, a material with unevenness on its surface can be used for the reflective film. In that case, incident light can be reflected in various directions so that a white image can be displayed.

A material that transmits visible light can be used for the conductive layers 638 and 640. Specifically, a conductive oxide such as indium oxide, indium tin oxide, indium zinc oxide, zinc oxide, or zinc oxide to which gallium is added, or graphene can be used.

For example, a light-transmitting inorganic material such as glass or ceramics can be used for the substrates 631 and 632. Alternatively, a flexible material, for example, an organic material such as a resin film or plastics can be used for the substrates 631 and 632. Note that members such as a polarizing plate, a retardation plate, and a prism sheet can be stacked on the substrates 631 and 632 as appropriate.

For example, an insulating inorganic material, an insulating organic material, or an insulating composite material containing an inorganic material and an organic material can be used for the insulating layer included in the display device. For the insulating layer, a silicon oxide film, a silicon nitride film, a silicon oxynitride film, an aluminum oxide film, or the like, or a stacked material of any of these films can be used. Alternatively, polyester, polyolefin, polyamide, polyimide, polycarbonate, polysiloxane, an acrylic resin, or the like, or a stacked material or a composite material of a plurality of resins selected from these materials can be used.

The conductive layers 635 and 637 included in the display device can be formed using a conductive material and can be used for wirings or the like. For example, a metal element selected from aluminum, gold, platinum, silver, copper, chromium, tantalum, titanium, molybdenum, tungsten, nickel, iron, cobalt, palladium, and manganese can be used. Alternatively, an alloy containing any of the above-described metal elements, or the like can be used for the wiring or the like.

The light-emitting layer 633 included in the display device is formed by freely combining an EL layer, a charge-transport layer, and a charge-injection layer. For example, a low-molecular organic EL material or a high-molecular organic EL material is used. As the EL layer, a thin film made of a light-emitting material that emits light (fluorescence) by singlet excitation (a singlet compound) or a thin film made of a light-emitting material that emits light (phosphorescence) by triplet excitation (a triplet compound) can be used. In addition, an inorganic material such as silicon carbide can also be used as the charge-transport layer and the charge-injection layer. As the organic EL material and inorganic material, known materials can be used.

The electrode $PE_{EL}$ included in the display device functions as an anode of the light-emitting element EL. A material for forming the anode has a work function higher than that of a material for forming a cathode. For example, indium oxide tin oxide (ITO), indium oxide zinc oxide ($In_2O_3$—ZnO), or zinc oxide (ZnO), or a material having lower sheet resistance than ITO, such as platinum (Pt), chromium (Cr), tungsten (W), or nickel (Ni) can be used.

The electrode 634 included in the display device can be formed using a metal having a low work function (typically, a metal element which belongs to Group 1 or Group 2 of the periodic table), or an alloy thereof. The luminous efficiency increases as the work function is lower; thus, in particular, an alloy material containing lithium (Li), which is an alkali metal, is preferably used as a material for the cathode.

Figure 21B:
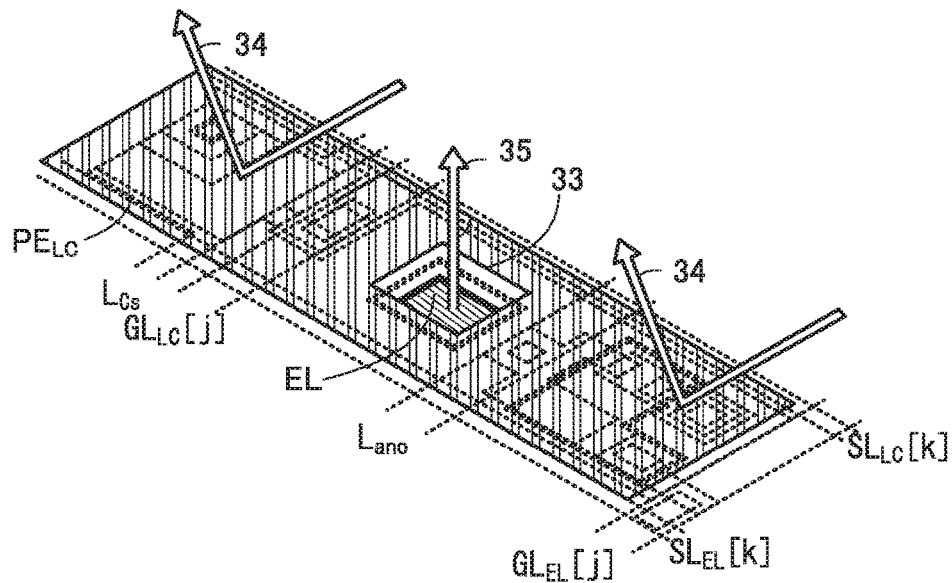

FIG. 21B is a perspective view in which the layout diagrams in FIGS. 20B and 20C overlap with each other for illustrating the stacked structure of the liquid crystal element LC and the light-emitting element EL. As illustrated in FIG. 21B, the liquid crystal element LC and the light-emitting element EL are provided to overlap with each other. Then, the opening 33 is provided in a position that transmits the light 35 emitted from the light-emitting element EL. With such a structure, switching of display elements in accordance with the surrounding environment can be achieved without increasing the area occupied by the pixel. Consequently, a display device with improved visibility can be obtained.

Cross-sectional structure examples of the pixel and other portions are described with reference to FIG. 22 and FIGS. 23A to 23C.

Figure 22:
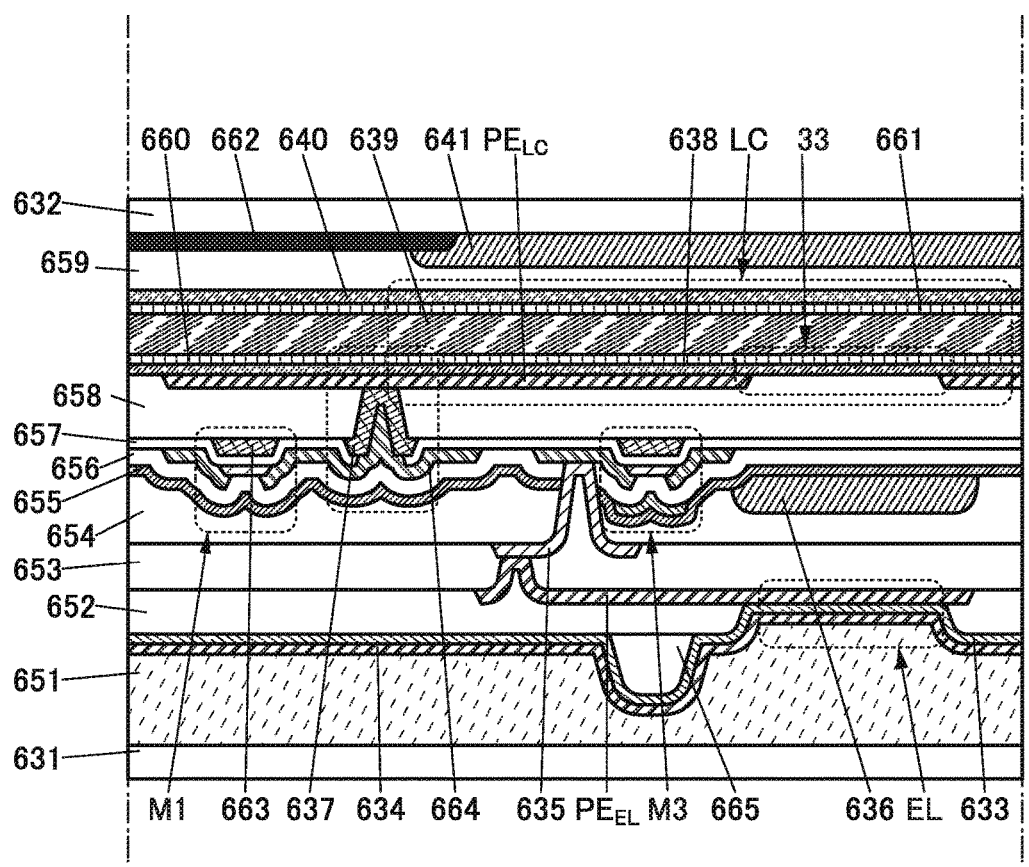
FIG. 22 is a schematic cross-sectional view illustrating a structure example of a display device.

FIG. 22 shows a detailed schematic cross-sectional view of the pixel in FIG. 21A. In FIG. 22, the same components as in FIG. 21A are denoted by the same reference numerals and the description thereof is not repeated.

In the schematic cross-sectional view of the pixel of the display device in FIG. 22, in addition to the components in FIG. 21A, an adhesive layer 651, an insulating layer 652, an insulating layer 653, an insulating layer 654, an insulating layer 655, an insulating layer 656, an insulating layer 657, an insulating layer 658, an insulating layer 659, an alignment film 660, an alignment film 661, a light-blocking film 662, a conductive layer 663, a conductive layer 664, and an insulating layer 665 are provided between the substrates 631 and 632.

The insulating layer 652, the insulating layer 653, the insulating layer 654, the insulating layer 655, the insulating layer 656, the insulating layer 657, the insulating layer 658, the insulating layer 659, and the insulating layer 665 can be formed using an insulating inorganic material, an insulating organic material, or an insulating composite material containing an inorganic material and an organic material. For the insulating layer, a silicon oxide film, a silicon nitride film, a silicon oxynitride film, an aluminum oxide film, or the like, or a stacked material of any of these films can be used. Alternatively, polyester, polyolefin, polyamide, polyimide, polycarbonate, polysiloxane, an acrylic resin, or the like, or a stacked material or a composite material of a plurality of resins selected from these materials can be used.

The conductive layers 663 and 664 can be formed using a conductive material and can be used for wirings or the like. For example, a metal element selected from aluminum, gold, platinum, silver, copper, chromium, tantalum, titanium, molybdenum, tungsten, nickel, iron, cobalt, palladium, and manganese can be used for the conductive layer. Alternatively, an alloy containing any of the above-described metal elements, or the like can be used for the wiring or the like.

As the adhesive layer 651, a variety of curable adhesives such as a reactive curable adhesive, a thermosetting adhesive, an anaerobic adhesive, and a photocurable adhesive such as an ultraviolet curable adhesive can be used. Examples of these adhesives include an epoxy resin, an acrylic resin, a silicone resin, a phenol resin, a polyimide resin, an imide resin, a polyvinyl chloride (PVC) resin, a polyvinyl butyral (PVB) resin, and an ethylene vinyl acetate (EVA) resin. In particular, a material with low moisture permeability, such as an epoxy resin, is preferred. Alternatively, a two-component type resin may be used. Still alternatively, an adhesive sheet or the like may be used.

For the alignment film 660 and the alignment film 661, an organic resin such as polyimide can be used. In the case where optical alignment treatment for aligning the liquid crystal 639 in a predetermined direction is performed, the alignment film 660 and the alignment film 661 may be omitted. Also in the case of using a liquid crystal which does not need alignment treatment, the alignment film 660 and the alignment film 661 may be omitted.

The light-blocking film 662 can be formed using a light-blocking material which absorbs light, such as chromium, chromium oxide, or a black resin.

FIGS. 23A to 23C show schematic cross-sectional views of a terminal portion, a driver circuit portion, and a common contact portion which correspond to the schematic cross-sectional view of the pixel of the display device in FIG. 22. In FIGS. 23A to 23C, the same components as in FIG. 21A and FIG. 22 are denoted by the same reference numerals and the description thereof is not repeated.

FIG. 23A is the schematic cross-sectional view of the terminal portion of the display device. In a connection portion 670 for connection to an external circuit in the terminal portion, the conductive layer 637, the conductive layer 664, the reflective electrode $PE_{LC}$, and the conductive layer 638 are stacked. A flexible printed circuit (FPC) 672 is connected to the connection portion 670 through a connection layer 671. An adhesive layer 673 is provided at an end portion of the substrate 632, thereby attaching the substrate 632 to the substrate 631.

FIG. 23B is the schematic cross-sectional view of the driver circuit portion of the display device. A transistor 680 in the driver circuit portion can have the same structure as the transistor M3.

FIG. 23C is the schematic cross-sectional view of the common contact portion of the display device. At a connection portion 690 in the common contact portion, the conductive layer 640 on the substrate 632 side is connected to the conductive layer 638 and the reflective electrode $PE_{LC}$ on the substrate 631 side through a connector 691 in the adhesive layer 673.

At least part of this embodiment can be implemented in combination with any of the other embodiments and the other examples described in this specification as appropriate.

Embodiment 3

In this embodiment, the composition of a CAC-OS which can be used in a transistor disclosed in one embodiment of the present invention will be described.

The CAC-OS has, for example, a composition in which elements included in a metal oxide are unevenly distributed. Materials including unevenly distributed elements each have a size of greater than or equal to 0.5 nm and less than or equal to 10 nm, preferably greater than or equal to 1 nm and less than or equal to 2 nm, or a similar size. Note that in the following description of a metal oxide, a state in which one or more metal elements are unevenly distributed and regions including the metal element(s) are mixed is referred to as a mosaic pattern or a patch-like pattern. The regions each have a size greater than or equal to 0.5 nm and less than or equal to 10 nm, preferably greater than or equal to 1 nm and less than or equal to 2 nm, or a similar size.

Note that a metal oxide preferably contains at least indium. In particular, indium and zinc are preferably contained. In addition, one or more of aluminum, gallium, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like may be contained.

For example, of the CAC-OS, an In—Ga—Zn oxide with the CAC composition (such an In—Ga—Zn oxide may be particularly referred to as CAC-IGZO) has a composition in which materials are separated into indium oxide ($InO_{X1}$, where X1 is a real number greater than 0) or indium zinc oxide ($In_{X2}Zn_{Y2}O_{Z2}$, where X2, Y2, and Z2 are real numbers greater than 0), and gallium oxide ($GaO_{X3}$, where X3 is a real number greater than 0) or gallium zinc oxide ($Ga_{X4}Zn_{Y4}O_{Z4}$, where X4, Y4, and Z4 are real numbers greater than 0), and a mosaic pattern is formed. Then, $InO_{X1}$ or $In_{X2}Zn_{Y2}O_{Z2}$ forming the mosaic pattern is evenly distributed in the film. This composition is also referred to as a cloud-like composition.

That is, the CAC-OS is a composite metal oxide with a composition in which a region including $GaO_{X3}$ as a main component and a region including $In_{X2}Zn_{Y2}O_{Z2}$ or $InO_{X1}$ as a main component are mixed. Note that in this specification, for example, when the atomic ratio of In to an element M in a first region is greater than the atomic ratio of In to an element M in a second region, the first region has higher In concentration than the second region.

Note that a compound including In, Ga, Zn, and O is also known as IGZO. Typical examples of IGZO include a crystalline compound represented by $InGaO_3(ZnO)_{m1}$ (m1 is an integer greater than or equal to 1) and a crystalline compound represented by $In_{(1+x0)}Ga_{(1-x0)}O_3(ZnO)_{m0}$ ($-1 \leq x0 \leq 1$; m0 is a given number).

The above crystalline compounds have a single crystal structure, a polycrystalline structure, or a CAAC structure. Note that the CAAC structure is a crystal structure in which a plurality of IGZO nanocrystals have c-axis alignment and are connected in the a-b plane direction without alignment.

On the other hand, the CAC-OS relates to the material composition of a metal oxide. In a material composition of a CAC-OS including In, Ga, Zn, and O, nanoparticle regions including Ga as a main component are observed in part of the CAC-OS and nanoparticle regions including In as a main component are observed in part thereof. These nanoparticle regions are randomly dispersed to form a mosaic pattern. Therefore, the crystal structure is a secondary element for the CAC-OS.

Note that in the CAC-OS, a stacked-layer structure including two or more films with different atomic ratios is not included. For example, a two-layer structure of a film including In as a main component and a film including Ga as a main component is not included.

A boundary between the region including $GaO_{X3}$ as a main component and the region including $In_{X2}Zn_{Y2}O_{Z2}$ or $InO_{X1}$ as a main component is not clearly observed in some cases.

In the case where one or more of aluminum, yttrium, tin, copper, vanadium, beryllium, boron, silicon, titanium, iron, nickel, germanium, zirconium, molybdenum, lanthanum, cerium, neodymium, hafnium, tantalum, tungsten, magnesium, and the like are contained instead of gallium in a CAC-OS, nanoparticle regions including the selected metal element(s) as a main component(s) are observed in part of the CAC-OS and nanoparticle regions including In as a main component are observed in part thereof, and these nanoparticle regions are randomly dispersed to form a mosaic pattern in the CAC-OS.

The CAC-OS can be formed by a sputtering method under conditions where a substrate is not heated intentionally, for example. In the case of forming the CAC-OS by a sputtering method, one or more selected from an inert gas (typically, argon), an oxygen gas, and a nitrogen gas may be used as a deposition gas. The ratio of the flow rate of an oxygen gas to the total flow rate of the deposition gas at the time of deposition is preferably as low as possible, and for example, the flow ratio of an oxygen gas is preferably higher than or equal to 0% and lower than 30%, further preferably higher than or equal to 0% and lower than or equal to 10%.

The CAC-OS is characterized in that no clear peak is observed in measurement using θ/2θ scan by an out-of-plane method, which is an X-ray diffraction (XRD) measurement method. That is, X-ray diffraction shows no alignment in the a-b plane direction and the c-axis direction in a measured region.

In an electron diffraction pattern of the CAC-OS which is obtained by irradiation with an electron beam with a probe diameter of 1 nm (also referred to as a nanometer-sized electron beam), a ring-like region with high luminance and a plurality of bright spots in the ring-like region are observed. Therefore, the electron diffraction pattern indicates that the crystal structure of the CAC-OS includes a nanocrystal (nc) structure with no alignment in plan-view and cross-sectional directions.

For example, an energy dispersive X-ray spectroscopy (EDX) mapping image confirms that an In—Ga—Zn oxide with the CAC composition has a structure in which a region including $GaO_{X3}$ as a main component and a region including $In_{X2}Zn_{Y2}O_{Z2}$ or $InO_{X1}$ as a main component are unevenly distributed and mixed.

The CAC-OS has a structure different from that of an IGZO compound in which metal elements are evenly distributed, and has characteristics different from those of the IGZO compound. That is, in the CAC-OS, regions including $GaO_{X3}$ or the like as a main component and regions including $In_{X2}Zn_{Y2}O_{Z2}$ or $InO_{X1}$ as a main component are separated to form a mosaic pattern.

The conductivity of a region including $In_{X2}Zn_{Y2}O_{Z2}$ or $InO_{X1}$ as a main component is higher than that of a region including $GaO_{X3}$ or the like as a main component. In other words, when carriers flow through regions including $In_{X2}Zn_{Y2}O_{Z2}$ or $InO_{X1}$ as a main component, the conductivity of a metal oxide is exhibited. Accordingly, when regions including $In_{X2}Zn_{Y2}O_{Z2}$ or $InO_{X1}$ as a main component are distributed in a metal oxide like a cloud, high field-effect mobility (μ) can be achieved.

In contrast, the insulating property of a region including $GaO_{X3}$ or the like as a main component is higher than that of a region including $In_{X2}Zn_{Y2}O_{Z2}$ or $InO_{X1}$ as a main component. In other words, when regions including $GaO_{X3}$ or the like as a main component are distributed in a metal oxide, leakage current can be suppressed and favorable switching operation can be achieved.

Accordingly, when a CAC-OS is used for a semiconductor element, the insulating property derived from $GaO_{X3}$ or the like and the conductivity derived from $In_{X2}Zn_{Y2}O_{Z2}$ or $InO_{X1}$ complement each other, whereby high on-state current (Ion) and high field-effect mobility (μ) can be achieved.

A semiconductor element including a CAC-OS has high reliability. Thus, the CAC-OS is suitably used in a variety of semiconductor devices such as a display.

At least part of this embodiment can be implemented in combination with any of the other embodiments and the other examples described in this specification as appropriate.

Embodiment 4

In this embodiment, a display module including the display device of one embodiment of the present invention and electronic devices each including the display device of one embodiment of the present invention will be described with reference to FIG. 24 and FIGS. 25A to 25G.

Figure 24:
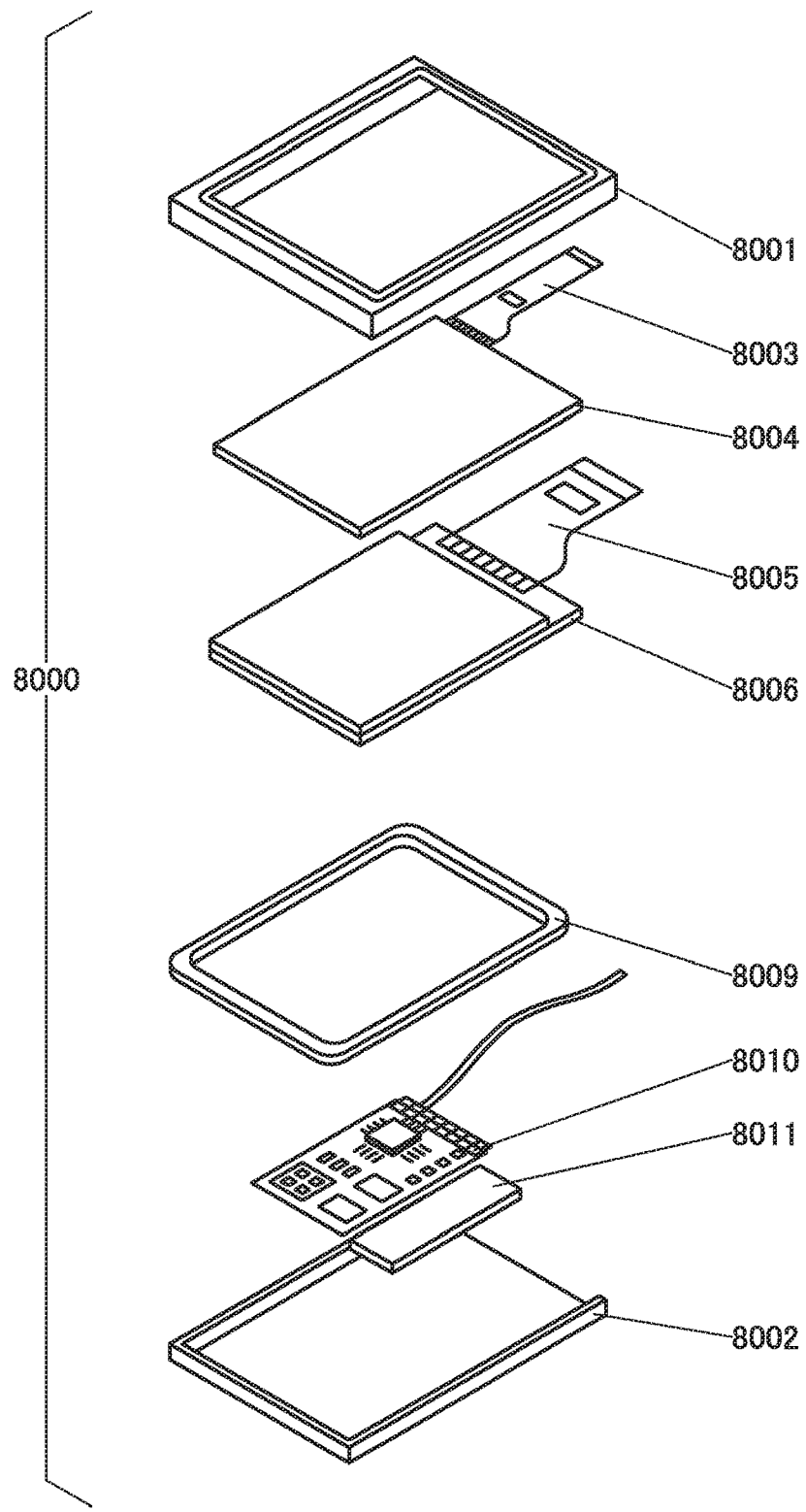
FIG. 24 illustrates a display module.

FIG. 24 is a schematic view of a display module including the display device of one embodiment of the present invention. The display module including the display device of one embodiment of the present invention can operate at high speed and display an image with a large number of gray levels.

In a display module 8000 illustrated in FIG. 24, a touch panel 8004 connected to an FPC 8003, a display panel 8006 connected to an FPC 8005, a frame 8009, a printed circuit board 8010, and a battery 8011 are provided between an upper cover 8001 and a lower cover 8002.

The display device of one embodiment of the present invention can be used for, for example, the display panel 8006. Thus, excellent visibility can be maintained outdoors or indoors.

The shapes and sizes of the upper cover 8001 and the lower cover 8002 can be changed as appropriate in accordance with the sizes of the touch panel 8004 and the display panel 8006.

The touch panel 8004 can be a resistive touch panel or a capacitive touch panel and can be formed to overlap with the display panel 8006. A counter substrate (sealing substrate) of the display panel 8006 can have a touch panel function. A photosensor can be provided in each pixel of the display panel 8006 to form an optical touch panel.

The frame 8009 protects the display panel 8006 and also functions as an electromagnetic shield for blocking electromagnetic waves generated by the operation of the printed circuit board 8010. The frame 8009 may function as a radiator plate.

The printed circuit board 8010 is provided with a power supply circuit and a signal processing circuit for outputting a video signal and a clock signal. As a power source for supplying power to the power supply circuit, an external commercial power source or a power source using the battery 8011 provided separately may be used. The battery 8011 can be omitted in the case of using a commercial power source.

The display module 8000 may be additionally provided with a member such as a polarizing plate, a retardation plate, or a prism sheet.

FIGS. 25A to 25G illustrate electronic appliances. These electronic appliances can include a housing 9000, a display portion 9001, a speaker 9003, operation keys 9005 (including a power switch or an operation switch), a connection terminal 9006, a sensor 9007 (a sensor having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared rays), a microphone 9008, and the like.

The electronic appliances illustrated in FIGS. 25A to 25G can have a variety of functions, for example, a function of displaying a variety of data (a still image, a moving image, a text image, and the like) on the display portion, a touch panel function, a function of displaying a calendar, date, time, and the like, a function of controlling a process with a variety of software (programs), a wireless communication function, a function of being connected to a variety of computer networks with a wireless communication function, a function of transmitting and receiving a variety of data with a wireless communication function, a function of reading a program or data stored in a memory medium and displaying the program or data on the display portion, and the like. Note that functions that can be provided for the electronic appliances illustrated in FIGS. 25A to 25G are not limited to those described above, and the electronic appliances can have a variety of functions. Although not illustrated in FIGS. 25A to 25G, the electronic appliance may include a plurality of display portions. Furthermore, the electronic appliance may be provided with a camera and the like and have a function of shooting a still image, a function of shooting a moving image, a function of storing a shot image in a memory medium (an external memory medium or a memory medium incorporated in the camera), a function of displaying a shot image on the display portion, or the like.

The electronic appliances illustrated in FIGS. 25A to 25G are described in detail below.

Figure 25A:
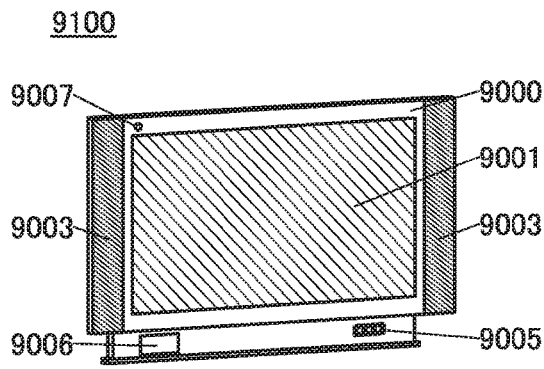
FIGS. 25A to 25G illustrate electronic devices.

FIG. 25A is a perspective view illustrating a television set 9100. The television set 9100 can include the display portion 9001 having a large screen size of, for example, 50 inches or more, or 100 inches or more. The display portion 9001 including the display module of one embodiment of the present invention can operate at high speed and display an image with a large number of gray levels.

Figure 25D:
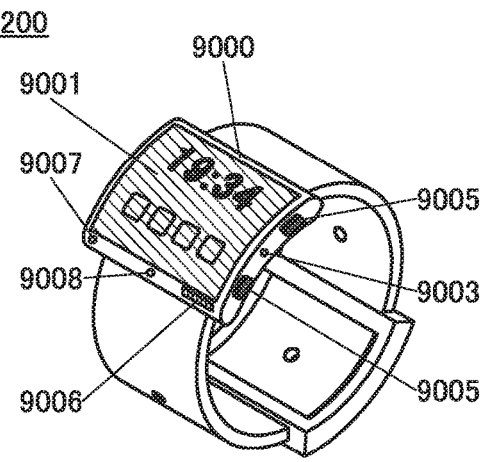
Figure 25B:
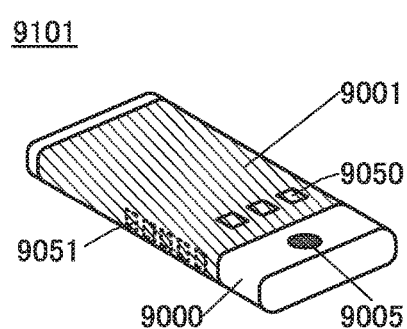

FIG. 25B is a perspective view illustrating a portable information terminal 9101. The portable information terminal 9101 functions as, for example, one or more of a telephone set, a notebook, and an information browsing system. Specifically, the portable information terminal 9101 can be used as a smartphone. Note that the portable information terminal 9101 may include a speaker, a connection terminal, a sensor, and the like. The portable information terminal 9101 can display characters and image information on its plurality of surfaces. For example, three operation buttons 9050 (also referred to as operation icons or simply icons) can be displayed on one surface of the display portion 9001. Furthermore, information 9051 indicated by dashed rectangles can be displayed on another surface of the display portion 9001. Examples of the information 9051 include display indicating reception of an incoming email, social networking service (SNS) message, and call; the title and sender of an email and SNS message; the date; the time; remaining battery; and the reception strength of an antenna. Alternatively, the operation buttons 9050 or the like may be displayed in place of the information 9051. The display portion 9001 including the display module of one embodiment of the present invention can operate at high speed and display an image with a large number of gray levels.

Figure 25E:
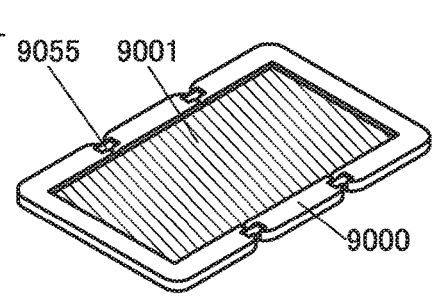
Figure 25C:
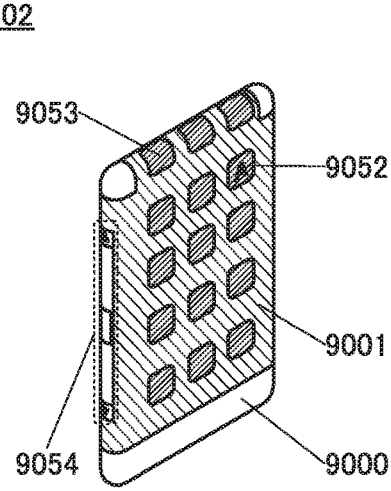

FIG. 25C is a perspective view illustrating a portable information terminal 9102. The portable information terminal 9102 has a function of displaying information, for example, on three or more surfaces of the display portion 9001. Here, information 9052, information 9053, and information 9054 are displayed on different surfaces. For example, a user of the portable information terminal 9102 can see the display (here, the information 9053) with the portable information terminal 9102 put in a breast pocket of his/her clothes. Specifically, a caller's phone number, name, or the like of an incoming call is displayed in a position that can be seen from above the portable information terminal 9102. Thus, the user can see the display without taking out the portable information terminal 9102 from the pocket and decide whether to answer the call. The display portion 9001 including the display module of one embodiment of the present invention can operate at high speed and display an image with a large number of gray levels.

FIG. 25D is a perspective view illustrating a wrist-watch-type portable information terminal 9200. The portable information terminal 9200 is capable of executing a variety of applications such as mobile phone calls, e-mailing, reading and editing texts, music reproduction, Internet communication, and a computer game. The display surface of the display portion 9001 is bent, and images can be displayed on the bent display surface. The portable information terminal 9200 can employ near field communication that is a communication method based on an existing communication standard. In that case, for example, mutual communication between the portable information terminal 9200 and a headset capable of wireless communication can be performed, and thus hands-free calling is possible. Moreover, the portable information terminal 9200 includes the connection terminal 9006, and data can be directly transmitted to and received from another information terminal via a connector. Charging through the connection terminal 9006 is also possible. Note that the charging operation may be performed by wireless power feeding without using the connection terminal 9006. The display portion 9001 including the display module of one embodiment of the present invention can operate at high speed and display an image with a large number of gray levels.

Figure 25F:
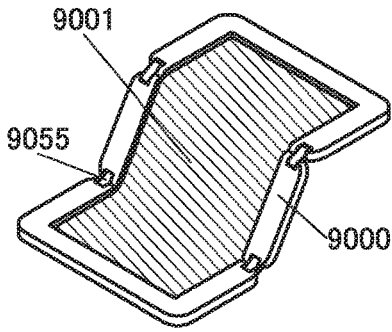
Figure 25G:
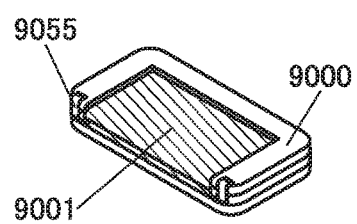
Figure 26A:
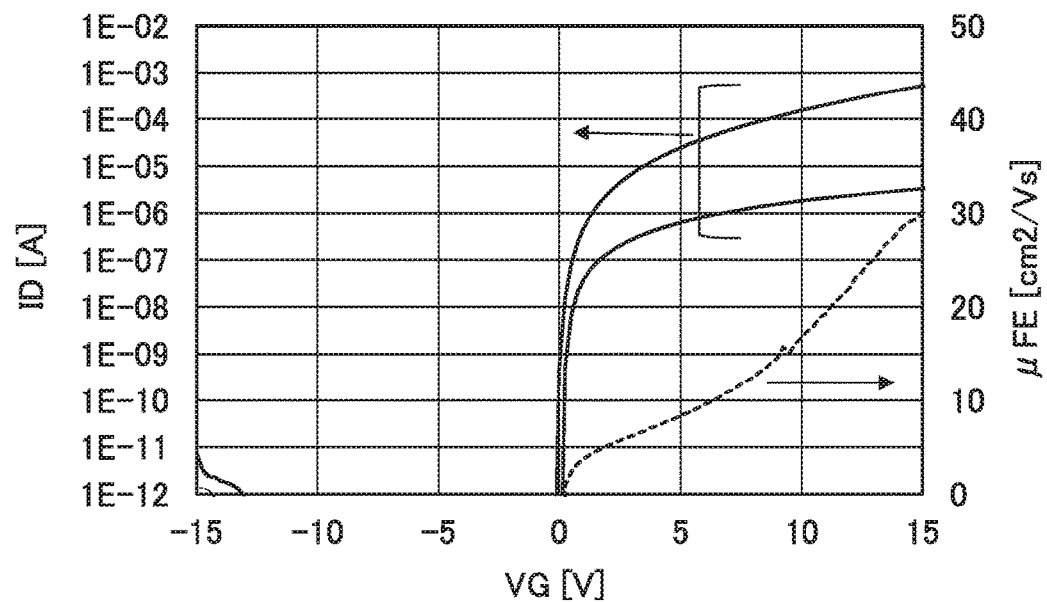
FIGS. 26A and 26B each show $V_g$-$I_d$ characteristics of a transistor.
Figure 26B:
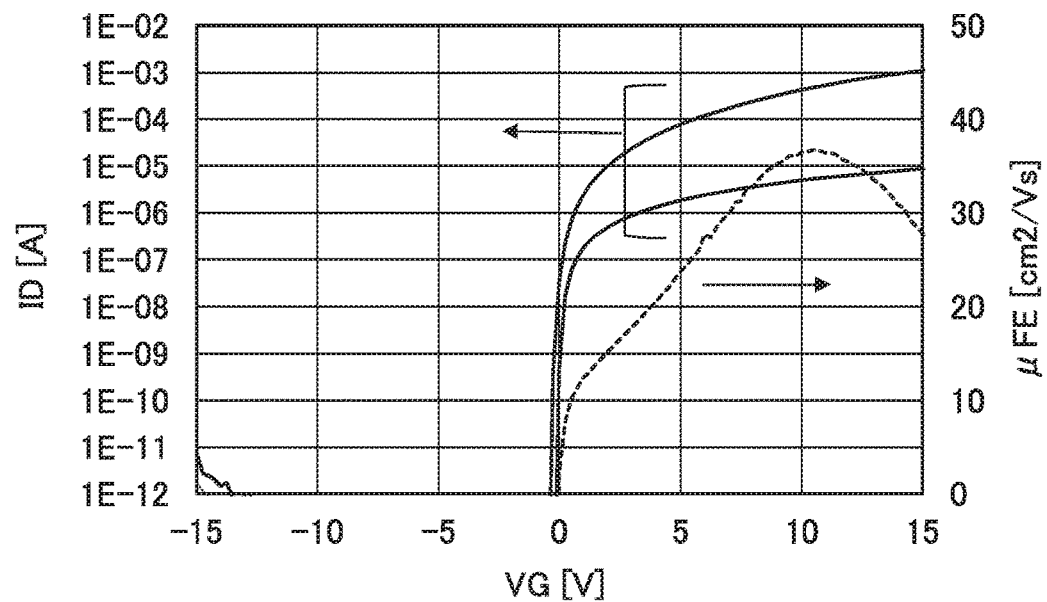
Figure 27A:
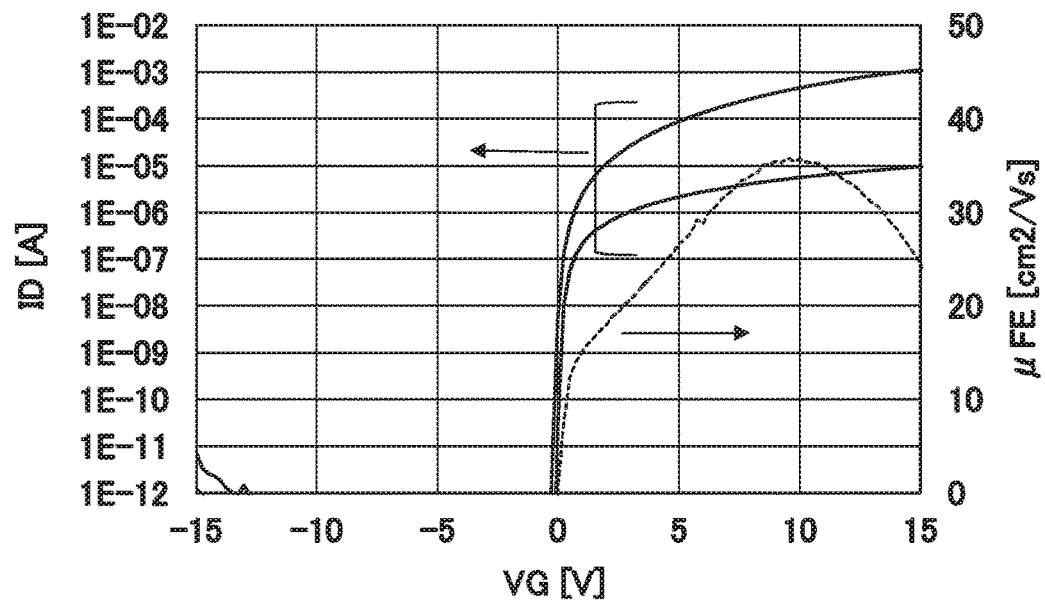
FIGS. 27A and 27B each show $V_g$-$I_d$ characteristics of a transistor.
Figure 27B:
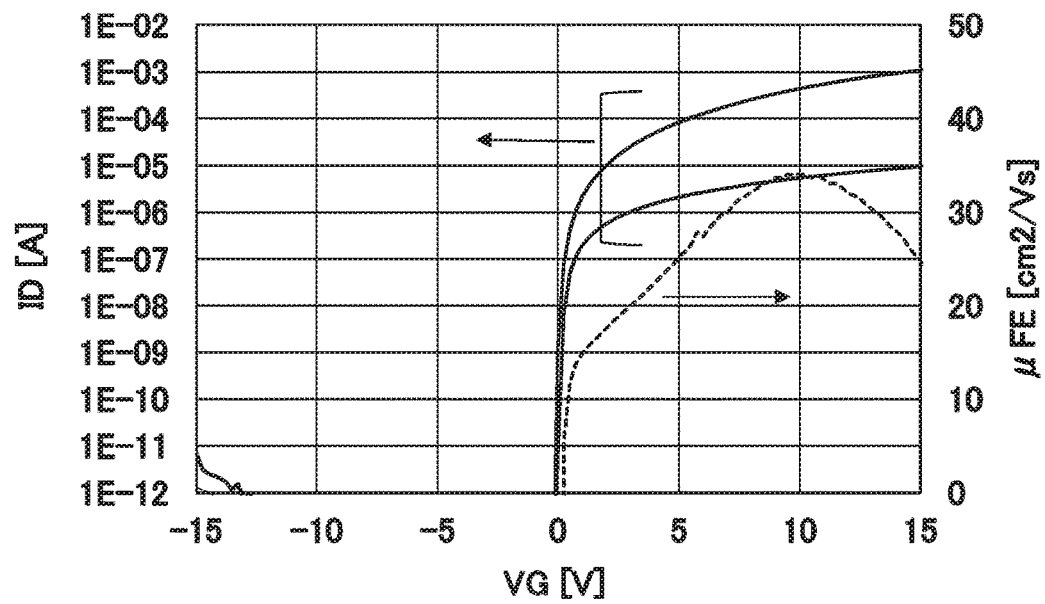

FIGS. 25E, 25F, and 25G are perspective views of a foldable portable information terminal 9201. FIG. 25E is a perspective view illustrating the portable information terminal 9201 that is opened. FIG. 25F is a perspective view illustrating the portable information terminal 9201 that is being opened or being folded. FIG. 25G is a perspective view illustrating the portable information terminal 9201 that is folded. The portable information terminal 9201 is highly portable when folded. When the portable information terminal 9201 is opened, a seamless large display region is highly browsable. The display portion 9001 of the portable information terminal 9201 is supported by three housings 9000 joined together by hinges 9055. By folding the portable information terminal 9201 at a connection portion between two housings 9000 with the hinges 9055, the portable information terminal 9201 can be reversibly changed in shape from an opened state to a folded state. For example, the portable information terminal 9201 can be bent with a radius of curvature of greater than or equal to 1 mm and less than or equal to 150 mm. The display portion 9001 including the display module of one embodiment of the present invention can operate at high speed and display an image with a large number of gray levels.

At least part of this embodiment can be implemented in combination with any of the other embodiments and the other examples described in this specification as appropriate.

Example 1

In this example, as the transistors each containing a metal oxide of one embodiment of the present invention, four kinds of transistors, Transistor A, Transistor N, Transistor S, and Transistor T were formed and their characteristics were evaluated.

<Formation of Transistor>

A formation process of the transistors will be described. Bottom-gate top-contact channel-etched transistors were formed. A formation method is described below. In each of the transistors, a second gate is provided to face the bottom gate with an active layer interposed therebetween. In addition, the bottom gate is electrically connected to the second gate.

A bottom gate was formed over a glass substrate first. For the bottom gate, a 100-nm-thick tungsten film was used.

Next, an insulator to be a gate insulating film was formed. As the insulator, a silicon nitride film was formed to a thickness of 400 nm, and then a silicon oxynitride film was formed to a thickness of 50 nm. The silicon nitride film was formed using a silane gas, a nitrogen gas, and an ammonia gas by a plasma CVD method. The silicon oxynitride film was formed using a silane gas and a nitrous oxide gas by a plasma CVD method.

Next, a metal oxide to be an active layer was formed by a sputtering method.

As a metal oxide film in Transistor A, a 40-nm-thick metal oxide film was formed under the following conditions: an In—Ga—Zn oxide (In:Ga:Zn=1:1:1.2) was used as a target; an oxygen gas and an argon gas were used; the proportion of the oxygen gas flow rate to the total gas flow rate of oxygen and argon was 50%; the pressure was 0.2 Pa; the substrate temperature was 170° C.; and an alternating-current power of 0.5 kW was applied.

Transistor N includes two stacked metal oxide layers. As the lower layer, a 10-nm-thick metal oxide film was formed under the following conditions: an In—Ga—Zn oxide (In:Ga:Zn=4:2:4.1) was used as a target; an oxygen gas and an argon gas were used; the proportion of the oxygen gas flow rate to the total gas flow rate of oxygen and argon was 30%; the pressure was 0.2 Pa; the substrate temperature was 170° C.; and an alternating-current power of 1.5 kW was applied. As the upper layer, a 15-nm-thick metal oxide film was formed under the following conditions: an In—Ga—Zn oxide (In:Ga:Zn=1:1:1.2) was used as a target; an oxygen gas and an argon gas were used; the proportion of the oxygen gas flow rate to the total gas flow rate of oxygen and argon was 50%; the pressure was 0.2 Pa; the substrate temperature was 170° C.; and an alternating-current power of 0.5 kW was applied.

Transistor S includes two stacked metal oxide layers. As the lower layer, a 10-nm-thick metal oxide film was formed under the following conditions: an In—Ga—Zn oxide (In:Ga:Zn=4:2:4.1) was used as a target; an oxygen gas and an argon gas were used; the proportion of the oxygen gas flow rate to the total gas flow rate of oxygen and argon was 10%; the pressure was 0.6 Pa; the substrate temperature was 130° C.; and an alternating-current power of 2.5 kW was applied. As the upper layer, a 15-nm-thick metal oxide film was formed under the following conditions: an In—Ga—Zn oxide (In:Ga:Zn=1:1:1.2) was used as a target; an oxygen gas and an argon gas were used; the proportion of the oxygen gas flow rate to the total gas flow rate of oxygen and argon was 50%; the pressure was 0.6 Pa; the substrate temperature was 170° C.; and an alternating-current power of 2.5 kW was applied.

Transistor T includes two stacked metal oxide layers. As the lower layer, a 10-nm-thick metal oxide film was formed under the following conditions: an In—Ga—Zn oxide (In:Ga:Zn=4:2:4.1) was used as a target; an oxygen gas and an argon gas were used; the proportion of the oxygen gas flow rate to the total gas flow rate of oxygen and argon was 10%; the pressure was 0.6 Pa; the substrate temperature was room temperature; and an alternating-current power of 2.5 kW was applied. As the upper layer, a 15-nm-thick metal oxide film was formed under the following conditions: an In—Ga—Zn oxide (In:Ga:Zn=1:1:1.2) was used as a target; an oxygen gas and an argon gas were used; the proportion of the oxygen gas flow rate to the total gas flow rate of oxygen and argon was 50%; the pressure was 0.6 Pa; the substrate temperature was 170° C.; and an alternating-current power of 2.5 kW was applied.

Then, heat treatment was performed at 450° C. for one hour in a nitrogen atmosphere, and successively, heat treatment was performed at 450° C. for one hour in a mixed gas atmosphere of nitrogen and oxygen.

Next, a conductor was formed. A tungsten film was formed to a thickness of 50 nm by a sputtering method, an aluminum film was formed to a thickness of 400 nm thereover, and a titanium film was formed to a thickness of 100 nm thereover. After that, processing was performed by etching. Then, washing was performed using a dilute solution of phosphoric acid.

Next, an insulator was formed. As an insulator, a silicon oxynitride film was formed to a thickness of 440 nm. After that, heat treatment was performed at 350° C. for one hour in a nitrogen atmosphere.

Next, an opening portion was formed in a desired region of the insulator.

Then, an indium tin oxide film containing silicon oxide (ITSO) was formed to a thickness of 5 nm. After that, plasma treatment using an oxygen gas was performed. The plasma treatment was performed for 60 seconds under the following conditions: the flow rate of the oxygen gas was 300 sccm; the pressure was 25 Pa; the bias was applied to the substrate side; and an RF power of 4750 W was used.

Then, the ITSO film was removed by wet etching.

Next, as an insulator, a 100-nm-thick silicon nitride film was formed.

Then, an opening portion was formed in a desired region of the insulator.

Next, as a conductor, a 100-nm-thick ITSO film was formed. After that, an insulator was formed using an acrylic resin. An opening portion was formed in the insulator. Then, as a conductor, a 10-nm-thick titanium film and a 300-nm-thick aluminum film over the titanium film were stacked.

Through the above process, Transistor A, Transistor N, Transistor S, and Transistor T were formed.

Example 2

In this example, circuits were formed using the transistors formed in Example 1, and charge characteristics of the transistors were evaluated.

First, $V_g$ (voltage between a gate and a source)-$I_d$ (voltage between a drain and a source) characteristics of each transistor were evaluated. In each evaluation, a transistor with a channel length of 2 μm and a channel width of 50 μm was used. $V_d$ (voltage between a drain and a source) was set to 0.1 V and 10 V. FIGS. 26A and 26B and FIGS. 27A and 27B show the results. FIG. 26A, FIG. 26B, FIG. 27A, and FIG. 27B show the $V_g$-$I_d$ characteristics of Transistor A, Transistor N, Transistor S, and Transistor T, respectively.

Figure 28:
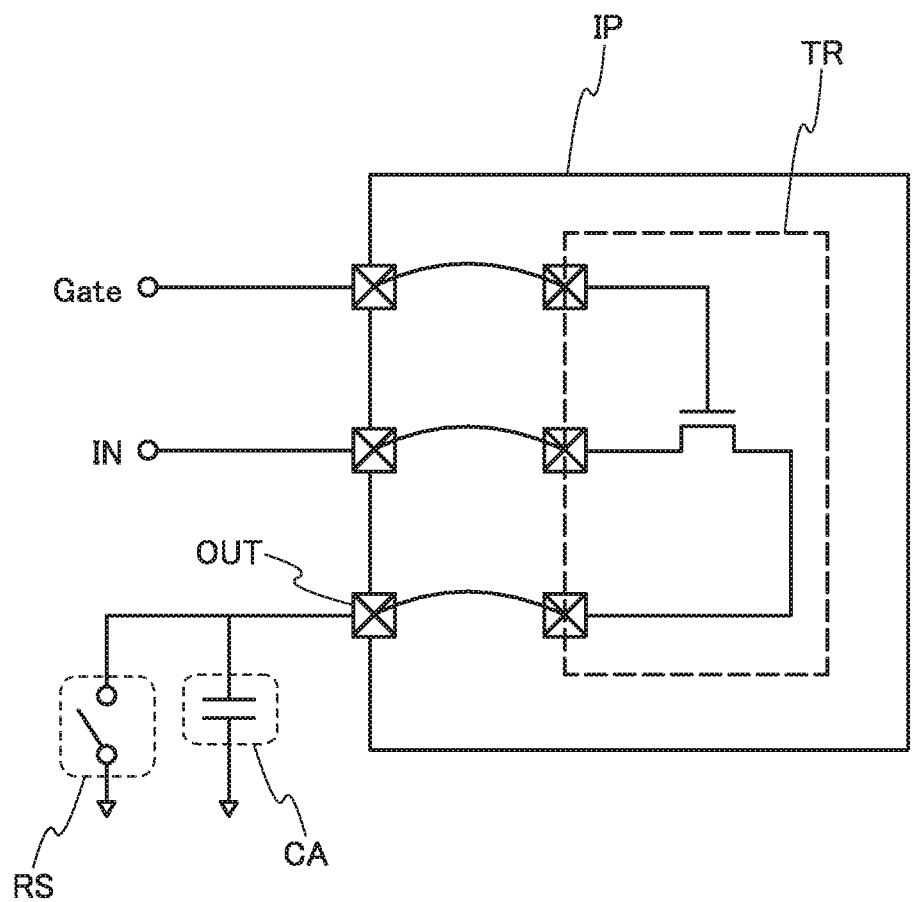
FIG. 28 illustrates a circuit used for evaluation.
Figure 29A:
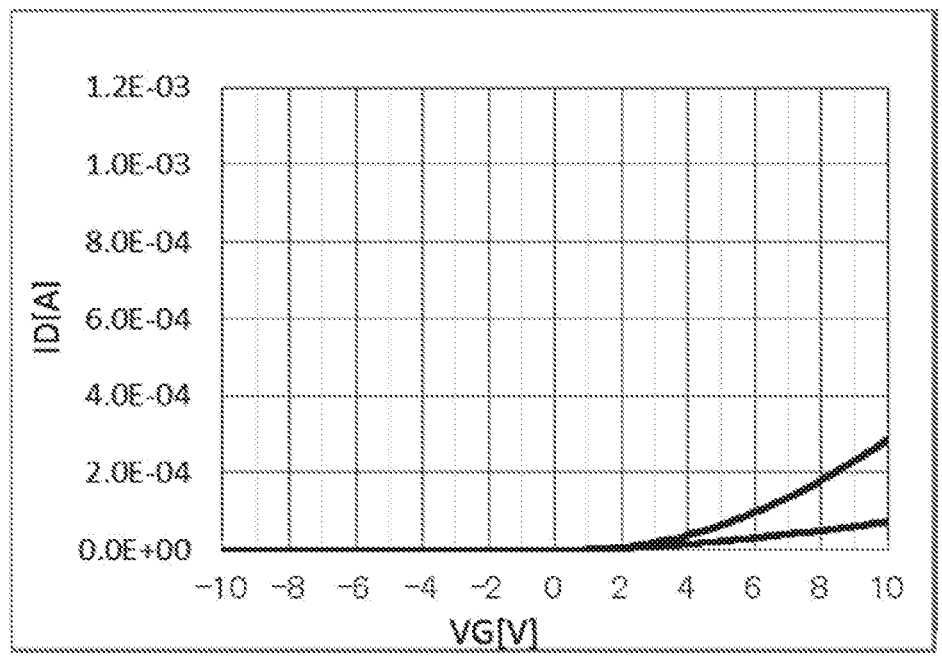
FIGS. 29A and 29B each show $V_g$-$I_d$ characteristics of a transistor.
Figure 29B:
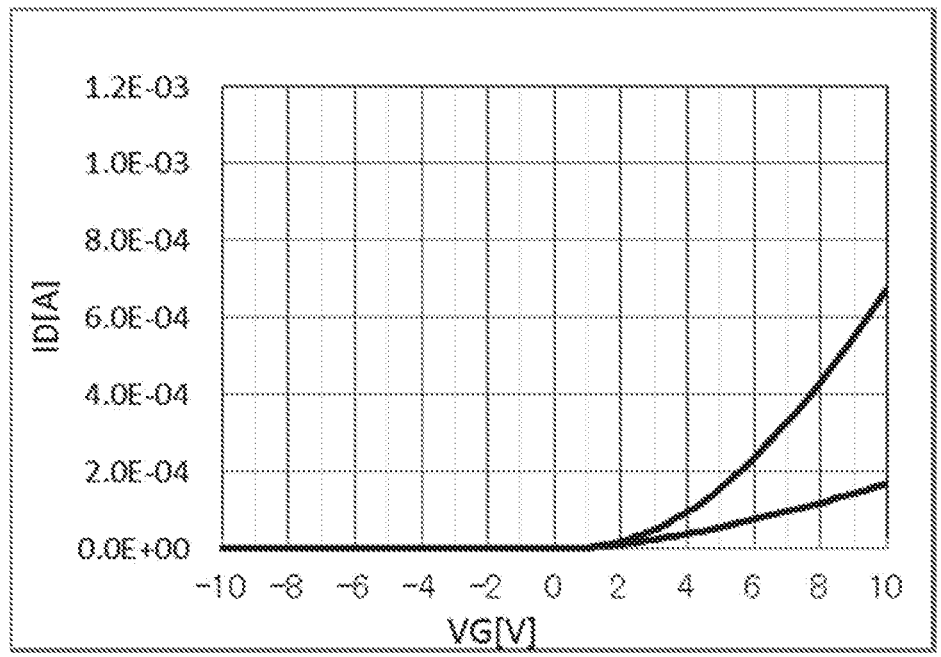
Figure 30A:
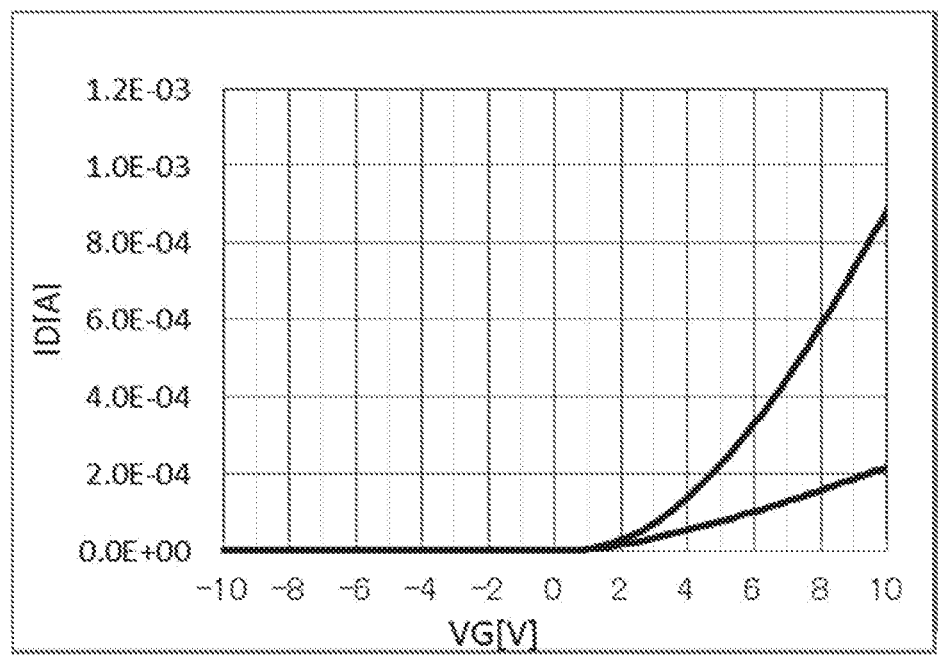
FIGS. 30A and 30B each show $V_g$-$I_d$ characteristics of a transistor.
Figure 30B:
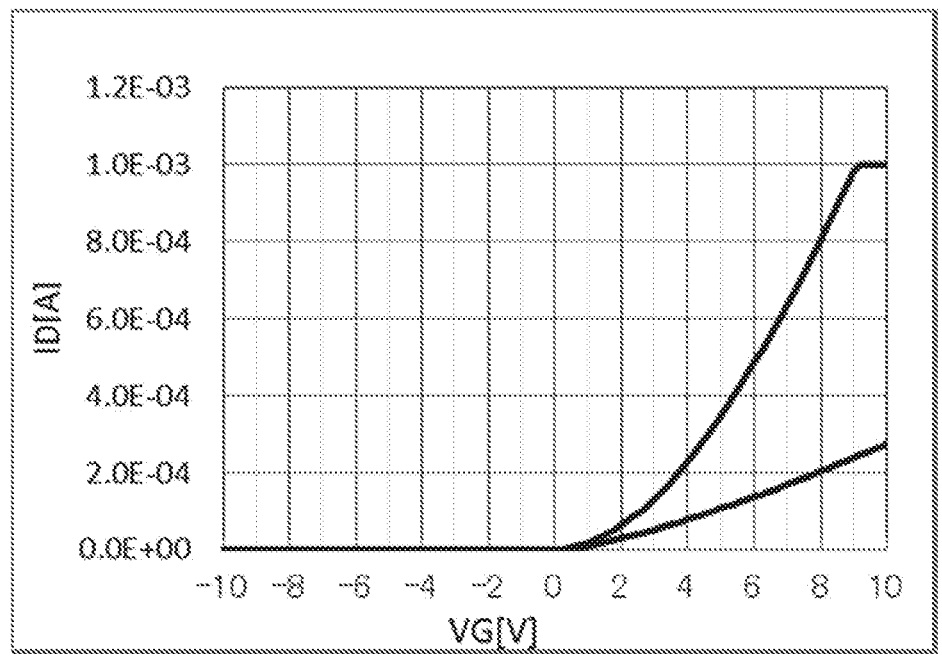

In a circuit in FIG. 28, a transistor TR is mounted on an IC package IP, a gate of the transistor is electrically connected to a Gate terminal by wire bonding, one of a source and a drain is electrically connected to an IN terminal by wire bonding. The Gate terminal and the IN terminal are each electrically connected to a voltage source. In addition, the other of the source and the drain of the transistor is connected to an OUT terminal by wire bonding. The OUT terminal is connected to an external capacitor CA.

When the capacitance of the capacitor is increased, the influence of the parasitic capacitance can be reduced. In this example, the capacitance of the capacitor was set to approximately 1 nF.

The $V_g$-$I_d$ characteristics of the transistors were evaluated using the circuit in FIG. 28. In each evaluation, a transistor whose channel length is 2 μm and channel width is 200 μm was used. $V_d$ was set to 1 V and 5 V. FIGS. 29A and 29B and FIGS. 30A and 30B show the results. FIG. 29A, FIG. 29B, FIG. 30A, and FIG. 30B show the $V_g$-$I_d$ characteristics of Transistor A, Transistor N, Transistor S, and Transistor T, respectively. Note that a current higher than or equal to $10^{-3}$ [A] did not flow in FIG. 30B because a limiter of the measurement instrument is operative at such a current. According to the results, the descending order of the current values of transistors is as follows: Transistor T, Transistor S, Transistor N, and Transistor A.

<Charge and Discharge Characteristics>

Next, the charge characteristics of the transistors were evaluated using the circuit in FIG. 28. In each evaluation, a transistor whose channel length is 2 μm and channel width is 200 μm was used. Before the measurement, the reset switch RS was turned on, OUT voltage was a ground potential, and 0 V was applied to the Gate terminal. After that, the reset switch was turned off, a potential of 10 V was applied to the Gate terminal, a potential of 5 V was applied to the IN terminal, and the voltage of the OUT terminal was measured.

Figure 31:
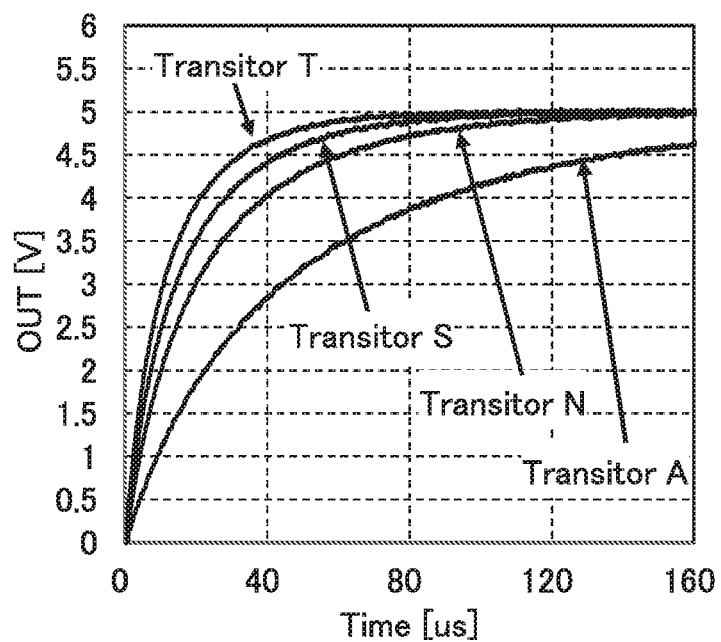
FIG. 31 shows time response of voltages.
Figure 32:
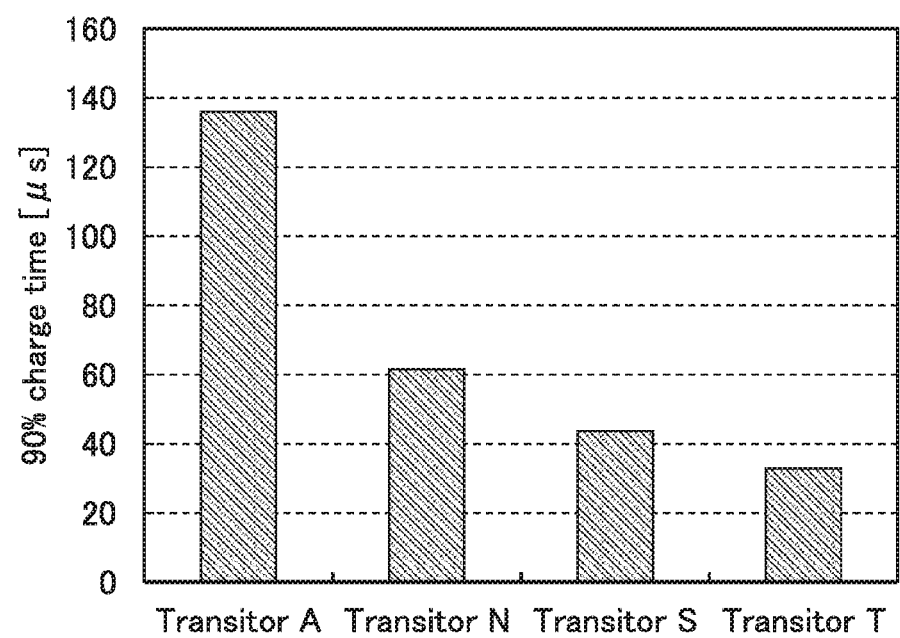
FIG. 32 shows charge times.

FIG. 31 shows charge characteristics of the transistors. The horizontal axis indicates time and the vertical axis indicates voltage of the OUT terminal. Furthermore, FIG. 32 shows time required for the voltage of the OUT terminal to reach 90% of the voltage applied to the IN terminal.

With the use of the transistors of one embodiment of the present invention, excellent charge characteristics can be achieved. Thus, the transistors are suitably used for a circuit such as a demultiplexer. Furthermore, the descending order of the charge speed of transistors is as follows: Transistor T, Transistor S, Transistor N, and Transistor A, which is the same as the descending order of the on-state current.

This application is based on Japanese Patent Application Serial No. 2016-160022 filed with Japan Patent Office on Aug. 17, 2016, and Japanese Patent Application Serial No. 2016-225760 filed with Japan Patent Office on Nov. 21, 2016, the entire contents of which are hereby incorporated by reference.

What is claimed is:

1. A display method of a display device comprising:
    a buffer amplifier comprising:
        a first transconductance amplifier;
        a second transconductance amplifier; and
        a buffer; and
    a plurality of pixels arranged in a matrix and configured to express gray levels,
    the method comprising:
        a first step of correcting an offset voltage of the buffer amplifier by the second transconductance amplifier; and
        a second step of inputting a first analog signal at voltages corresponding to the gray levels expressed by the plurality of pixels to one of a non-inverting input terminal and an inverting input terminal of the first transconductance amplifier and outputting a second analog signal at voltages corresponding to the voltages of the first analog signal from an output terminal of the buffer,
    wherein after the first step is completed, the first analog signal corresponding to the gray levels expressed by the plurality of pixels in two rows or more is input and the second analog signal corresponding to the first analog signal is output from the output terminal of the buffer through the second step, and
    wherein the first step and the second step are alternately repeated.

2. The display method according to claim 1,
    wherein the display device further comprises a first capacitor and a second capacitor,
    wherein one terminal of the first capacitor is electrically connected to one of a non-inverting input terminal and an inverting input terminal of the second transconductance amplifier,
    wherein one terminal of the second capacitor is electrically connected to the other of the non-inverting input terminal and the inverting input terminal of the second transconductance amplifier,
    wherein in the second step, a voltage of the one of the non-inverting input terminal and the inverting input terminal of the second transconductance amplifier corresponds to charge held in the first capacitor, and
    wherein in the second step, a voltage of the other of the non-inverting input terminal and the inverting input terminal of the second transconductance amplifier corresponds to charge held in the second capacitor.

3. A display method of a display device comprising:
    a buffer amplifier comprising:
        a first transconductance amplifier;
        a second transconductance amplifier; and
        a buffer;
    a plurality of pixels arranged in a matrix and configured to express gray levels;
    a first capacitor;
    a second capacitor; and
    a detector, wherein one terminal of the first capacitor is electrically connected to one of a non-inverting input terminal and an inverting input terminal of the second transconductance amplifier, wherein one terminal of the second capacitor is electrically connected to the other of the non-inverting input terminal and the inverting input terminal of the second transconductance amplifier, wherein the detector is electrically connected to the one terminal of the first capacitor, wherein the detector is electrically connected to the one terminal of the second capacitor, the method comprising:
- a first step of correcting an offset voltage of the buffer amplifier by the second transconductance amplifier; and
- a second step of inputting a first analog signal at voltages corresponding to the gray levels expressed by the plurality of pixels to one of a non-inverting input terminal and an inverting input terminal of the first transconductance amplifier and outputting a second analog signal at voltages corresponding to the voltages of the first analog signal from an output terminal of the buffer, wherein the second step is executed upon completion of the first step, wherein in the second step, a voltage of the one of the non-inverting input terminal and the inverting input terminal of the second transconductance amplifier corresponds to charge held in the first capacitor, wherein in the second step, a voltage of the other of the non-inverting input terminal and the inverting input terminal of the second transconductance amplifier corresponds to charge held in the second capacitor, wherein after the second analog signal corresponding to the gray levels expressed by the plurality of pixels in two rows or more is output from the output terminal of the buffer in the second step, an amount of charge held in the first capacitor and an amount of charge held in the second capacitor are detected by the detector, wherein the first step is executed when at least one of the amount of charge held in the first capacitor and the amount of charge held in the second capacitor falls below a specified value, and wherein the second step is continuously executed when the amount of charge held in the first capacitor and the amount of charge held in the second capacitor are greater than or equal to the specified value.

4. The display method according to claim 2, wherein the display device further comprises a first transistor and a second transistor, wherein one of a source and a drain of the first transistor is electrically connected to the one of the non-inverting input terminal and the inverting input terminal of the second transconductance amplifier, wherein one of a source and a drain of the second transistor is electrically connected to the other of the non-inverting input terminal and the inverting input terminal of the second transconductance amplifier, wherein in the first step, the first transistor and the second transistor are in a conduction state, and wherein in the second step, the first transistor and the second transistor are in a non-conduction state.

5. The display method according to claim 4, wherein a channel formation region of the first transistor and a channel formation region of the second transistor each comprise an oxide containing at least one of indium, an element M (the element M is aluminum, gallium, yttrium, or tin), and zinc.

6. The display method according to claim 1, wherein in the first step, a same voltage is input to the non-inverting input terminal of the first transconductance amplifier, the inverting input terminal of the first transconductance amplifier, and the one of the non-inverting input terminal and the inverting input terminal of the second transconductance amplifier.

7. The display method according to claim 1, wherein the display device further comprises a first circuit, a second circuit, and a third circuit, wherein the first circuit is configured to generate a first clock signal and a second clock signal, wherein the first circuit is configured to output a digital signal corresponding to the gray levels expressed by the plurality of pixels to the second circuit in accordance with the first clock signal, wherein the first circuit is configured to output the second clock signal to the third circuit, wherein the second circuit is configured to hold the digital signal, wherein in the first step, a voltage of the second clock signal is constant, wherein in the second step, the second analog signal is output in synchronization with the second clock signal, and wherein in the second step, the third circuit is configured to read the digital signal from the second circuit.

8. The display method according to claim 7, wherein the third circuit comprises the buffer amplifier, and wherein the third circuit is configured to convert the digital signal into the second analog signal.

9. The display method according to claim 1, wherein the plurality of pixels comprises a light-emitting element and a non-light-emitting element.

10. The display method according to claim 3, wherein the display device further comprises a first transistor and a second transistor, wherein one of a source and a drain of the first transistor is electrically connected to the one of the non-inverting input terminal and the inverting input terminal of the second transconductance amplifier, wherein one of a source and a drain of the second transistor is electrically connected to the other of the non-inverting input terminal and the inverting input terminal of the second transconductance amplifier, wherein in the first step, the first transistor and the second transistor are in a conduction state, and wherein in the second step, the first transistor and the second transistor are in a non-conduction state.

* * * * *